United States Patent
Ishida

(10) Patent No.: US 6,242,806 B1
(45) Date of Patent: *Jun. 5, 2001

(54) SEMICONDUCTOR DEVICE AND METHOD OF MANUFACTURING THEREOF

(75) Inventor: Masahiro Ishida, Hyogo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/151,756

(22) Filed: Sep. 11, 1998

(30) Foreign Application Priority Data

Mar. 13, 1998 (JP) ................................. 10-062721

(51) Int. Cl.[7] ............................ H01L 23/48; H01L 23/52; H01L 29/40

(52) U.S. Cl. ..................... 257/755; 257/758; 257/756; 257/757

(58) Field of Search ................................. 257/755–759, 257/760, 761, 762, 763; 438/618, 622, 625, 627, 628, 630

(56) References Cited

U.S. PATENT DOCUMENTS

| | | | |
|---|---|---|---|
| 4,392,150 | * 7/1983 | Courreges | 257/757 |
| 4,833,519 | * 5/1989 | Kawano et al. | 257/755 |
| 5,223,456 | * 6/1993 | Malwah | 437/200 |
| 5,330,930 | 7/1994 | Chi | 437/60 |
| 5,355,010 | 10/1994 | Fujii et al. | 257/377 |
| 5,414,302 | 5/1995 | Shin et al. | 257/752 |
| 5,622,884 | 4/1997 | Liu | 438/238 |
| 5,821,590 | * 10/1998 | Lee et al. | 257/755 |
| 5,837,602 | 11/1998 | Lee et al. | 438/621 |
| 5,990,513 | * 11/1999 | Perino et al. | 257/315 |

FOREIGN PATENT DOCUMENTS

| | | |
|---|---|---|
| 2-150062 | 6/1990 | (JP) . |
| 5-198774 | 8/1993 | (JP) . |
| 6-45562 | 2/1994 | (JP) . |
| 7-058058 | 3/1995 | (JP) . |
| 7-176633 | 7/1995 | (JP) . |

* cited by examiner

Primary Examiner—Tom Thomas
Assistant Examiner—Douglas W. Owens
(74) Attorney, Agent, or Firm—McDermott, Will & Emery

(57) ABSTRACT

An interlayer insulating film having contact holes is formed on a major surface of a semiconductor substrate. A metal silicide film is formed on the interlayer insulating film. A polycrystal silicon film extending from the inside of contact holes onto the metal silicide film is formed. A local interconnection line is constituted of the polycrystal silicon film and the metal silicide film.

6 Claims, 71 Drawing Sheets

SEMICONDUCTOR DEVICE AND METHOD OF MANUFACTURING THEREOF

BACKGROUND OF THE INVENTION

1. Field of the Invention

The present invention relates to a semiconductor device and a method of manufacturing a semiconductor device. The invention more particularly relates to a semiconductor device and a method of manufacturing the same having a local interconnection line which connects impurity regions of different conductivity types.

2. Description of the Background Art

A static random access memory (hereinafter simply referred to as "SRAM") is known as one example of a semiconductor device having impurity regions of different conductivity types connected by a local interconnection line. FIG. 69 shows an equivalent circuit diagram of a conventional SRAM of CMOS (Complementary Metal Oxide Semiconductor) type disclosed in Japanese Patent Laying-Open No.2-150062, for example.

As shown in FIG. 69, a memory cell of the SRAM includes two pMOS transistors T1 and T3 for loads, and four nMOS transistors T2, T4, T5 and T6.

The drain of one of a pair of driver nMOS transistors T2 and T4 is connected to the gate electrode of the other transistor, and the drains of PMOS transistors T1 and T3 for loads are respectively connected to the drains of transistors T2 and T4. The sources of driver nMOS transistors T2 and T4 are fixed at a prescribed potential (e.g. ground potential), and supply voltage Vcc is applied to the sources of pMOS transistors T1 and T3 for loads. As a result, current is supplied to a flip-flop circuit constituted of driver nMOS transistors T2 and T4 and pMOS transistors for loads T1 and T3.

Access nMOS transistors T5 and T6 are connected to storage nodes 17a and 17b of the flip-flop circuit described above. The gate electrodes of access nMOS transistors T5 and T6 are connected to a word line 6.

The configuration of the memory cell of the CMOS type SRAM is described in detail using FIG. 70. FIG. 70 is a plan view of a memory cell corresponding to one bit of the CMOS type SRAM.

As shown in FIG. 70, an isolation oxide film 2 is formed in an element isolation region at a major surface of a semiconductor substrate. $n^+$ impurity regions 11a1, 11a2, 11a3, 11b1, 11b2, and 11b3 are formed in an element formation region surrounded by isolation oxide film 2. $p^+$ impurity regions 10a1, 10a2, 10b1, and 10b2 are also formed in the element formation region. The $n^+$ impurity regions 11a1–11b3 form source/drain regions of driver nMOS transistors T2 and T4 and access nMOS transistors T5 and T6. $p^+$ impurity regions 10a1–10b2 form source/drain regions of load PMOS transistors T1 and T3.

A gate electrode 8 formed of polycrystal silicon, for example, functions as gate electrodes of load PMOS transistor T3 and driver nMOS transistor T4. Gate electrode 8 has an extended portion located in the vicinity of load pMOS transistor T1. A gate electrode 7 functions as gate electrodes of load pMOS transistor T1 and driver nMOS transistor T2, and has an extended portion located in the vicinity of driver nMOS transistor T4. A gate electrode 6 is used as gate electrodes of access nMOS transistors T5 and T6 and as a word line.

An insulating film (not shown) is formed to cover gate electrodes 6–8. Interconnection lines 39a and 39b formed of an aluminum film is formed on the insulating film. $p^+$ impurity region 10a2, the extended portion of gate electrode 7 and $n^+$ impurity region 11a2 are connected to each other by interconnection line 39a via contact holes 17a, 16a and 15a formed at the insulating film. $p^+$ impurity region 10b2, the extended portion of gate electrode 8 and $n^+$ impurity region 11b2 are connected to each other by interconnection line 39b via contact holes 15b, 16b and 17b formed at the insulating film.

A cross sectional structure along the X1–X2 line of FIG. 70 is described using FIG. 71.

Referring to FIG. 71, a p well 3 and an n well 4 are formed at the major surface of semiconductor substrate 1. $n^+$ impurity regions 11a2 and 11a3 are formed in p well 3, and $p^+$ impurity region 10a2 is formed in n well 4.

Sidewall insulating films 9 are formed on sidewalls of gate electrodes 6–8. An interlayer insulating film 12 is formed to cover gate electrodes 6–8. At interlayer insulating film 12, contact hole 15a reaching impurity region 11a2, contact hole 16a reaching gate electrode 7 and contact hole 17a reaching $p^+$ impurity region 10a2 are formed.

Local interconnection line 39a formed of an aluminum film is formed to extend from the inside of contact holes 15a–17a onto interlayer insulating film 12. An interlayer insulating film 20 is formed to cover interconnection line 39a. A contact hole 21 is formed to reach $n^+$ impurity region 11a3 through interlayer insulating film 20 and interlayer insulating film 12. An aluminum interconnection line 22 is formed to extend from the inside of contact hole 21 onto interlayer insulating film 20.

As described above, local interconnection line 39a connecting $p^+$ impurity region 10a2 and $n^+$ impurity region 11a2 is constituted of a metallic film such as an aluminum film in order to prevent a pn junction from being formed in an interconnection line when impurity regions of different conductivity types are connected.

However, a problem described below arises when a metallic film such as an aluminum film is used as local interconnection line 39a.

Local interconnection 39a is in contact with n impurity region 11a2 via a contact portion 40, in contact with gate electrode 7 via a contact portion 41, and in contact with $p^+$ impurity region 10a2 via a contact portion 42. Accordingly, impurities in $n^+$ impurity region 11a3, in $p^+$ impurity region 10a2, and in gate electrode 7 are sucked up by local interconnection line 39a. A problem in this case is, that contact resistance increases at contact portions 40–42.

Further, there is another problem of generation of leakage current caused by diffusion of a metallic component in local interconnection line 39a into semiconductor substrate 1 at contact portions 40 and 42.

Consequently, a problem of degradation of reliability of the SRAM is caused. The problems described above are not for the SRAM only, but for a semiconductor device having an interconnection line which connects an n type impurity region and a p type impurity region.

SUMMARY OF THE INVENTION

The present invention is made to solve the problems as described above. An object of the invention is, for a semiconductor device having an interconnection line which connects impurity regions of different conductivity types, to reduce contact resistance between the interconnection line and impurity regions, and to restrict generation of leakage current.

A semiconductor device according to one aspect of the present invention includes first and second impurity regions, an insulating layer and an interconnection layer. The first impurity region of a first conductivity type is formed at a surface of a semiconductor substrate. The second impurity region of a second conductivity type is formed at the surface spaced from the first impurity region. The insulating layer is formed on the surface of the semiconductor substrate and has first and second contact holes that reach the first and second impurity regions. The interconnection layer includes a nonmetallic conductive film electrically connecting the first and second impurity regions via the contact holes, covering inner bottom portions of the contact holes and side portions thereof, and in contact with respective first and second impurity regions, and includes a metallic conductive film connected to the nonmetallic conductive film without being in contact with a surface of the nonmetallic conductive film located at the inner bottom portions of the contact holes. The metallic conductive film includes silicide in addition to metal.

The metallic conductive film is preferably formed on the insulating layer, and has openings on the first and second contact holes. According to another aspect, first and second insulating layers may be formed on the nonmetallic conductive film located in the first and second contact holes, and the metallic conductive film may extend on the insulating layer and the first and second insulating layers.

A semiconductor device according to another aspect of the invention includes a first impurity region of a first conductivity type, a second impurity region of a second conductivity type, and an interconnection line. The first impurity region is formed at a major surface of a semiconductor substrate. The second impurity region is formed at the major surface spaced from the first impurity region. The interconnection line includes first, second and third conductive portions. The first and second conductive portions are constituted of a conductive film including no metal, and in contact with the first and second impurity regions respectively via first and second contact portions. The third conductive portion is formed of a conductive film including metal, and is electrically connected to the first and second impurity regions via the first and second conductive portions without being in contact with partial surfaces of the first and second conductive portions located immediately above the first and second contact portions. The first and second conductive portions may be a part of a solid nonmetallic conductive film, or may be divided into separate ones.

Increase of contact resistance caused by impurities sucked up from the first and second impurity regions as occurred in the conventional device can be restricted effectively since the first and second conductive portions formed of a conductive film containing no metal are in contact with the first and second impurity regions. Generation of leakage current caused by diffusion of metal into the semiconductor substrate can be restricted since the first and second conductive portions are constituted of a conductive film containing no metal. Further, since the partial surfaces of the first and second conductive portions located immediately above the first and second contact portions is not in contact with the third conductive portion, if impurities are introduced into the first and second conductive portions for improving conductivity, absorption of the impurities by the third conductive portion can be restricted effectively. It can contribute to reduction of the contact resistance between the first and second conductive portions and the first and second impurity regions.

The third conductive portion may have an opening above the partial surfaces of the first and second conductive portions.

Contact between the third conductive portion and the part of the surfaces mentioned above can be avoided by providing such an opening to the third conductive portion. Consequently, reduction of contact resistance is possible.

An interlayer insulating film having first and second contact holes that reach the first and second impurity regions may be formed on the major surface. In this case, the first and second conductive portions may be formed in the first and second contact holes, and may have first and second extended portions respectively extend on sidewalls of the first and second contact holes. The third conductive portion is formed on the interlayer insulating film, has openings on the first and second contact holes, and is connected to the first and second extended portions.

If the first and second conductive portions are formed in the first and second contact holes as described above, contact between the partial surfaces of the first and second conductive portions and the third conductive portion can be avoided by providing the openings on the first and second contact holes to the third conductive portion. The third conductive portion is connected to the first and second extended portions, so that the first and second conductive portions and the third conductive portion are connected at a location away from the first and second contact portions. Accordingly, absorption of impurities from the first and second conductive portions located in the vicinity of the first and second contact portions by the third conductive portion can be restricted. It also contributes to reduction of contact resistance between the first and second impurity regions and the interconnection line.

Impurities may be introduced into the first and second conductive portions in order to improve conductivity of the first and second conductive portions. The third conductive portion may extend on the partial surfaces of the first and second conductive portions via an impurity diffusion prevention film for preventing impurities from being absorbed by the third conductive portion. The impurities may be introduced from below by diffusion from the first and second impurity regions, or may be introduced from above by a method such as the ion implantation.

Since the impurity diffusion prevention film is formed on the partial surfaces of the first and second impurity regions, impurities for improving conductivity of the first and second conductive portions located immediately above the first and second contact portions are never absorbed by the third conductive portion. As a result, contact resistance at the first and second contact portions can be reduced.

An interlayer insulating film having first and second contact holes that reach the first and second impurity regions may be formed on the major surface. In this case, the first and second conductive portions may be respectively formed in the first and second contact holes, and may have first and second extended portions that extend on sidewalls of the first and second contact holes. The impurity diffusion prevention film is formed in the respective first and second contact holes. The third conductive portion is connected to the first and second extended portions.

If the impurity diffusion prevention film is formed in the first and second contact holes as described above, impurities are effectively prevented from being absorbed by the third conductive portion from the first and second conductive portions located immediately above the first and second contact portions. Accordingly, contact resistance at the first and second contact portions can be reduced.

The semiconductor device may be provided with a memory cell including a pair of driver MOS transistors, a pair of access MOS transistors, and a pair of load MOS transistors. In this case, the driver MOS transistors or the access MOS transistors include the first impurity region, and the load MOS transistors include the second impurity region.

An SRAM can be referred to as a semiconductor device having an interconnection line that connects impurity regions of different conductivity types. Applying the present invention to such an SRAM, the SRAM of high performance and high reliability is implemented.

The first and second conductive portions may include a polycrystal silicon film having impurities introduced for improving conductivity. The third conductive portion may include a metal silicide film.

A polycrystal silicon film having impurities introduced can be referred to as one example of a conductive film containing no metal. By using the polycrystal silicon film as the first and second conductive portions, the problem of the conventional device that metal is diffused into a semiconductor substrate to generate leakage current can be solved. Further, the third conductive portion is not in contact with the partial surfaces of the first and second conductive portions as described above. Therefore, even if the third conductive portion includes a metal silicide film, absorption of impurities from the first and second conductive portions located in the vicinity of the first and second contact portions by the metal silicide film can be restricted effectively. Consequently, reduction of contact resistance between the first and second impurity regions and the interconnection line is possible. If the first and second conductive portions are formed of a solid polycrystal silicon film, a pn junction may be formed in the polycrystal silicon film. However, the first and second conductive portions can be connected electrically by the third conductive portion since the third conductive portion includes a metal silicide film. Accordingly, increase of resistance value of an interconnection line can be effectively restricted even if a pn junction is formed in the polycrystal silicon film.

A method of manufacturing a semiconductor device according to the present invention includes the steps described below. A first impurity region of a first conductivity type and a second impurity region of a second conductivity type are formed with a space therebetween at a major surface of a semiconductor substrate. First and second conductive portions constituted of a conductive film containing no metal are formed on the major surface to be in contact with the first and second impurity regions respectively via first and second contact portions. A third conductive portion formed of a metallic conductive film is formed on the major surface to be electrically connected to the first and second impurity regions via the first and second conductive portions without being in contact with partial surfaces of the first and second conductive portions located immediately above the first and second contact portions.

Generation of leakage current caused by diffusion of a metal component into a semiconductor substrate can be restricted effectively by forming the first and second conductive portions formed of the conductive film containing no metal to be in contact with the first and second impurity regions. Further, sucking of impurities from the first and second impurity regions can relatively be reduced compared with the conventional semiconductor device since the first and second conductive portions are constituted of the conductive film containing no metal. Accordingly, reduction of contact resistance at the first and second contact portions is possible. Further, the third conductive portion is formed to be electrically connected to the first and second impurity regions via the first and second conductive portions without being in contact with the partial surfaces of the first and second conductive portions. Therefore, when the first and second conductive portions are doped with impurities for improving conductivity, restriction of absorption of those impurities from in the first and second conductive portions located in the vicinity of the first and second contact portions by the third conductive portion is possible. This may contribute to reduction of contact resistance.

The step of forming the third conductive portion described above may include a step of forming an interlayer insulating film on the major surface, a step of forming a conductive film containing metal on the interlayer insulating film and a step of forming first and second contact holes that reach the first and second impurity regions respectively through the conductive film containing metal and the interlayer insulating film. The step of forming the first and second conductive portions may include a step of forming the first and second conductive portions extending from the inside of the first and second contact holes onto the third conductive portion and being connected electrically to the third conductive portion.

By forming the first and second contact holes through the conductive film containing metal formed on the interlayer insulating film, the third conductive portion having through holes on the first and second contact holes can be formed on the interlayer insulating film. By forming the first and second conductive portions extending from the inside of the first and second contact holes onto the third conductive portion, the third conductive portion is connected to the first and second impurity regions via the first and second conductive portions while contact between the partial surfaces of the first and second conductive portions and the third conductive portion is avoided. As a result, an effect similar to that described above can be obtained.

The step of forming the first and second conductive portions may include a step of forming an interlayer insulating film on the major surface, a step of forming first and second contact holes that reach the first and second impurity regions at the interlayer insulating film, a step of forming the first and second conductive portions in the first and second contact holes, a step of introducing impurities of a first conductivity type and impurities of a second conductivity type respectively into the first and second conductive portions, and a step of forming an impurity diffusion prevention film on the partial surfaces for preventing the impurities from being sucked from the first and second conductive portions by the third conductive portion. The step of forming the third conductive portion may include a step of forming the third conductive portion on the interlayer insulating film such that the third conductive portion is electrically connected to the first and second conductive portions.

The impurity diffusion prevention film is formed on the partial surfaces of the first and second conductive portions as described above. Therefore, even if the third conductive portion is formed on the first and second conductive portions, impurities can be effectively prevented from being sucked from the first and second conductive portions located in the vicinity of the first and second contact portions by the third conductive portion. Accordingly, contact resistance at the first and second contact portions can be reduced.

In addition, the first and second conductive portions may include a polycrystal silicon film and extend on the interlayer insulating film. In this case, the step of forming the third conductive portion may include a step of forming a metal film to cover the first and second conductive portions and the impurity diffusion prevention film, and a step of forming the third conductive portion by silicidation of the surfaces of the first and second conductive portions not covered with the impurity diffusion prevention film through annealing of the metal film.

The partial surfaces of the first and second conductive portions not covered with the impurity diffusion prevention film can be silicided by forming the impurity diffusion prevention film on the partial surfaces of the first and second conductive portions. The third conductive portion that electrically connects the first and second conductive portions without being in contact with the partial surfaces of the first and second conductive portions can be formed by silicided portion. Consequently, contact resistance at the first and second contact portions can be decreased as described above.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are hereinafter described using FIGS. 1–68.

First Embodiment

Figure 1:
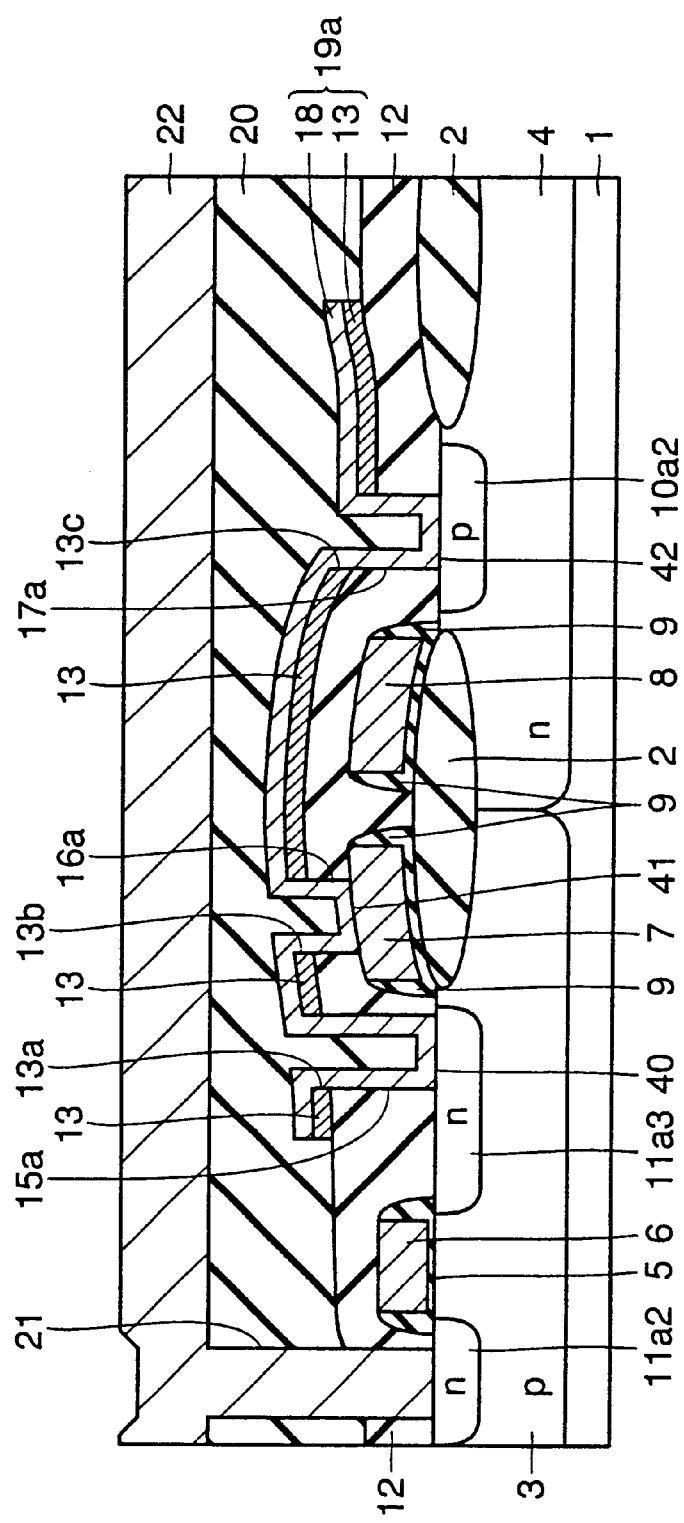
FIG. 1 is a cross section of an SRAM according to the first embodiment of the present invention.
Figure 71:
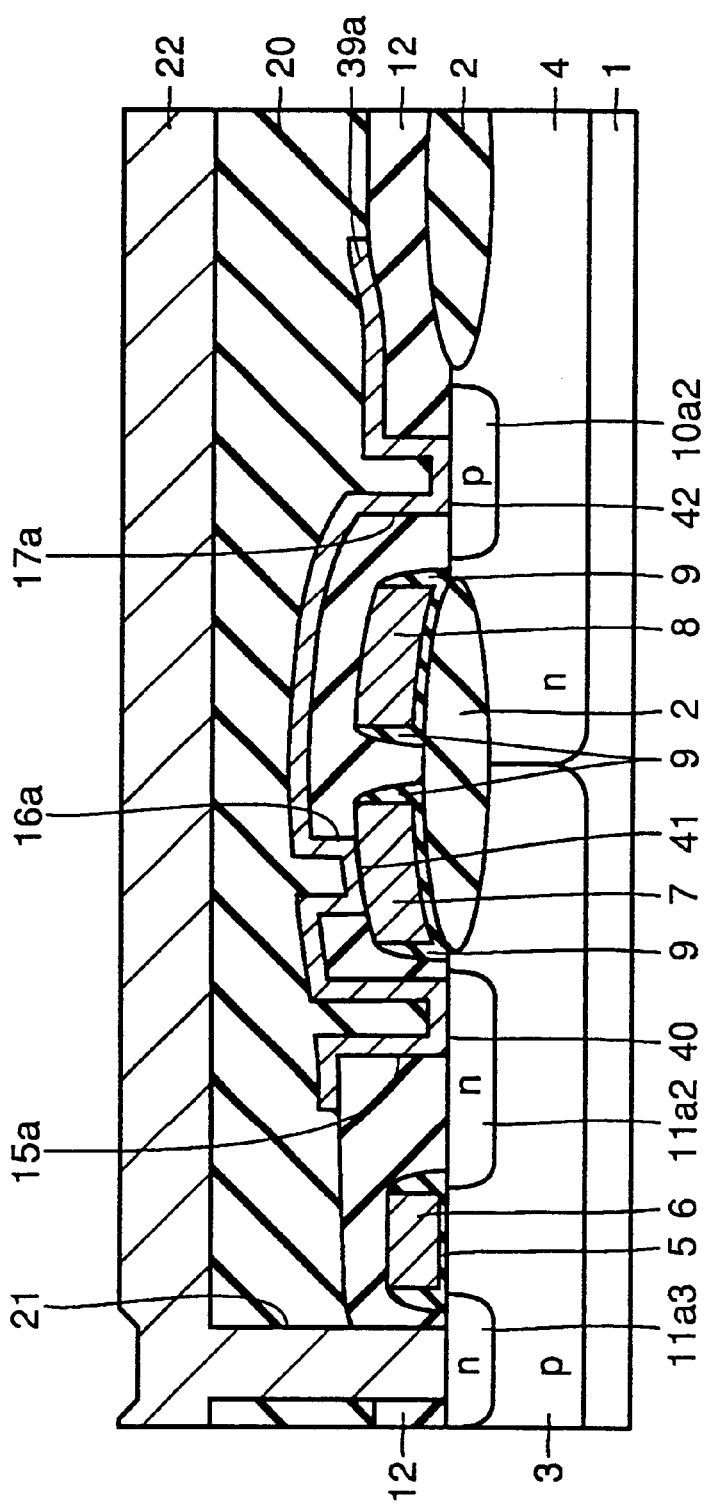
FIG. 71 is a cross sectional view along the line X1–X2 of FIG. 70.

The first embodiment of the invention is now described using FIGS. 1–6. FIG. 1 is a cross sectional view of a memory cell of an SRAM of the CMOS type according to the first embodiment of the invention, and shows a cross section corresponding to that shown in FIG. 71.

Referring to FIG. 1, a p well 3 and an n well 4 are formed at a major surface of a semiconductor substrate 1. $n^+$ impurity regions 11a2 and 11a3 are formed in p well 3. A $p^+$ impurity region 10a2 is formed in n well 4. A gate electrode 6 is formed on p well 3 with a gate oxide film 5 interposed. Gate electrodes 7 and 8 extend on an isolation oxide film 2. A sidewall insulating film 9 is formed on sidewalls of gate electrodes 6–8.

An interlayer insulating film 12 formed of a silicon oxide film or the like is formed to have a thickness of approximately 100–500 nm and cover gate electrodes 6–8. A metal silicide film (metallic conductive film) 13 such as tungsten silicide is formed on interlayer insulating film 12, and contact holes 15a, 16a and 17a are formed through metal silicide film 13 and interlayer insulating film 12. A polycrystal silicon film (nonmetallic conductive film) 18 is formed to extend from above metal silicide film 13 into contact holes 15a, 16a and 17a. Metal silicide film 13 may be formed on polycrystal silicon film 18. In this case, metal silicide film 13 has openings above contact holes 15a, 16a and 17a.

Polycrystal silicon film 18 is formed in a non-doped state, and impurities are diffused from $n^+$ impurity region 11a3, gate electrode 7 and $p^+$ impurity region 10a2 into polycrystal silicon film 18. As a result, polycrystal silicon film 18 has a p-type polycrystal silicon portion being in contact with $p^+$ impurity region 10a2, and an n-type polycrystal silicon portion being in contact with $n^+$ impurity region 11a3 or gate electrode 7. Although a pn junction may be formed in polycrystal silicon film 18, the p-type polycrystal silicon portion and the n-type polycrystal silicon portion can electrically be connected by metal silicide film 13 since metal silicide film 13 is formed under polycrystal silicon film 18.

The thickness of polycrystal silicon film 18 is, for example, approximately 50–200 nm, and a local interconnection line 19a is constituted of polycrystal silicon film 18 and metal silicide film 13.

As shown in FIG. 1, polycrystal silicon film 18 which is a conductive film containing no metal is in contact with $n^+$ impurity region 11a3, so that absorption of the n-type impurities in $n^+$ impurity region 11a3 by local interconnection line 19a can be relatively reduced compared with the conventional semiconductor device. Consequently, contact resistance between local interconnection line 19a and $n^+$ impurity region 11a3 can be reduced compared with the conventional device. A similar effect is achieved for contact portions 41 and 42.

Polycrystal silicon film 18 contains substantially no metal, so that diffusion of metal from contact portions 40–42 between local interconnection line 19a and $n^+$ impurity region 11a3 and the like into semiconductor substrate 1 can be prevented. As a result, generation of leakage current resulting from diffusion of metal into semiconductor substrate 1 can be effectively prevented.

Metal silicide film 13 includes through holes 13a, 13b and 13c on contact holes 15a, 16a and 17a respectively. Therefore, metal silicide film 13 is not formed on a partial surface of polycrystal silicon film 18, the partial surface is located immediately above contact portions 40–42. Accordingly, absorption of impurities in polycrystal silicon film 18 located in the vicinity of contact portions 40–42 by metal silicide film 13 can be effectively restricted. It can contribute effectively to reduction of contact resistance. It is noted that another conductive film containing metal may be employed instead of metal silicide film 13.

An interlayer insulating film 20 formed of a silicon oxide film or the like having a thickness of approximately 100–1000 nm is formed to cover local interconnection line 19a. A contact hole 21 is formed such that contact hole 21 reaches $n^+$ impurity region 11a2 through interlayer insulating films 20 and 12. An aluminum interconnection line 22 having a thickness of approximately 500–2000 nm is formed in contact hole 21 and on interlayer insulating film 20.

A method of manufacturing the SRAM shown in FIG. 1 is next described using FIGS. 2–6. FIGS. 2–6 are cross sections showing the first step to the fifth step of a manufacturing process of the SRAM shown in FIG. 1.

Figure 2:
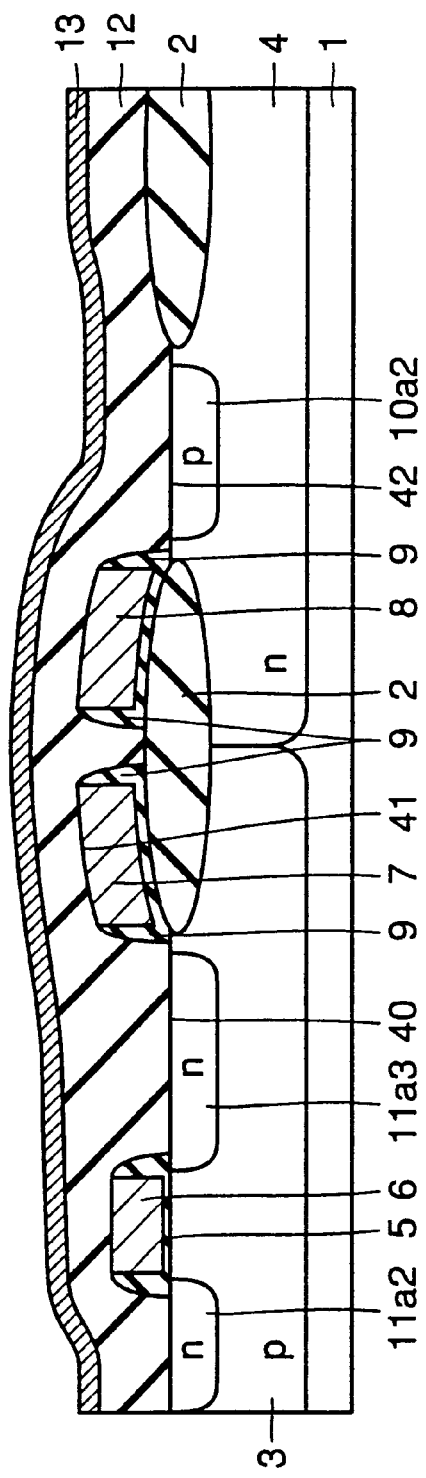
FIGS. 2–6 are cross sections respectively showing characteristic first to fifth steps of a manufacturing process of the SRAM shown in FIG. 1.

Referring to FIG. 2, interlayer insulating film 12 and preceding components are formed by a known method. Metal silicide film 13 is formed using the CVD (Chemical Vapor Deposition) method, the sputtering method or the like on interlayer insulating film 12.

Figure 3:
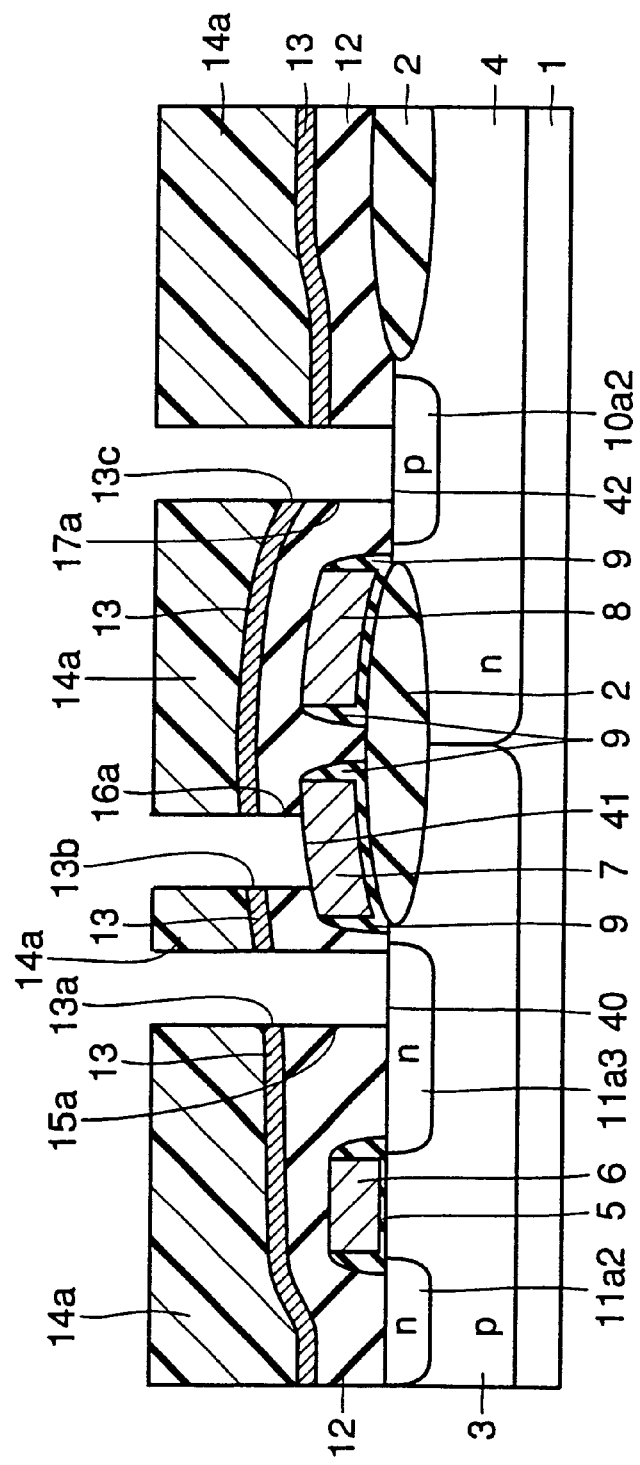

As shown in FIG. 3, a resist 14a is applied onto metal silicide film 13 and patterned into a prescribed shape. Metal silicide film 13 and interlayer insulating film 12 are etched using the patterned resist 14a as a mask. Contact holes 15a, 16a and 17a are thus formed.

Figure 4:
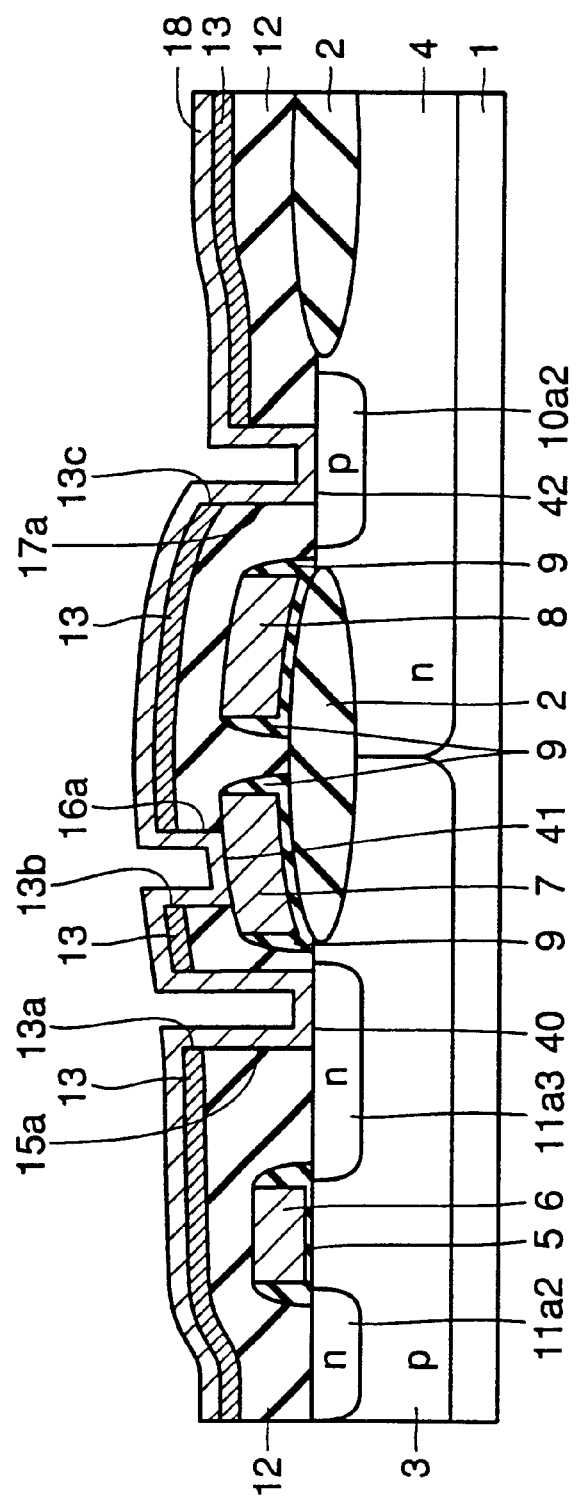

Referring to FIG. 4, polycrystal silicon film 18 not doped with impurities is deposited to have a thickness of 50–200 nm and extend from the inside of contact holes 15a–17a onto metal silicide film 13 for improvement of conductivity. In the case that metal silicide film 13 is formed on polycrystal silicon film 18, polycrystal silicon film 18 is deposited, metal silicide film 13 is formed thereon, and then selectively remove metal silicide film 13 positioned directly above contact holes 15a–17a.

Figure 5:
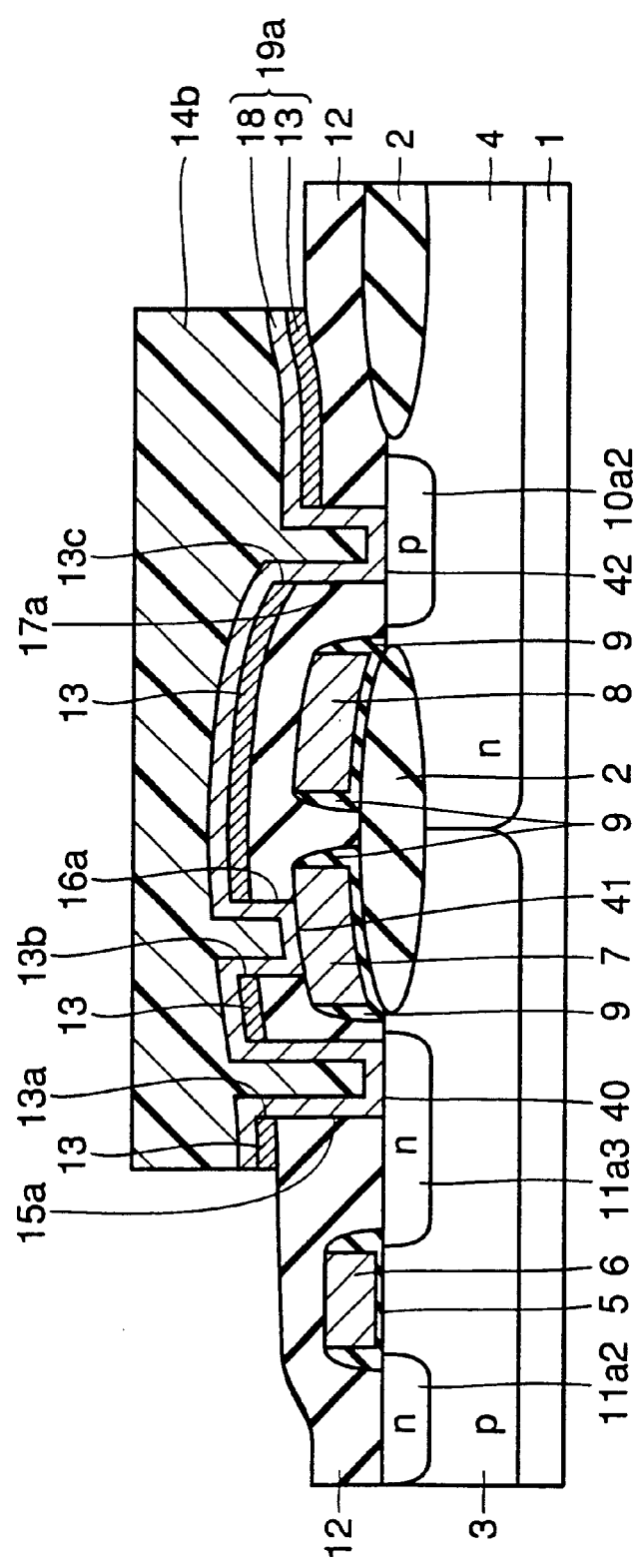

As shown in FIG. 5, a resist 14b patterned into a prescribed shape is formed on polycrystal silicon film 18. Polycrystal silicon film 18 and metal silicide film 13 are patterned using resist 14b as a mask. Local interconnection line 19a is thus completed.

Figure 6:
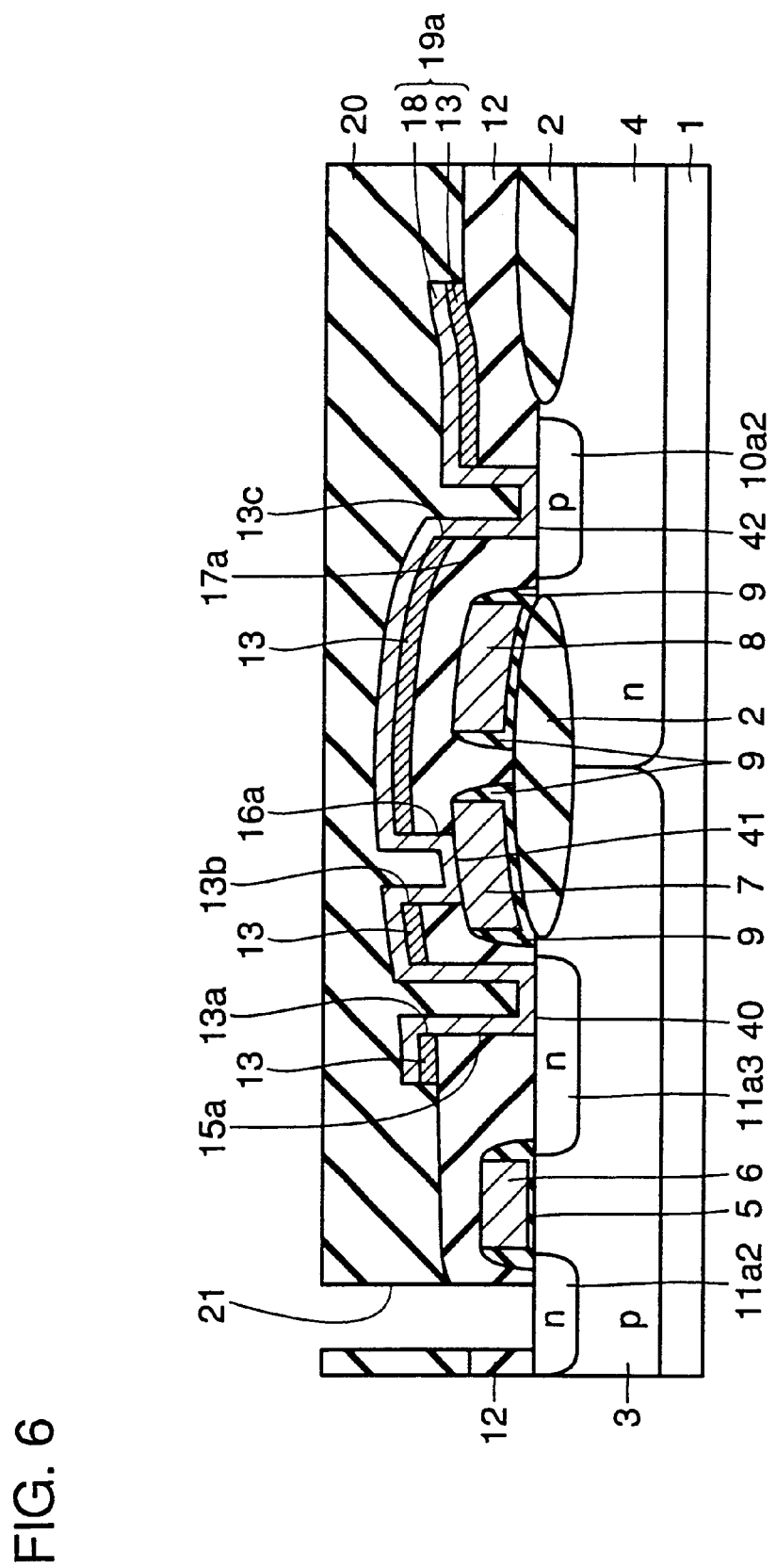

As shown in FIG. 6, resist 14b is removed and interlayer insulating film 20 formed of a silicon oxide film or the like is deposited to cover local interconnection line 19a using the CVD method or the like. Impurities in $p^+$ impurity region 10a2, $n^+$ impurity region 11a3 and gate electrode 7 are diffused into polycrystal silicon film 18 by an annealing process performed at this time or later. Contact hole 21 which reaches $n^+$ impurity region 11a2 through interlayer insulating films 20 and 12 is formed by the photolithography and etching.

An aluminum film having a thickness of approximately 500–2000 nm is deposited in contact hole 21 and on interlayer insulating film 20 by the sputtering method or the like. Metal interconnection line 22 formed of aluminum or the like is formed by patterning the aluminum film into a prescribed shape. The SRAM shown in FIG. 1 is thus completed through steps described above.

Second Embodiment

Figure 7:
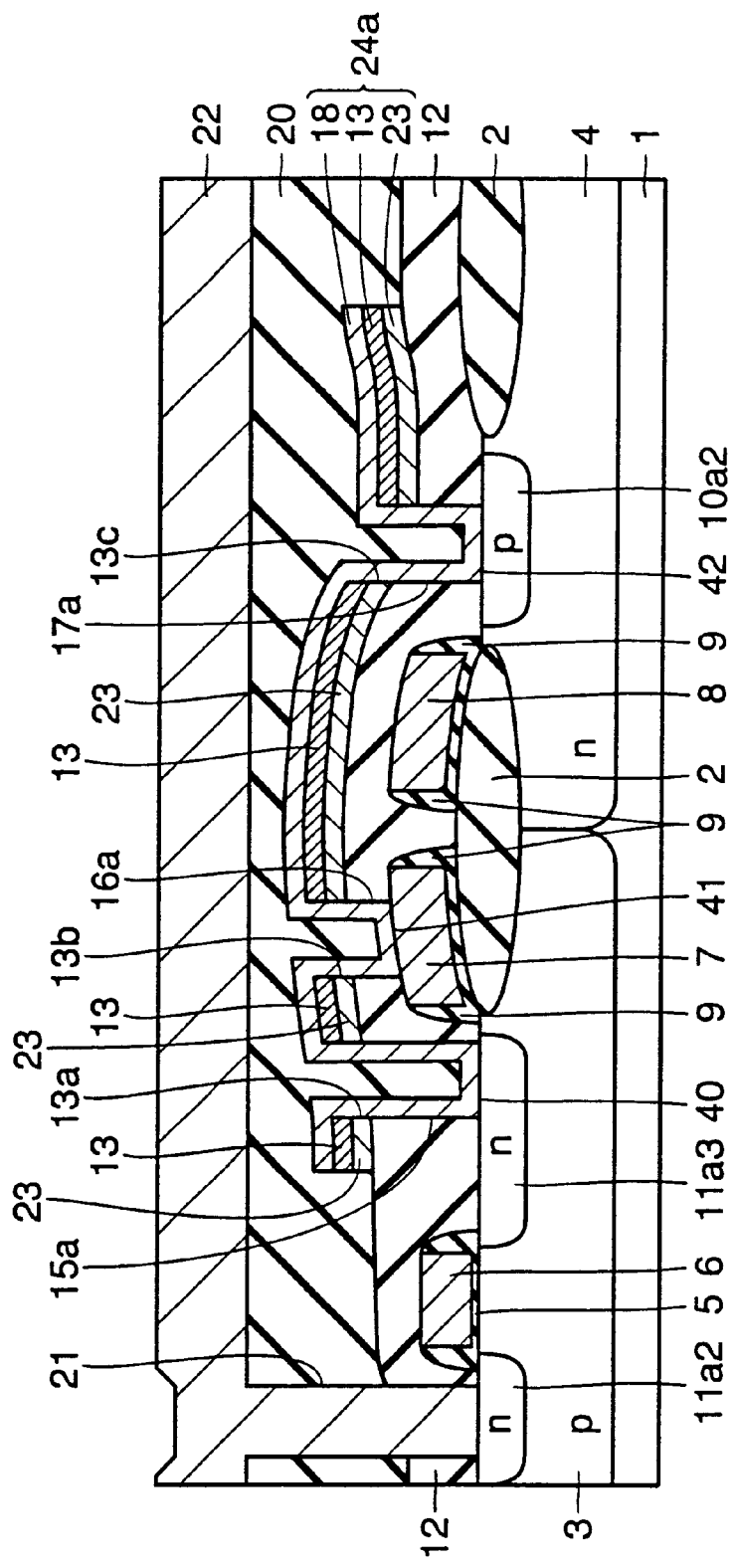
FIG. 7 is a cross section showing an SRAM according to the second embodiment of the invention.

The second embodiment of the invention is next described using FIGS. 7–12. FIG. 7 is a cross section showing an SRAM according to the second embodiment of the invention.

Referring to FIG. 7, polycrystal silicon films 18 and 23 are respectively formed on and under metal silicide film 13 according to the second embodiment. Other structures are similar to those according to the first embodiment.

Reduction of the thickness of metal silicide film 13 in the manufacturing process of the SRAM can be restricted by providing polycrystal silicon films 18 and 23 to a local interconnection line 24a. Accordingly, increase of a resistance value of local interconnection line 24a can be effectively restricted.

A method of manufacturing the SRAM shown in FIG. 7 is next described using FIGS. 8–12. FIGS. 8–12 are cross sections respectively showing characteristic first to fifth steps of a manufacturing process of the SRAM shown in FIG. 7.

Figure 8:
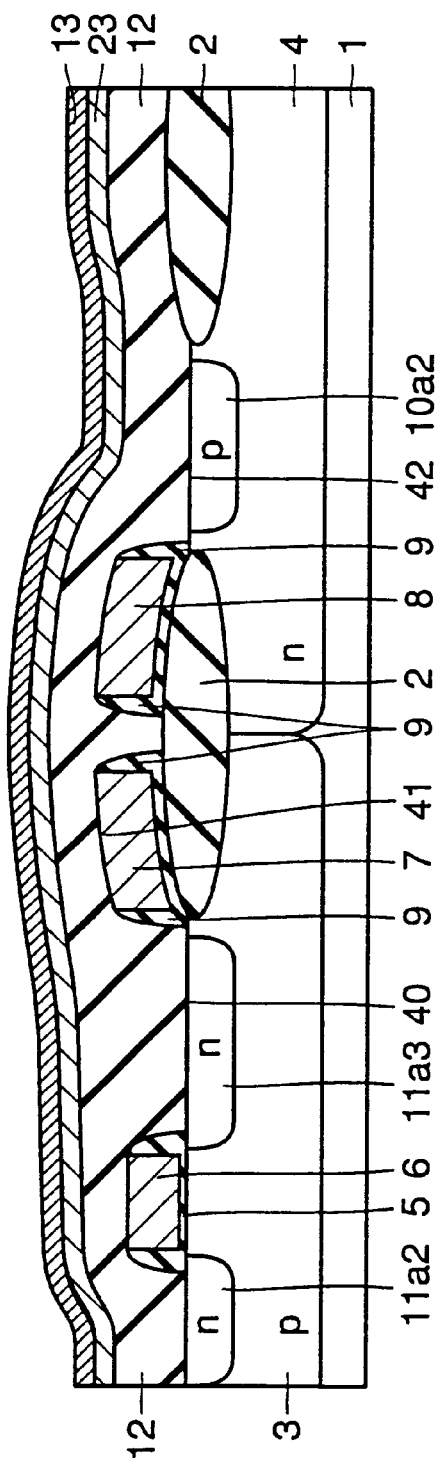
FIGS. 8–12 respectively show characteristic first to fifth steps of a manufacturing process of the SRAM shown in FIG. 7.

Referring to FIG. 8, interlayer insulating film 12 and preceding components are completed through steps similar to those of the first embodiment. Polycrystal silicon film 23 doped with no impurity and metal silicide film 13 are deposited on interlayer insulating film 12 using the CVD method or the like.

Figure 9:
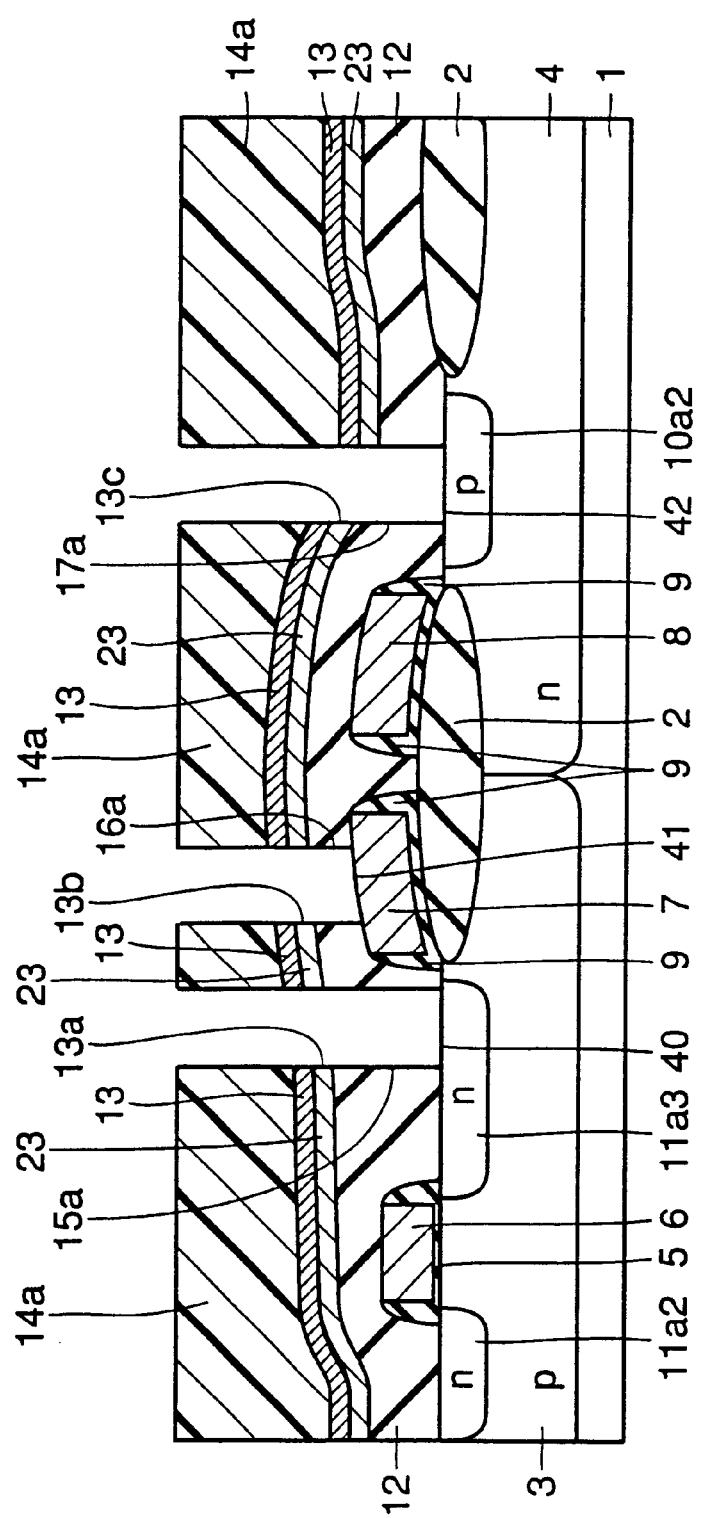

Referring to FIG. 9, resist 14a is applied onto metal silicide film 13 and resist 14a is patterned into a prescribed shape. Metal silicide film 13, polycrystal silicon film 23 and interlayer insulating film 12 are successively etched using patterned resist 14a as a mask. Contact holes 15a–17a are thus completed.

Figure 10:
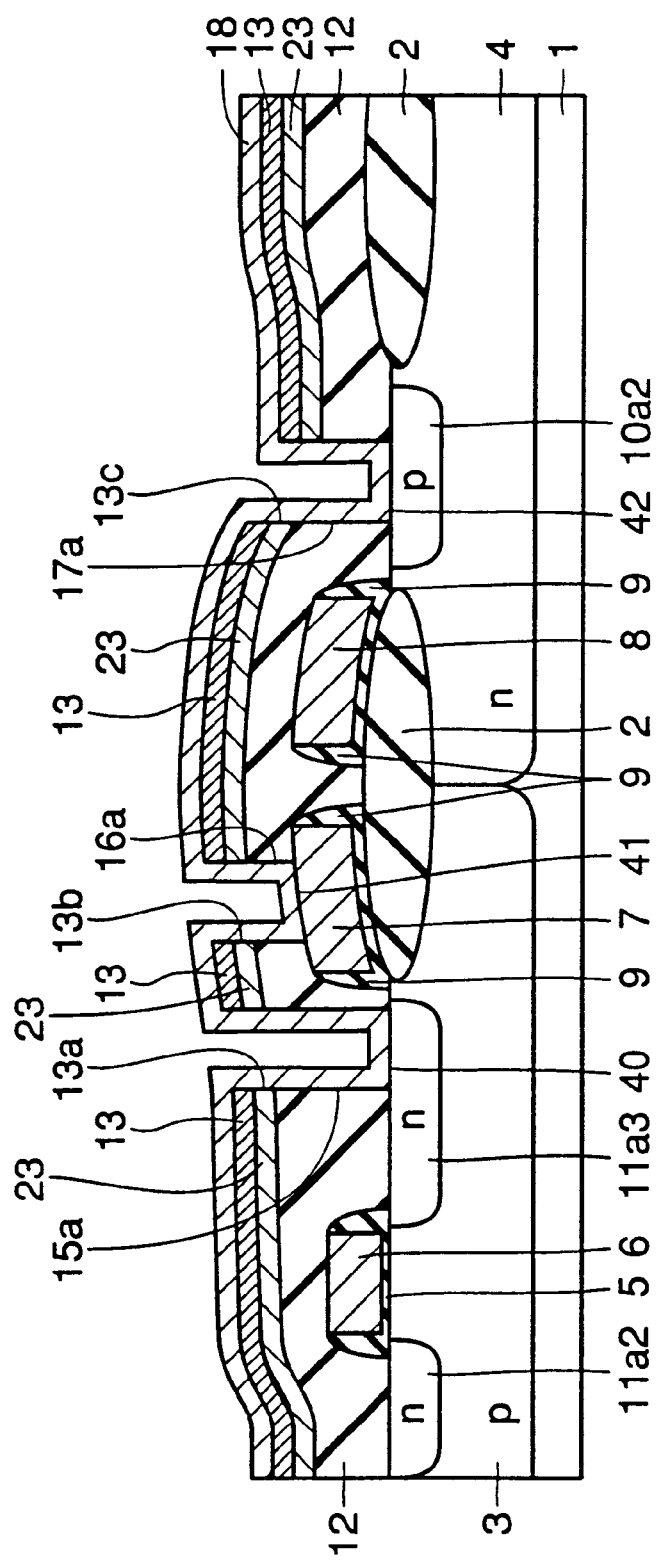
Figure 11:
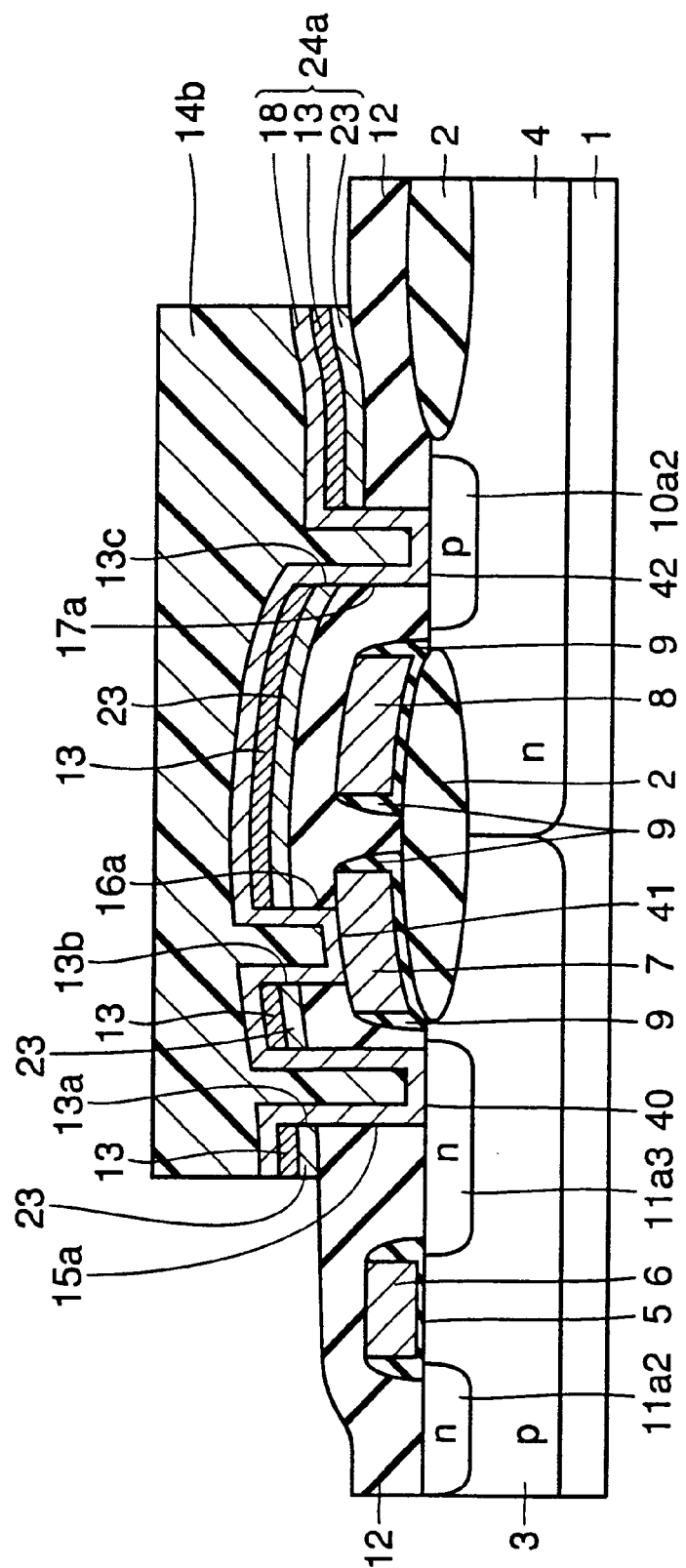

Referring to FIG. 10, polycrystal silicon film 18 is formed to extend from the inside of contact holes 15a–17a onto metal silicide film 13 using the CVD method or the like. As shown in FIG. 11, resist 14b is formed by a method similar to that of the first embodiment. Polycrystal silicon film 18, metal silicide film 13 and polycrystal silicon film 23 are patterned using resist 14b as a mask. Local interconnection line 24a is accordingly completed.

Figure 12:
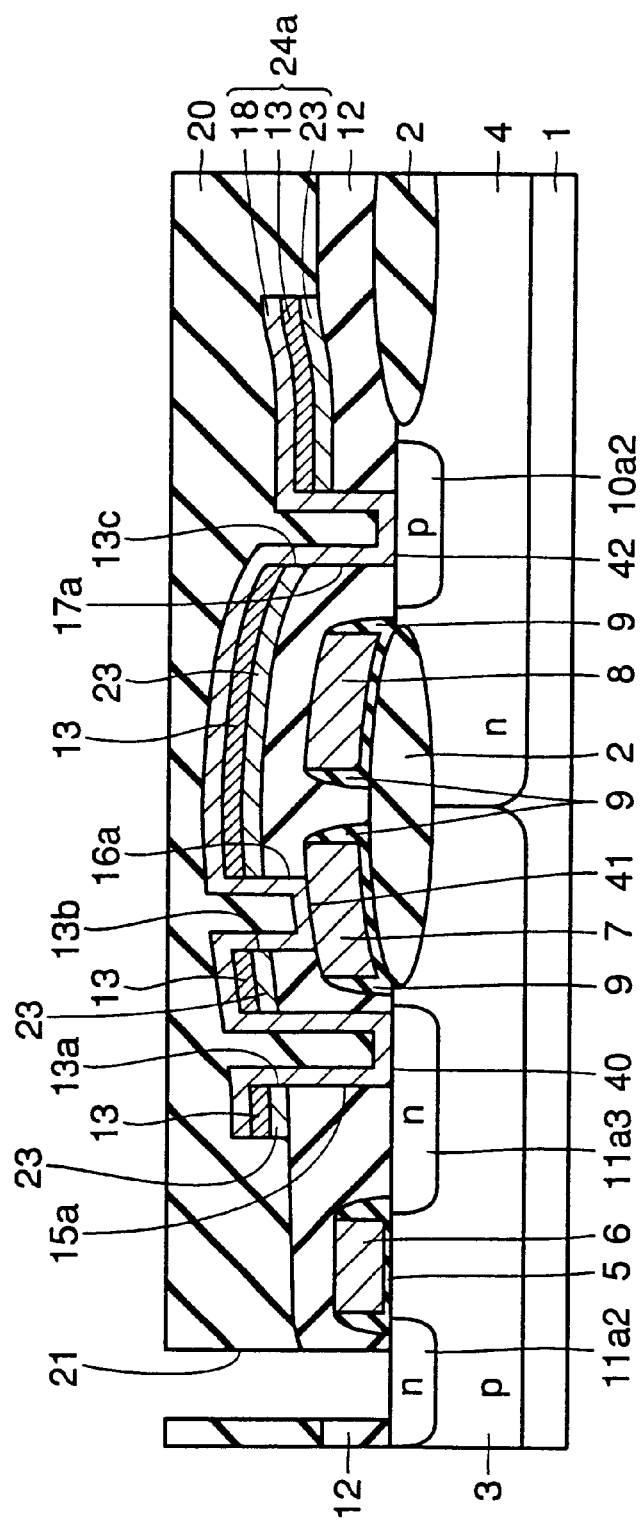

Referring to FIG. 12, interlayer insulating film 20 is formed to cover local interconnection line 24a using the CVD method or the like. Contact hole 21 is formed by selectively etching interlayer insulating films 20 and 12. The SRAM shown in FIG. 7 is thereafter completed through steps similar to those according to the first embodiment.

Third Embodiment

Figure 13:
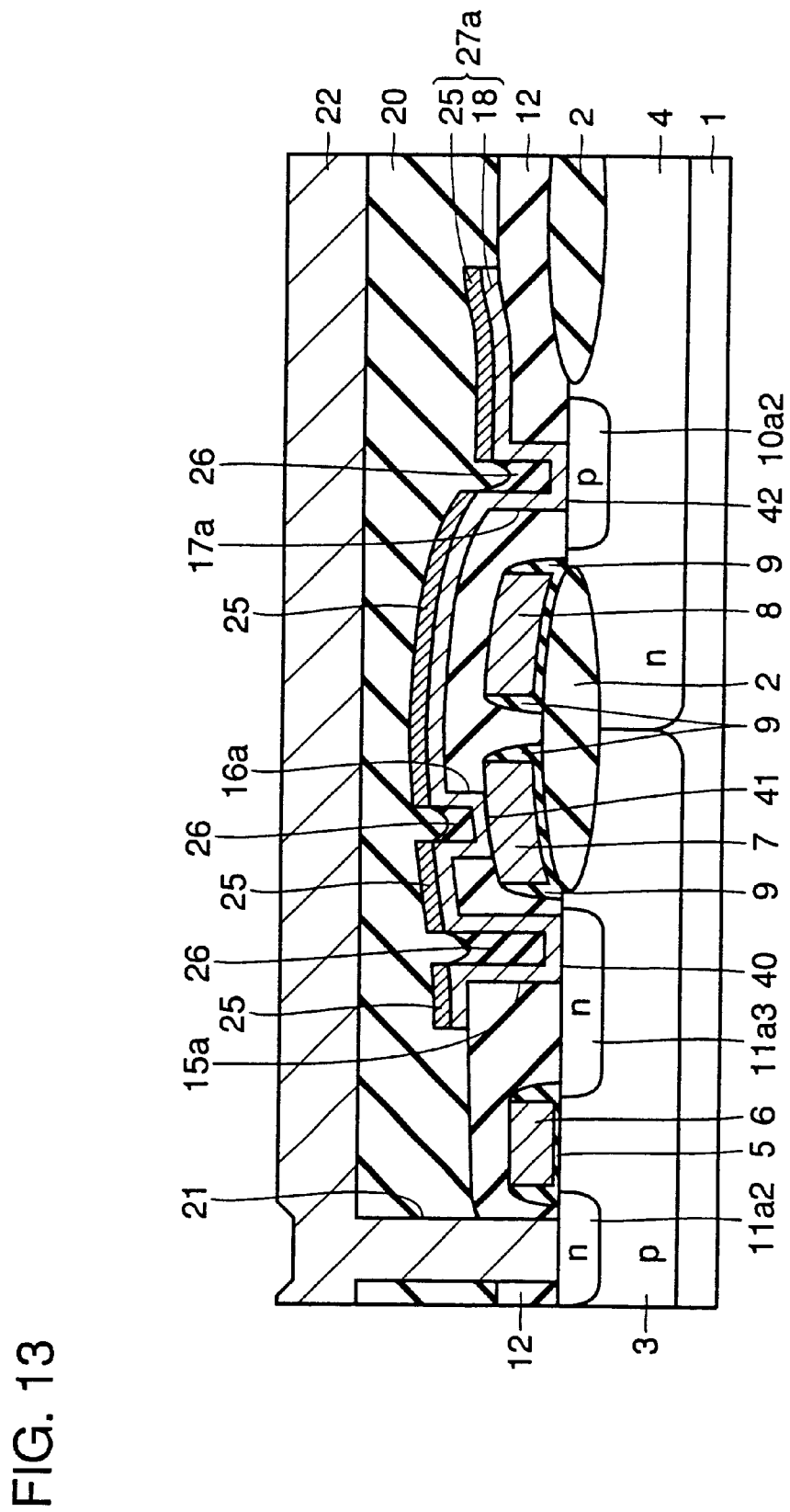
FIG. 13 is a cross section showing an SRAM according to the third embodiment of the invention.

The third embodiment of the invention is next described using FIGS. 13–19. FIG. 13 is a cross section showing an SRAM according to the third embodiment of the invention.

Referring to FIG. 13, an insulating film 26 formed of a silicon oxide film or the like is formed on the surface of polycrystal silicon film 18 located in contact holes 15a–17a. A metal silicide film 25 is formed on the surface of polycrystal silicon film 18 at a portion which is not covered with insulating film 26. Metal silicide film 25 is formed by silicidation of the surface of polycrystal silicon film 18. Other structures are similar to those according to the first embodiment.

As shown in FIG. 13, formation of metal silicide film 25 on the surface of polycrystal silicon film 18 located immediately above contact portions 40–42 can be avoided by burying insulating film 26 in contact holes 15a–17a. Consequently, contact resistance can be reduced as the case of each embodiment described above.

A method of manufacturing the SRAM according to this embodiment is described using FIGS. 14–19. FIGS. 14–19 are cross sections showing characteristic first to sixth steps of a manufacturing process of the SRAM according to the third embodiment.

Figure 14:
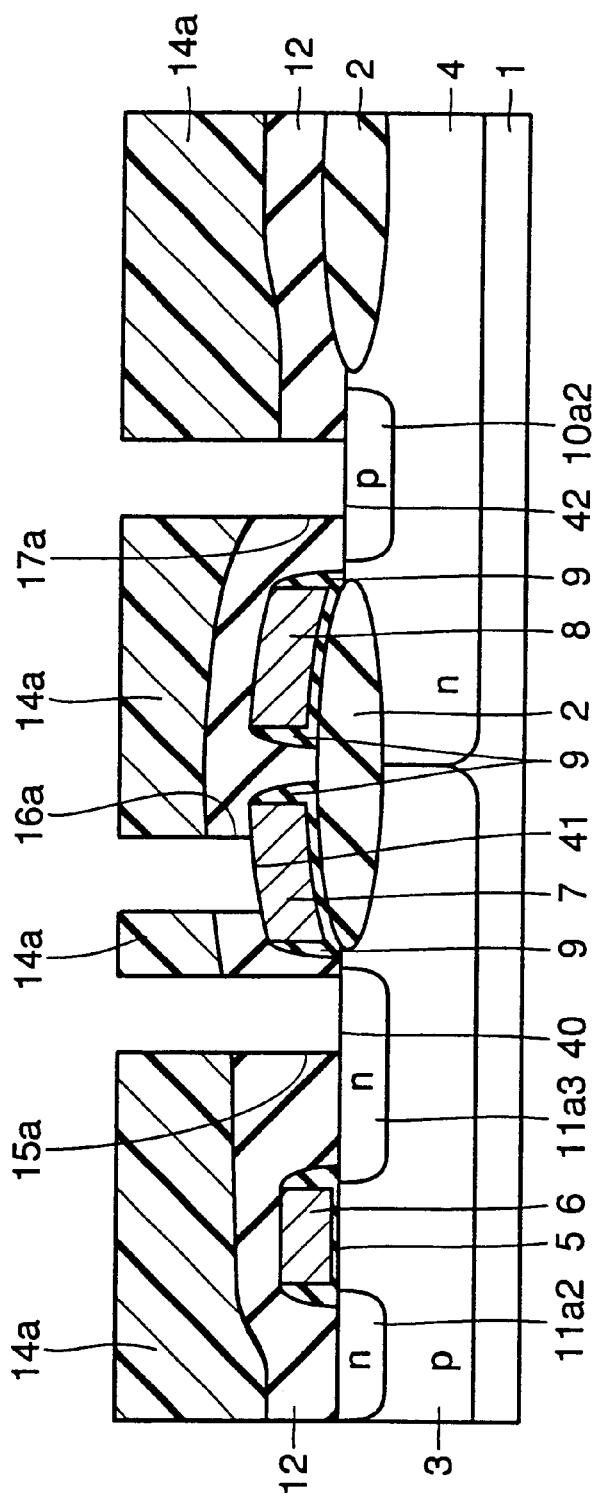
FIGS. 14–19 are cross sections respectively showing characteristic first to sixth steps of a manufacturing process of the SRAM shown in FIG. 13.

Referring to FIG. 14, interlayer insulating film 12 and preceding components are formed through steps similar to those according to the first embodiment, and resist 14a is applied onto interlayer insulating film 12. Resist 14a is patterned into a prescribed shape, and interlayer insulating film 12 is etched using the patterned resist 14a as a mask. Contact holes 15a–17a are thus formed.

Figure 15:
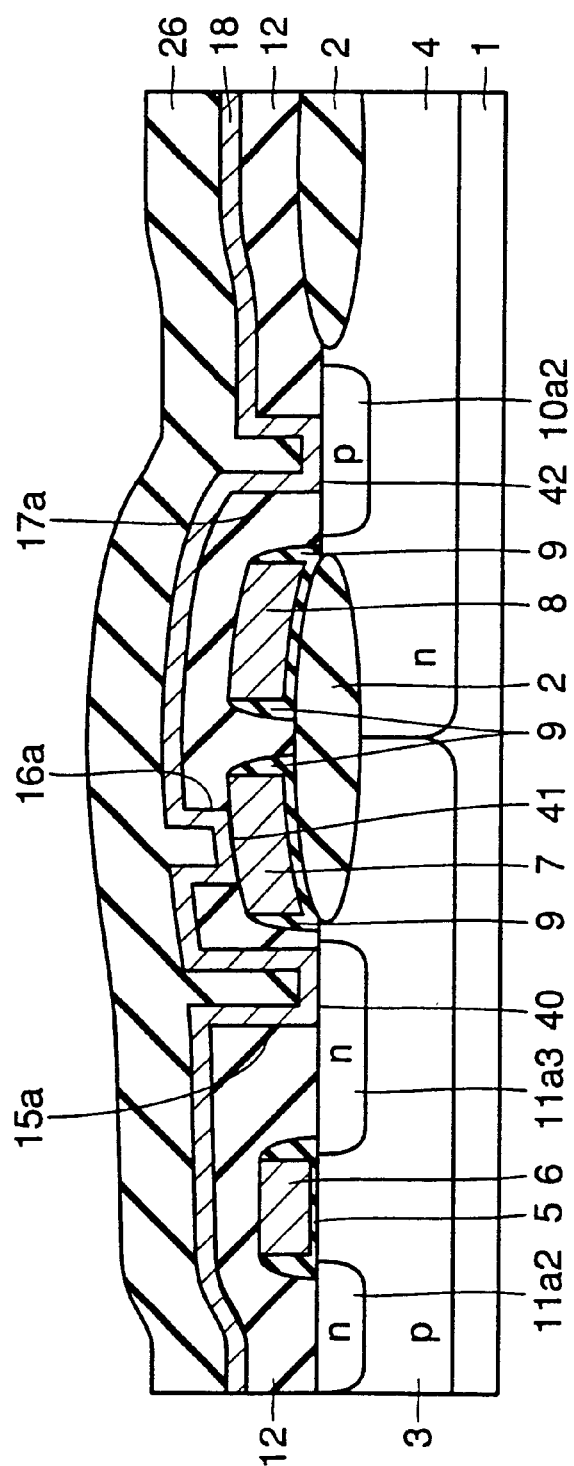

Referring to FIG. 15, polycrystal silicon film 18 is formed to extend from the inside of contact holes 15–17a onto interlayer insulating film 12 by the CVD method or the like. Insulating film 26 formed of a silicon oxide film or the like is deposited to have a thickness of approximately 100–500 nm on polycrystal silicon film 18 using the CVD method or the like.

Figure 16:
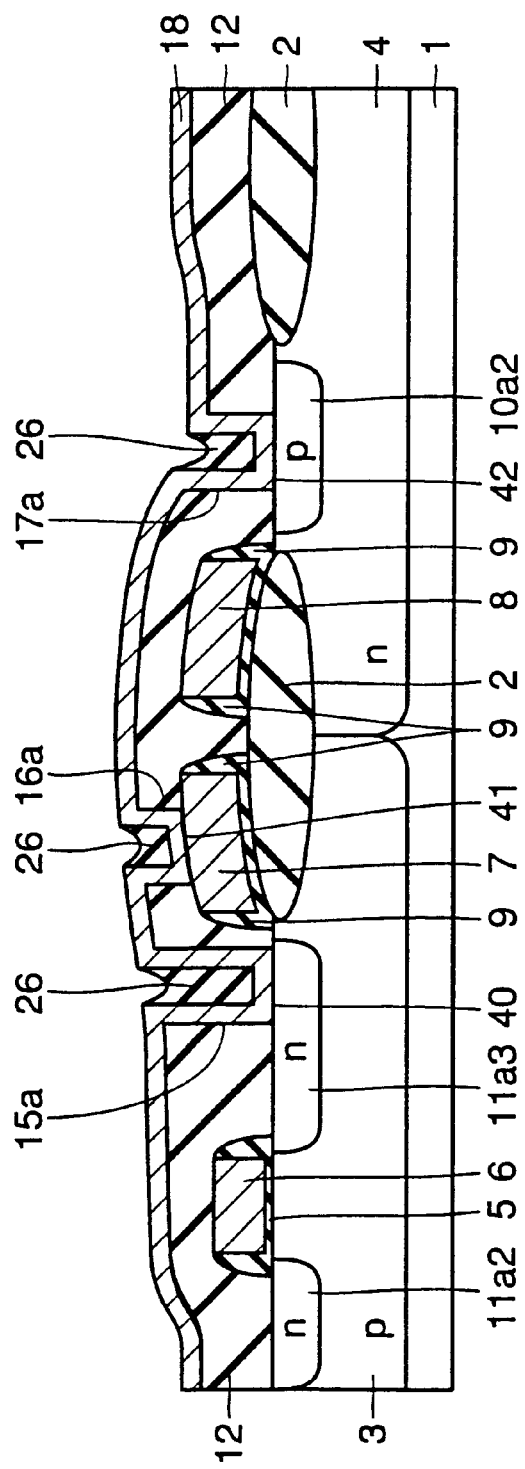
Figure 17:
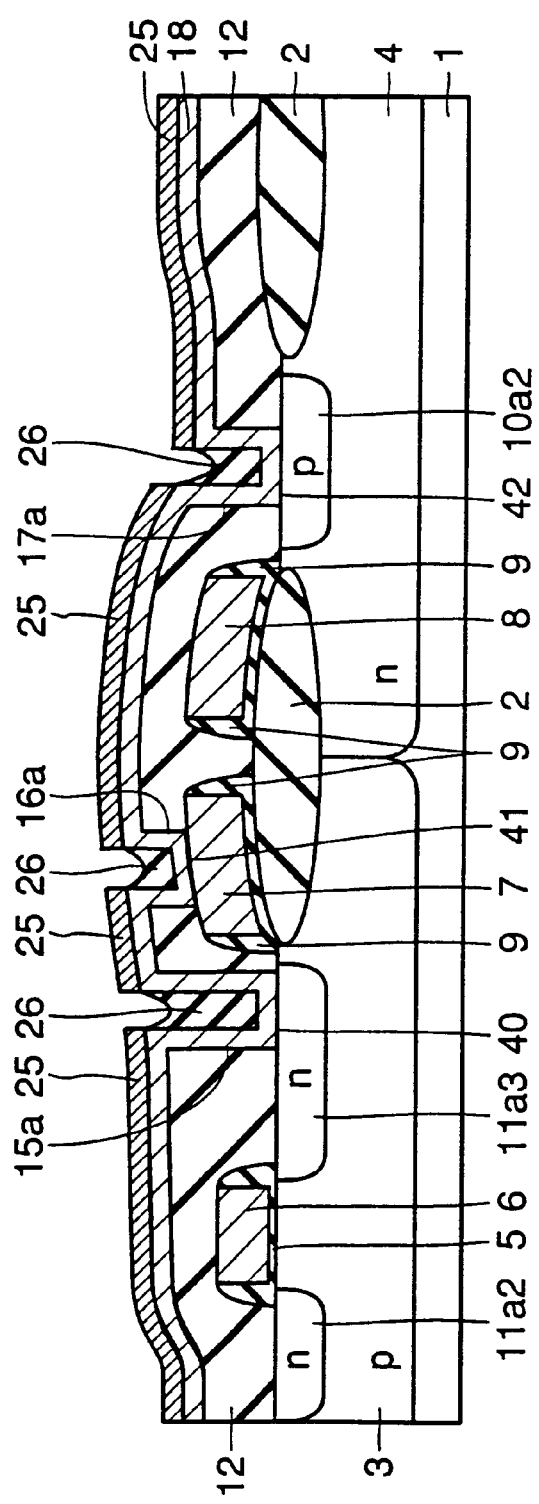

Referring to FIG. 16 next, the thickness of insulating film 26 is decreased by the etch-back, the CMP (Chemical Mechanical Polishing) method or the like. Insulating film 26 is thus left in contact holes 15a–17a.

A metal film (not shown) is deposited on polycrystal silicon film 18 and insulating film 26. An annealing process such as the RTA (Rapid Thermal Anneal) or the like is applied to the metal film. The surface of polycrystal silicon film 18 not covered with insulating film 26 is accordingly silicided. Metal silicide film 25 is thus selectively formed at the surface of polycrystal silicon film 18.

Figure 18:
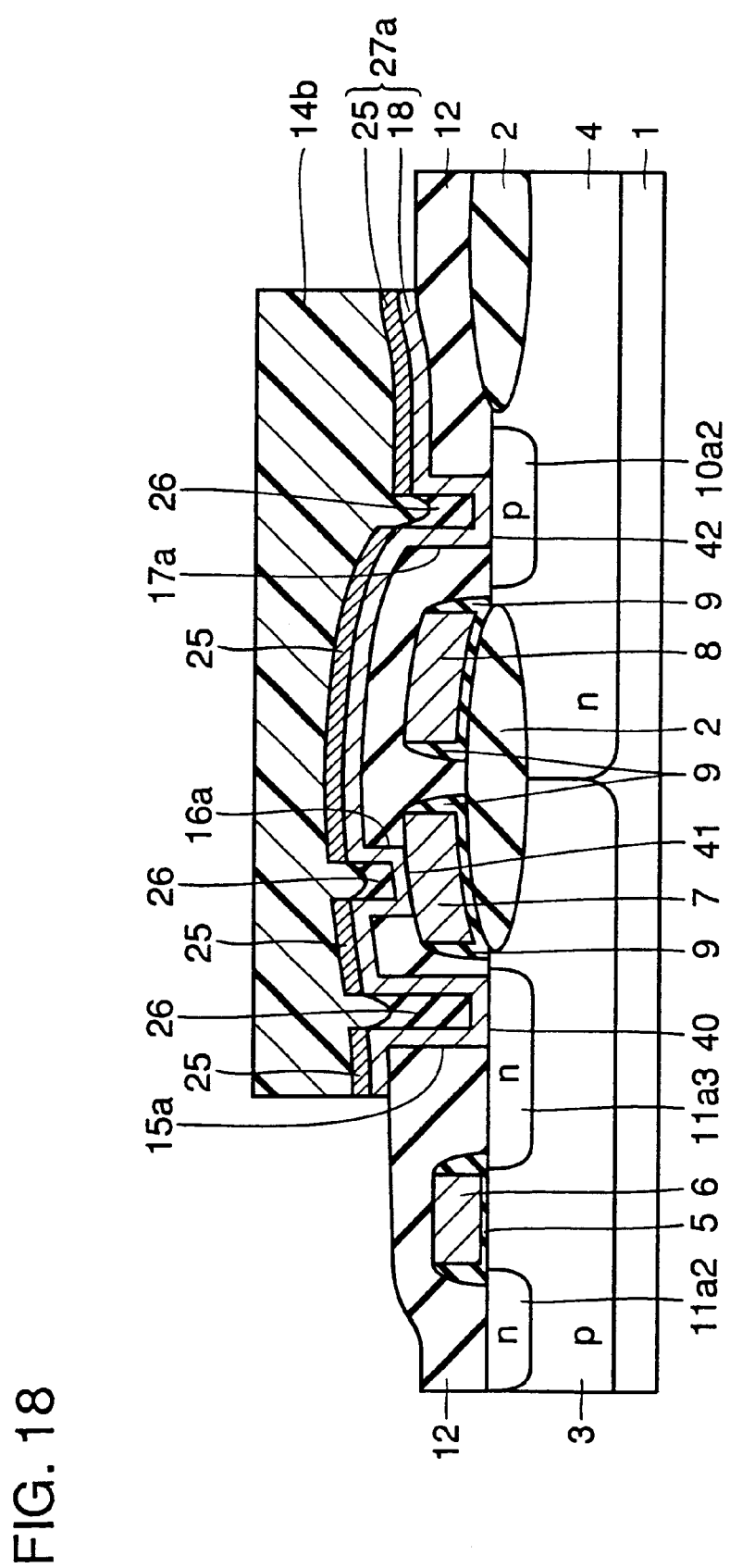

Referring to FIG. 18, resist 14b is applied to cover metal silicide film 25, and resist 14b is patterned into a prescribed shape. The patterned resist 14b is used as a mask for etching metal silicide film 25 and polycrystal silicon film 18 successively. A local interconnection line 27a is thus formed.

Figure 19:
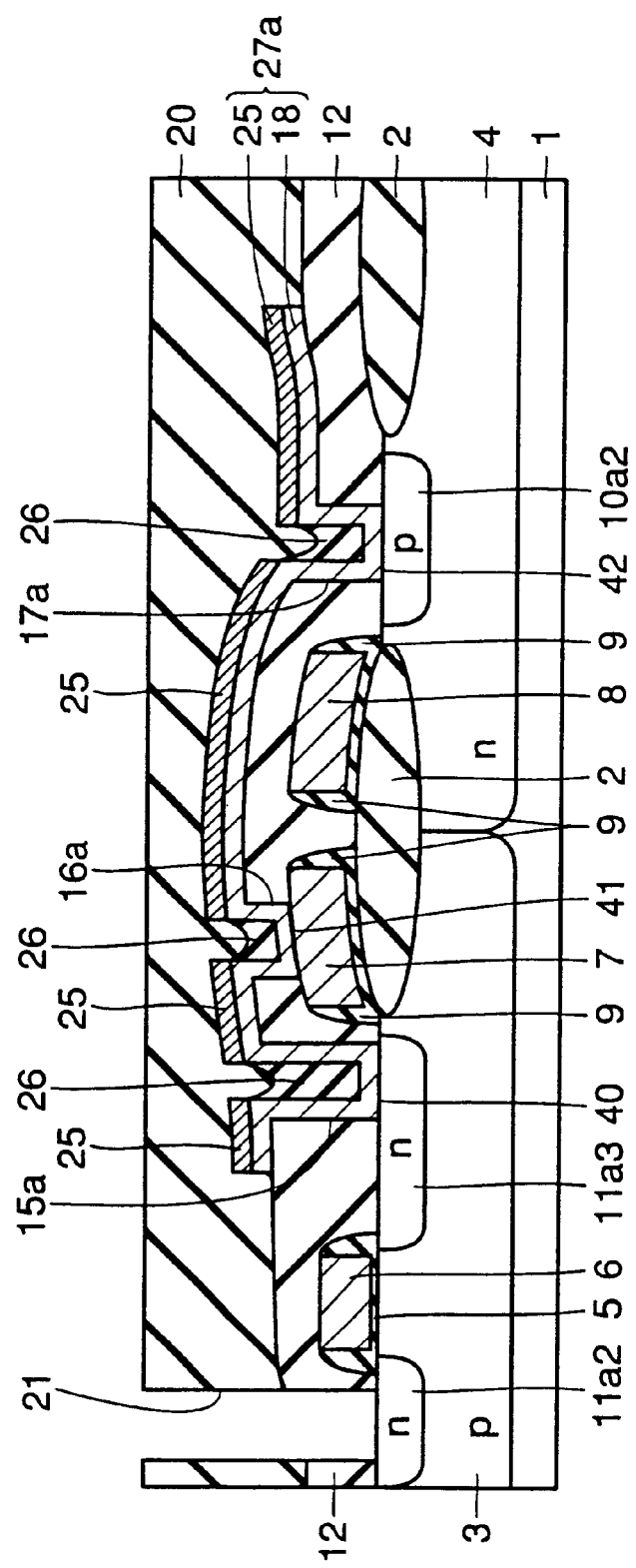

Referring to FIG. 19, interlayer insulating film 20 and contact hole 21 are completed using a method similar to that according to the first embodiment. The SRAM shown in FIG. 13 is thereafter completed through steps similar to those according to the first embodiment.

Fourth Embodiment

Figure 20:
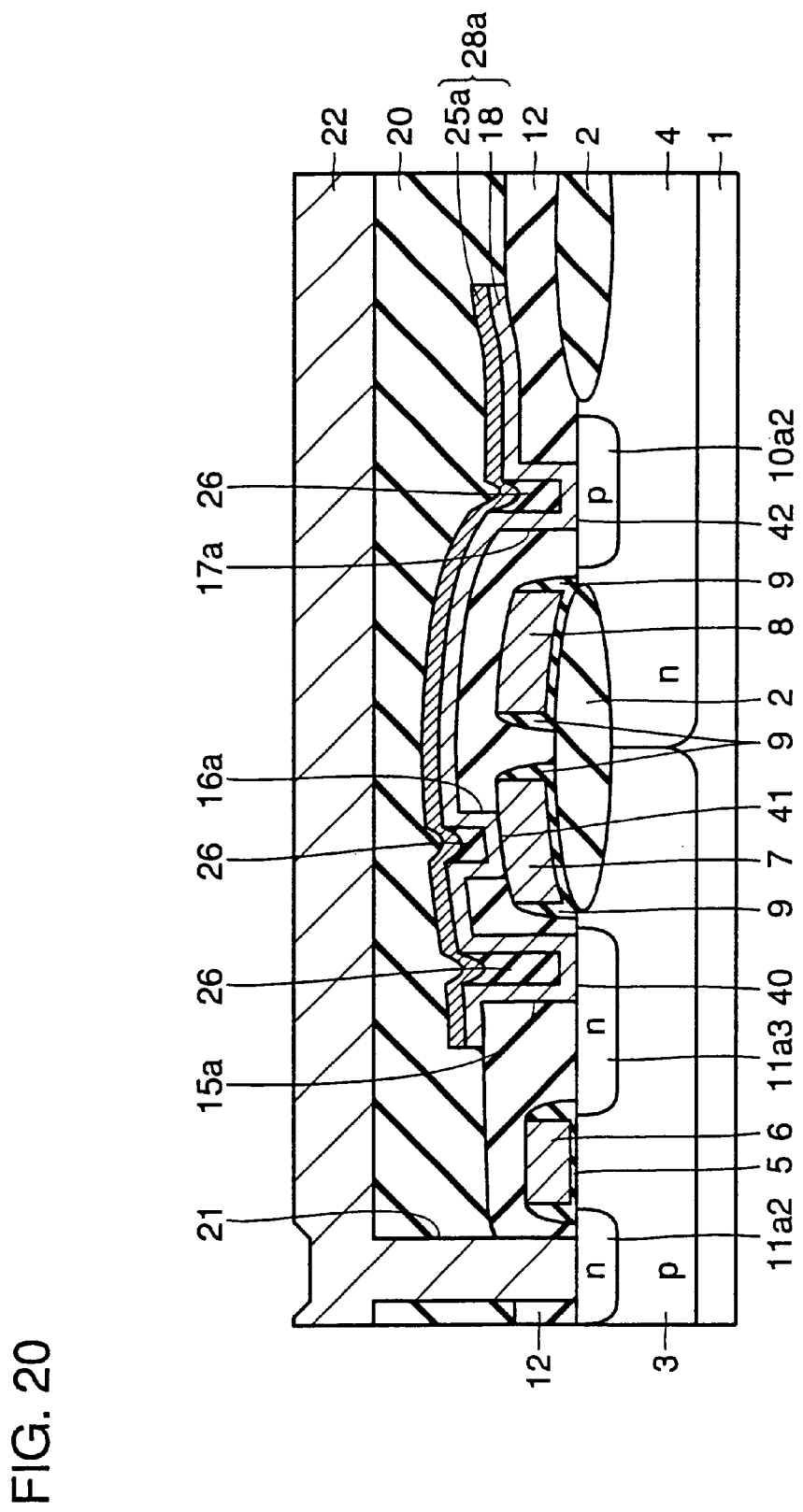
FIG. 20 is a cross section illustrating an SRAM according to the fourth embodiment of the invention.

The fourth embodiment of the invention is next described using FIGS. 20–23. FIG. 20 is a cross sectional view showing an SRAM according to the fourth embodiment of the invention.

Referring to FIG. 20, a metal silicide film 25a is extended onto insulating film 26 according to the fourth embodiment. Other structures are similar to those according to the third embodiment.

Metal silicide film 25a is formed to extend onto insulating film 26, so that the ratio of metal silicide film 25a in a local interconnection line 28a can be increased compared with the third embodiment. The resistance value of local interconnection line 28a can be reduced further than that according to the third embodiment described above.

Although metal silicide film 25a extends onto insulating film 26, increase of contact resistance can be avoided since insulating film 26 functions as an impurity diffusion prevention film that prevents impurities in polycrystal silicon film 18 located in the vicinity of contact portions 40–42 from being absorbed by metal silicide film 25a. Instead of insulating film 26, any film formed of any material having a function of preventing impurity diffusion and functioning as a mask in the silicidation reaction may be used.

Figure 21:
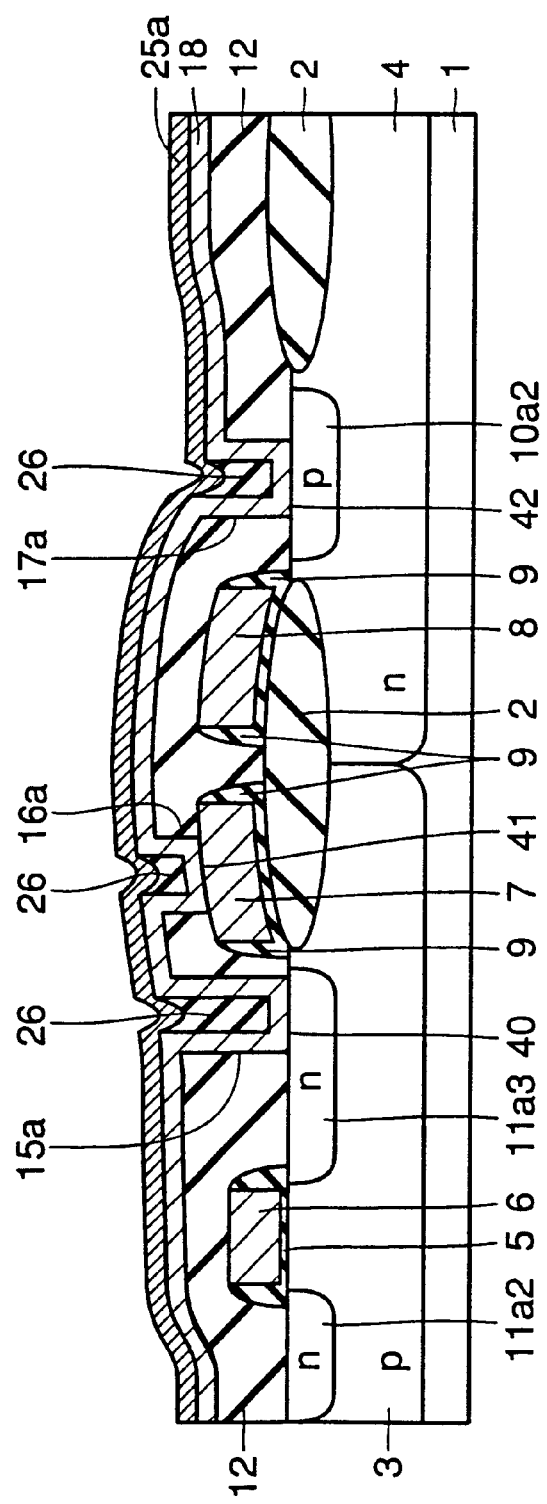
FIGS. 21–23 are cross sections showing characteristic first to third steps of a manufacturing process of the SRAM shown in FIG. 20.
Figure 22:
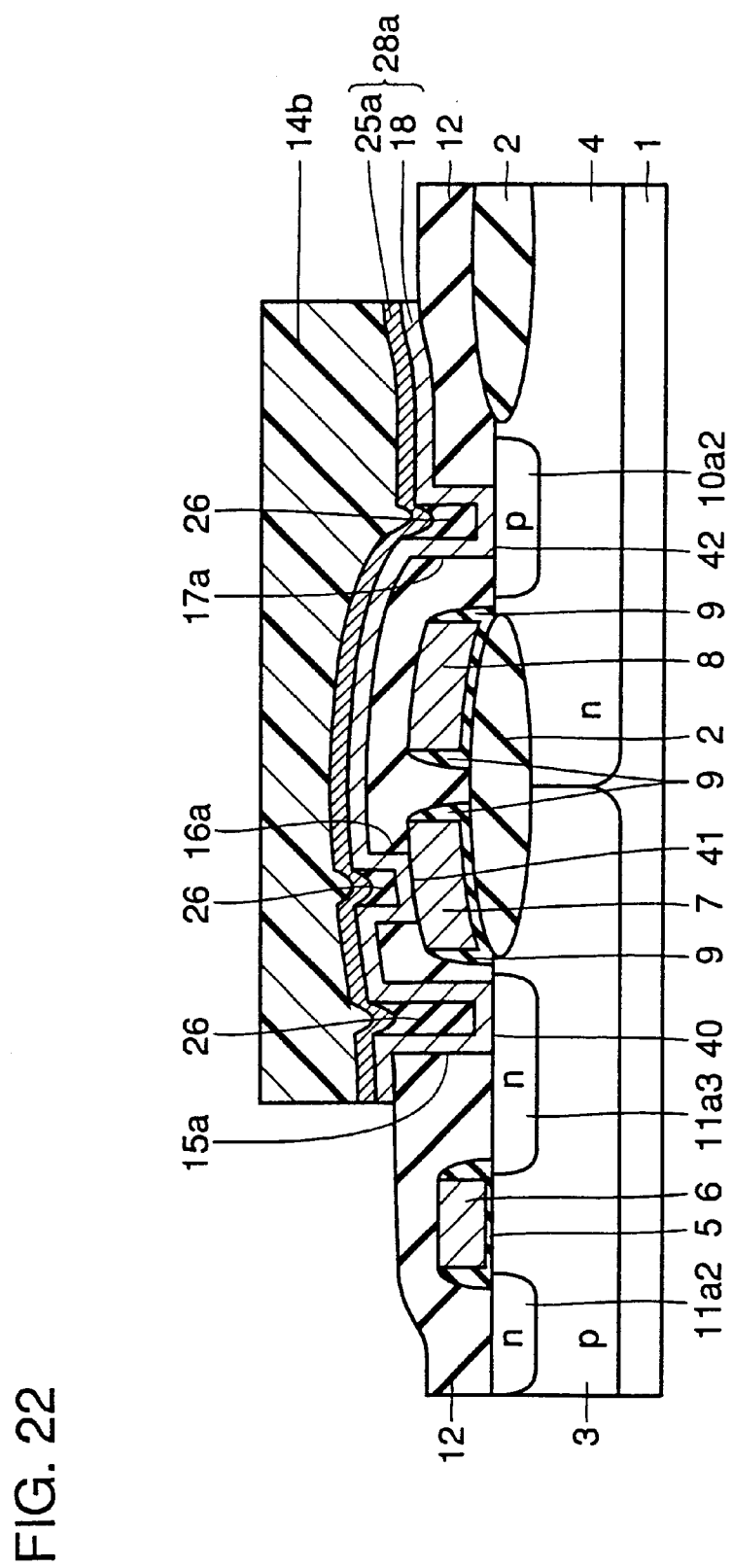
Figure 23:
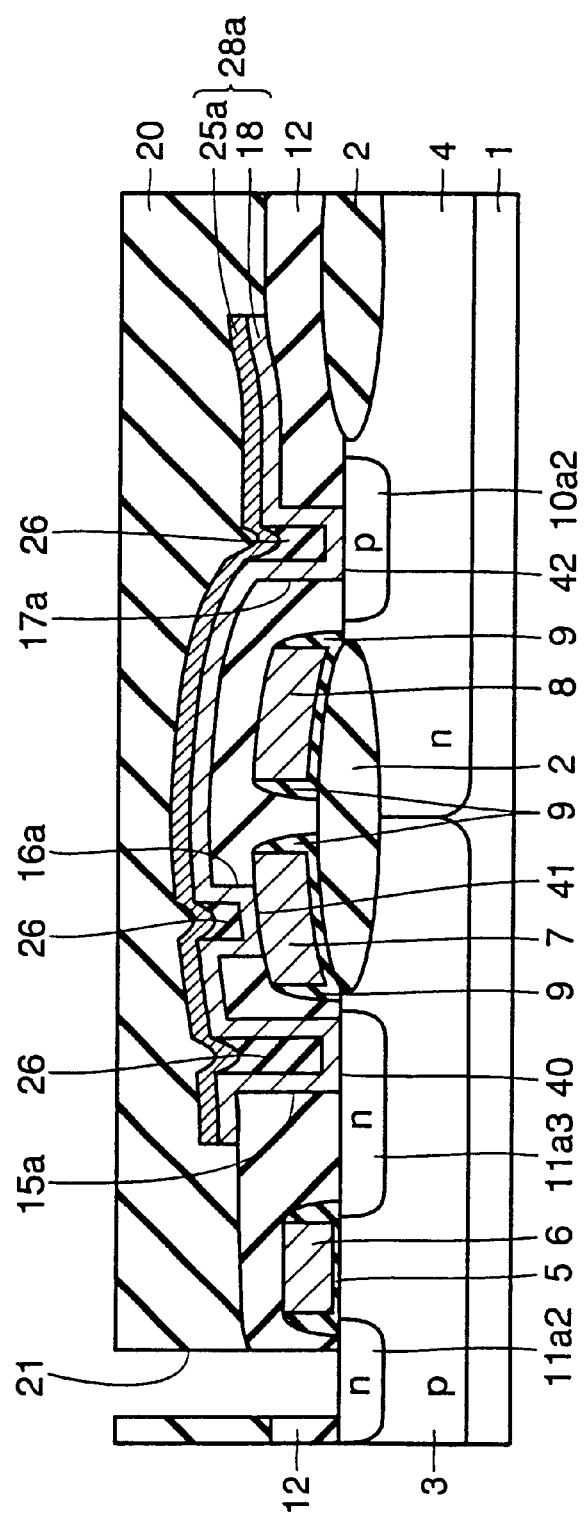

A method of manufacturing the SRAM according to the fourth embodiment is described using FIGS. 21–23. FIGS. 21–23 are cross sections showing the first to the third steps that characterize a manufacturing process of the SRAM according to the fourth embodiment.

Referring to FIG. 21, insulating film 26 and preceding components are formed through steps similar to those according to the third embodiment. Metal silicide film 25a is deposited on insulating film 26 and polycrystal silicon film 18 by the sputtering method, the CVD method or the like.

Referring to FIG. 22, resist 14b patterned into a prescribed shape is formed on metal silicide film 25a. Metal silicide film 25a and polycrystal silicon film 18 are etched using resist 14b as a mask. Local interconnection line 28a is thus formed.

Referring to FIG. 23, interlayer insulating film 20 and contact hole 21 are completed by a method similar to that according to the first embodiment. The SRAM shown in FIG. 20 is thereafter completed through steps similar to those according to the first embodiment.

Fifth Embodiment

Figure 24:
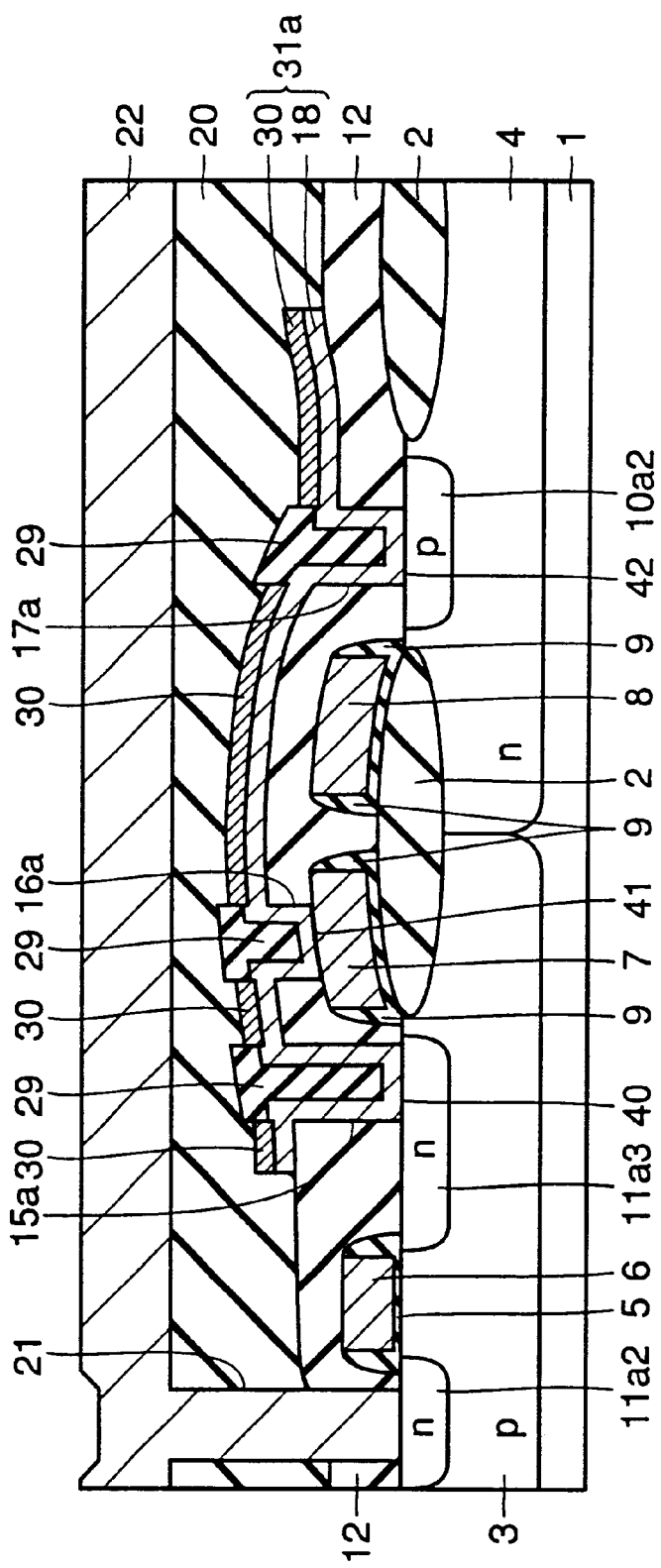
FIG. 24 is a cross section showing an SRAM according to the fifth embodiment of the invention.

The fifth embodiment of the invention is hereinafter described using FIGS. 24–28. FIG. 24 is a cross section showing an SRAM according to the fifth embodiment of the invention.

Referring to FIG. 24, an insulating film 29 is formed to fill the inside of contact holes 15a–17a and to extend onto polycrystal silicon film 18 which is located on sidewalls of contact holes 15a–17a according to the fifth embodiment. The material of insulating film 29 is similar to that of insulating film 26. A metal silicide film 30 is formed on the surface of polycrystal silicon film 18 at a portion which is not covered with insulating film 29. Metal silicide film 30 and polycrystal silicon film 18 form a local interconnection line 31a. Other structures are similar to those according to the first embodiment.

Insulating film 29 is formed to cover contact holes 15–17a as described above so that silicidation of polycrystyal silicon film 18 located in contact holes 15a–17a can be prevented.

A method of manufacturing the SRAM according to the fifth embodiment is described using FIGS. 25–28. FIGS. 25–28 are cross sections showing the first to the fourth steps which characterize a manufacturing process of the SRAM of the fifth embodiment.

Figure 25:
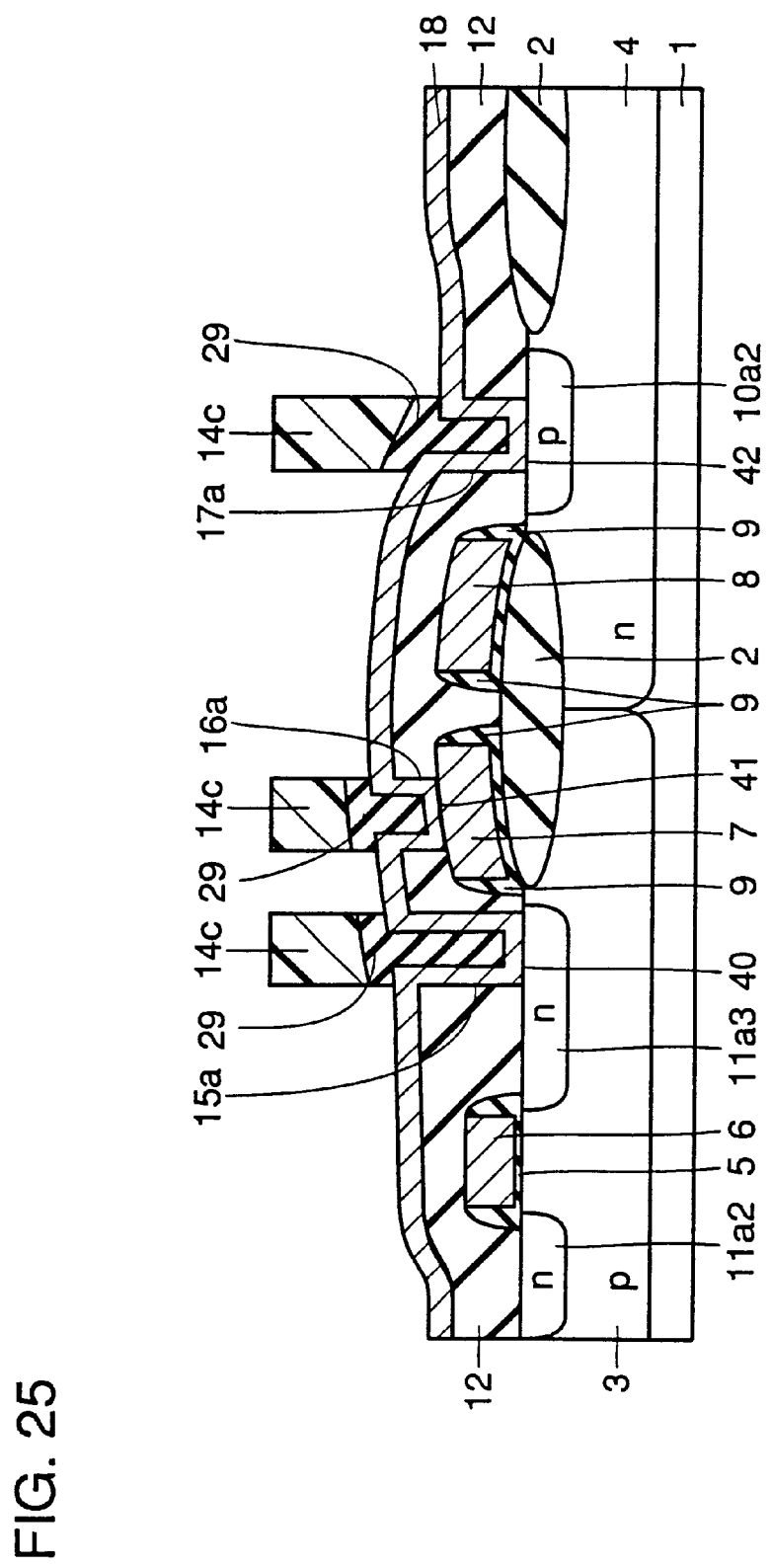
FIGS. 25–28 illustrate characteristic first to fourth steps of a manufacturing process of the SRAM shown in FIG. 24.

Referring to FIG. 25, polycrystal silicon film 18 and preceding components are formed through steps similar to those according to the third embodiment. Using the CVD method or the like, insulating film 29 formed of a silicon oxide film or the like is deposited to fill the inside of contact holes 15a–17a and cover polycrystal silicon film 18. A resist 14c patterned into a prescribed shape is formed on insulating film 29. The patterned resist 14c is formed immediately above contact holes 15a–17a. Insulating film 29 is etched using resist 14c as a mask. Consequently, insulating film 29 filling respective contact holes 15a–17a is completed.

Figure 26:
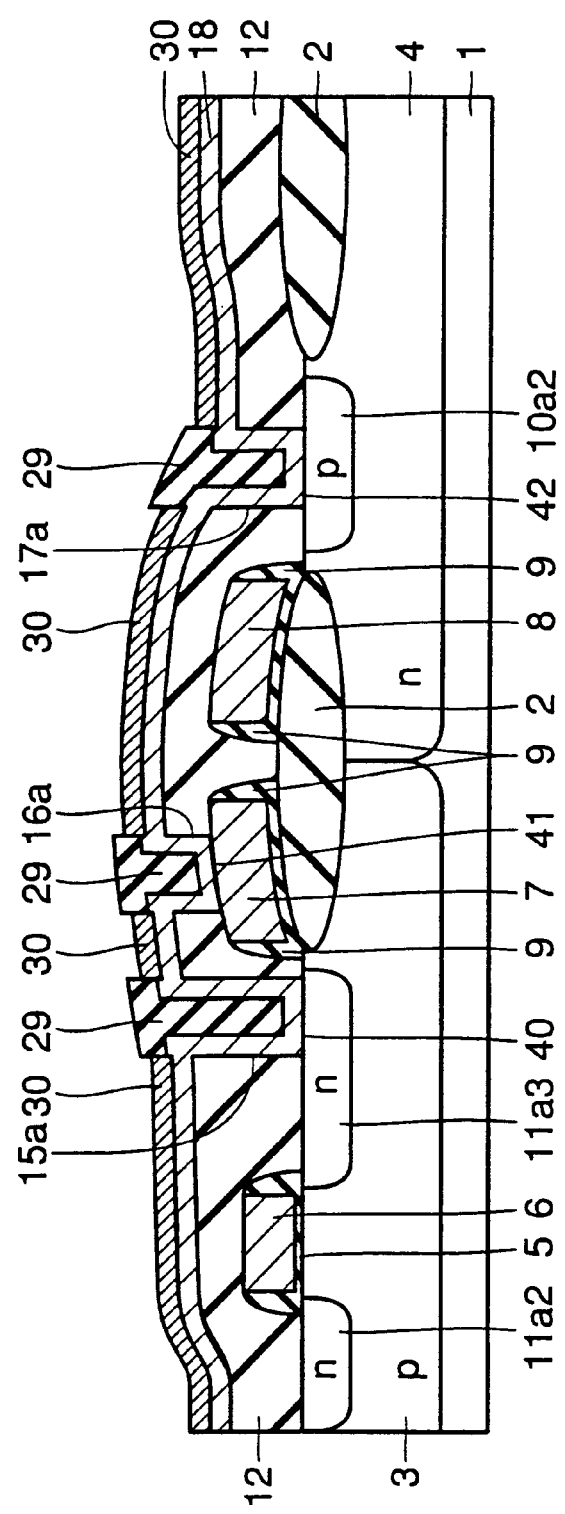
Figure 27:
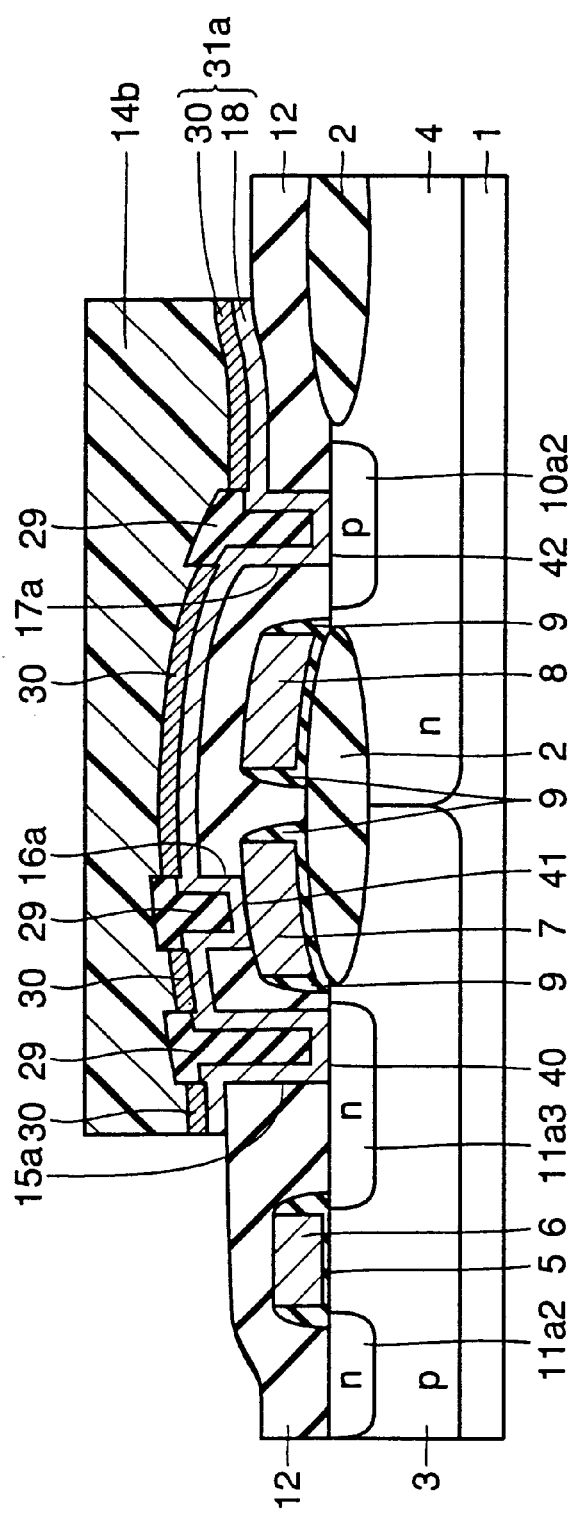

Referring to FIG. 26, metal silicide film 30 is formed by a method similar to that of the third embodiment. Resist 14b patterned into a prescribed shape is formed as shown in FIG. 27 on metal silicide film 30. The patterned resist 14b is used as a mask for successively etching metal silicide film 30 and polycrystal silicon film 18. A local interconnection line 31a is accordingly completed.

Figure 28:
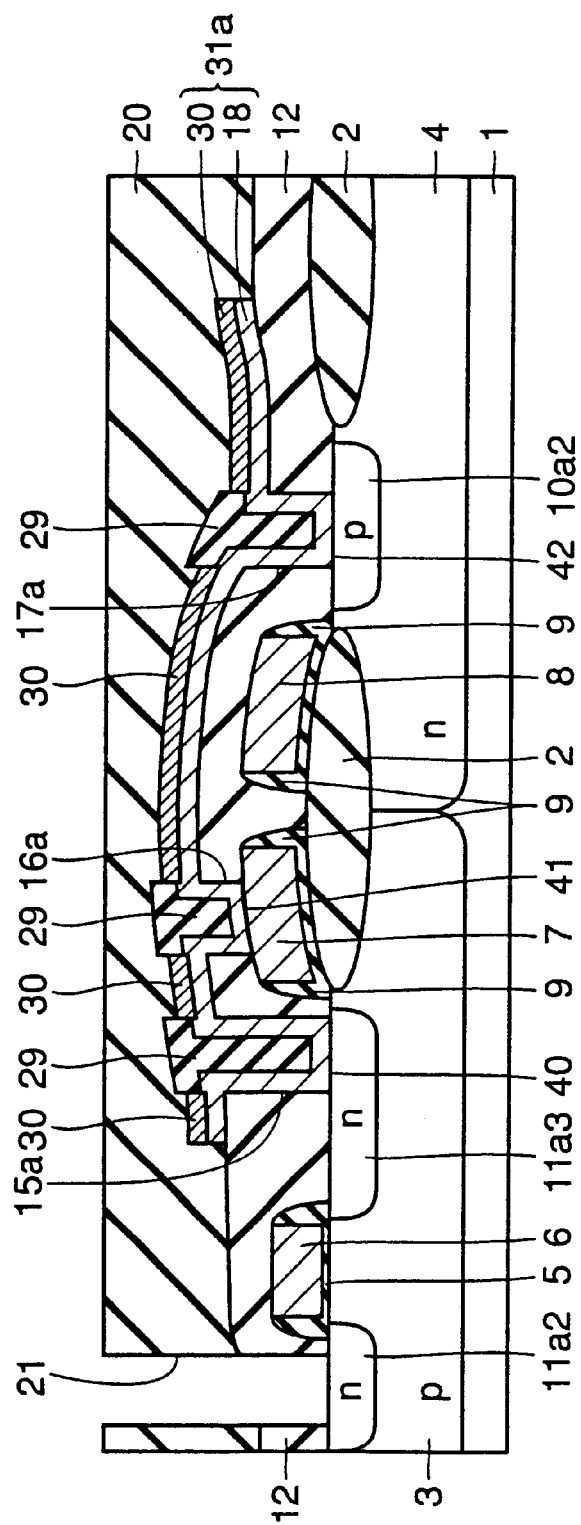

Referring to FIG. 28, interlayer insulating film 20 and contact hole 21 are formed by a method similar to that of the first embodiment. The SRAM shown in FIG. 24 is thereafter completed through steps similar to those according to the first embodiment.

Sixth Embodiment

Figure 29:
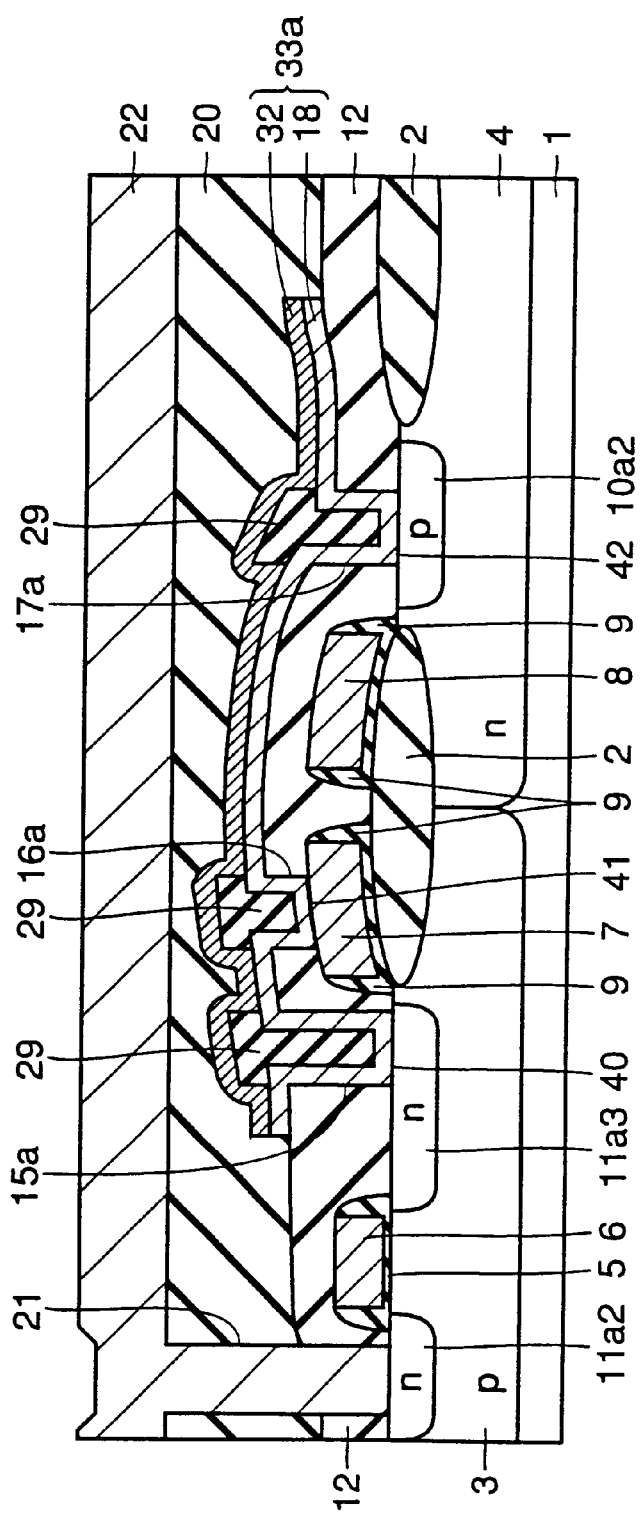
FIG. 29 is a cross section showing an SRAM according to the sixth embodiment of the invention.

The sixth embodiment of the invention is described using FIGS. 29–32. FIG. 29 is a cross section illustrating an SRAM according to the sixth embodiment of the present invention.

Referring to FIG. 29, a metal silicide film 32 extends onto insulating film 29 according to the sixth embodiment. Metal silicide film 32 and polycrystal silicon film 18 constitute a local interconnection line 33a. Other structures are similar to those according to the fifth embodiment described above.

Metal silicide film 32 is thus extended onto insulating film 29, so that reduction of resistance value of local interconnection line 33a is possible as the case of the fourth embodiment.

Figure 30:
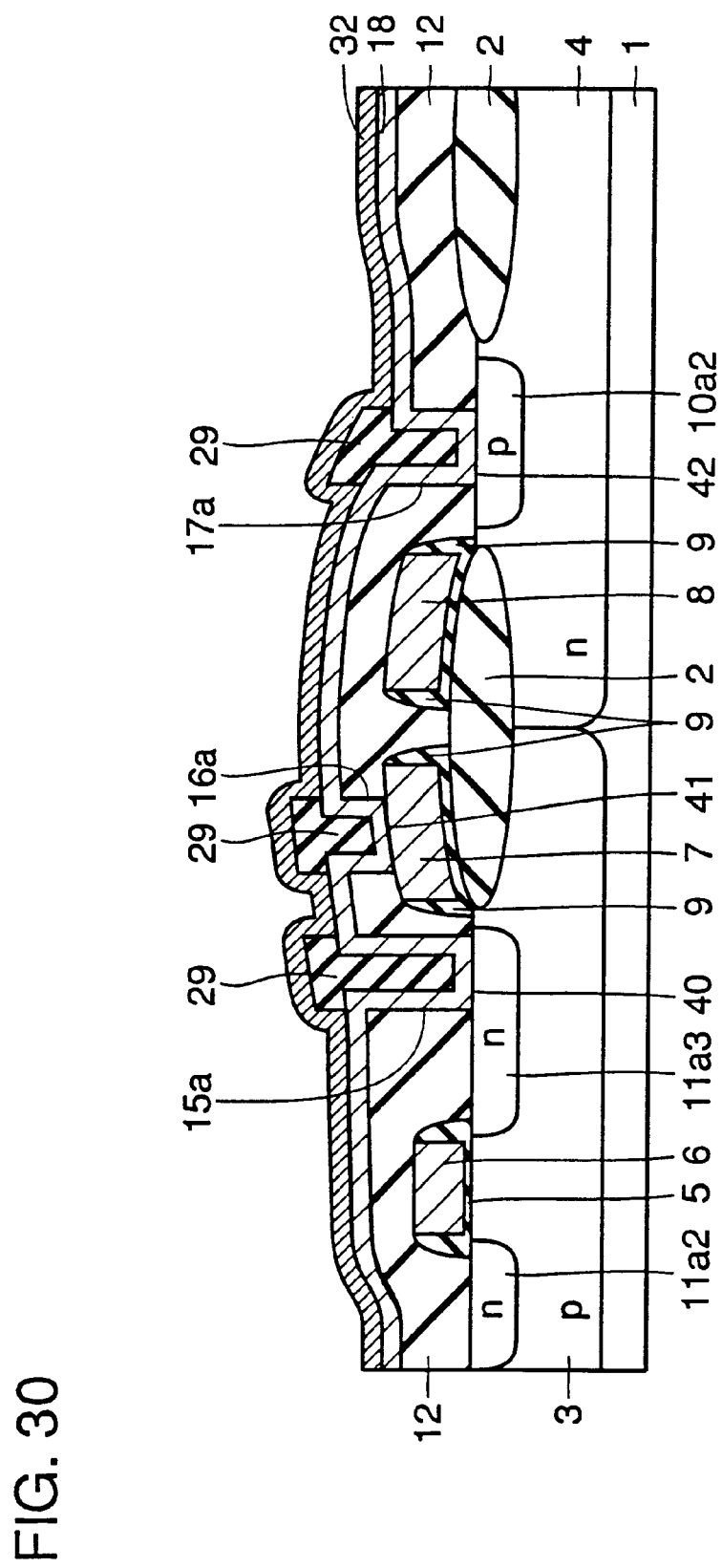
FIGS. 30–32 are cross sectional views showing characteristic first to third steps of a manufacturing process of the SRAM shown in FIG. 29.
Figure 31:
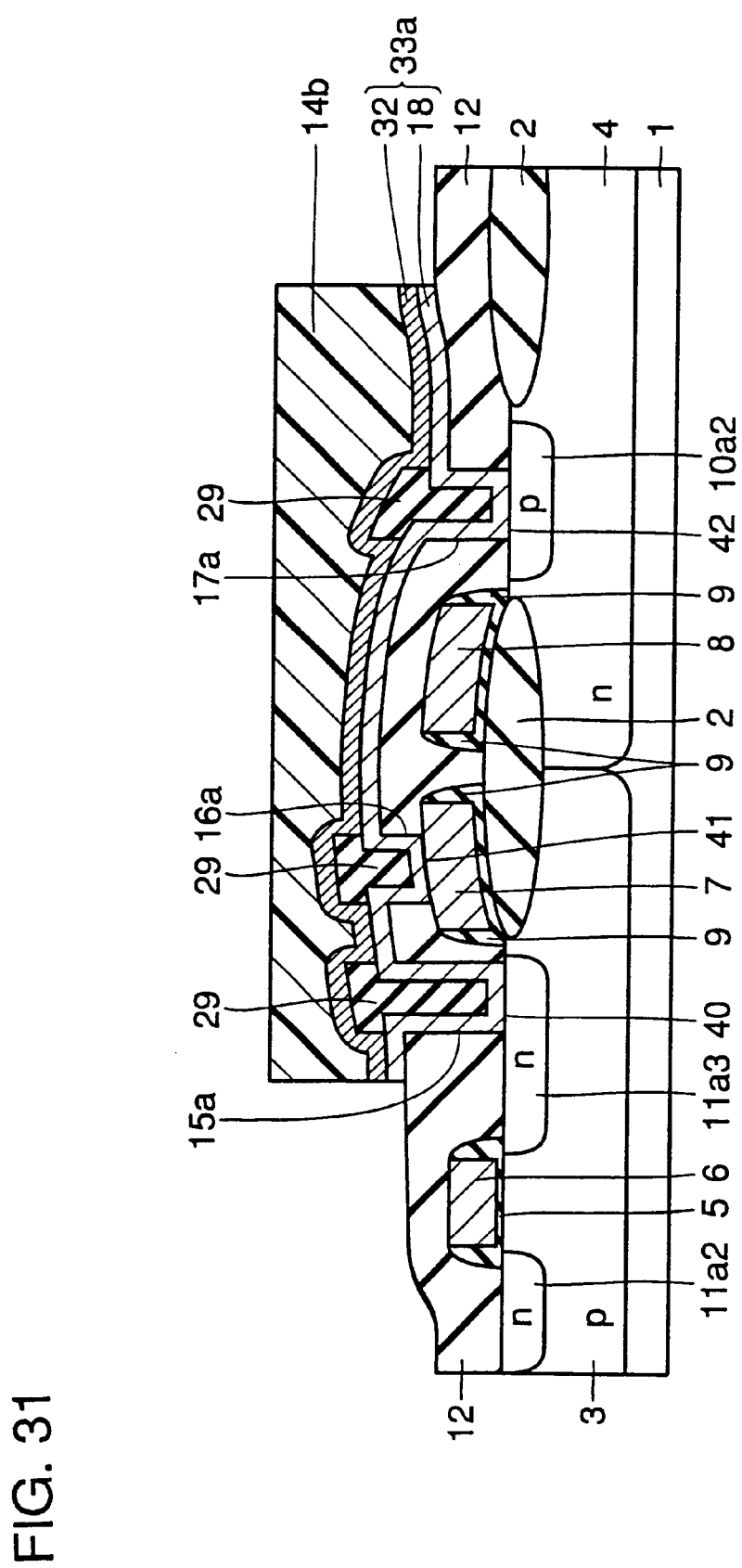
Figure 32:
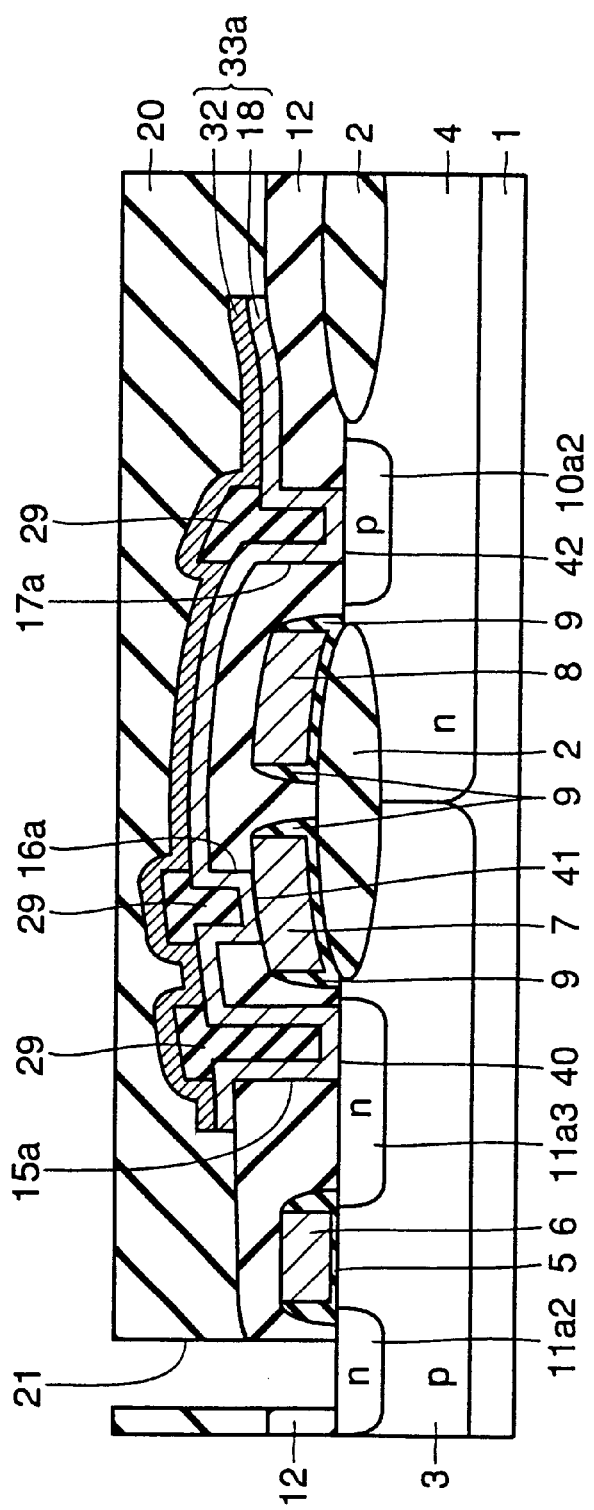

A method of manufacturing the SRAM according to the sixth embodiment is described using FIGS. 30–32. FIGS. 30–32 are cross sections showing the first to the third steps which characterize a manufacturing process of the SRAM according to the sixth embodiment.

Referring to FIG. 30, insulating film 29 and preceding elements are completed through steps similar to those of the fifth embodiment. Metal silicide film 32 is deposited on insulating film 29 and polycrystal silicon film 18 using the CVD method, or the sputtering method or the like.

Referring to FIG. 31, resist 14b patterned into a prescribed shape is formed on metal silicide film 32, and metal silicide film 32 and polycrystal silicon film 18 are successively etched using resist 14b as a mask. Local interconnection line 33a is accordingly formed.

After resist 14b is removed, interlayer insulating film 20 and contact hole 21 are formed by a method similar to that of the first embodiment as shown in FIG. 32. The SRAM shown in FIG. 29 is thereafter completed through steps similar to those of the first embodiment.

Seventh Embodiment

Figure 33:
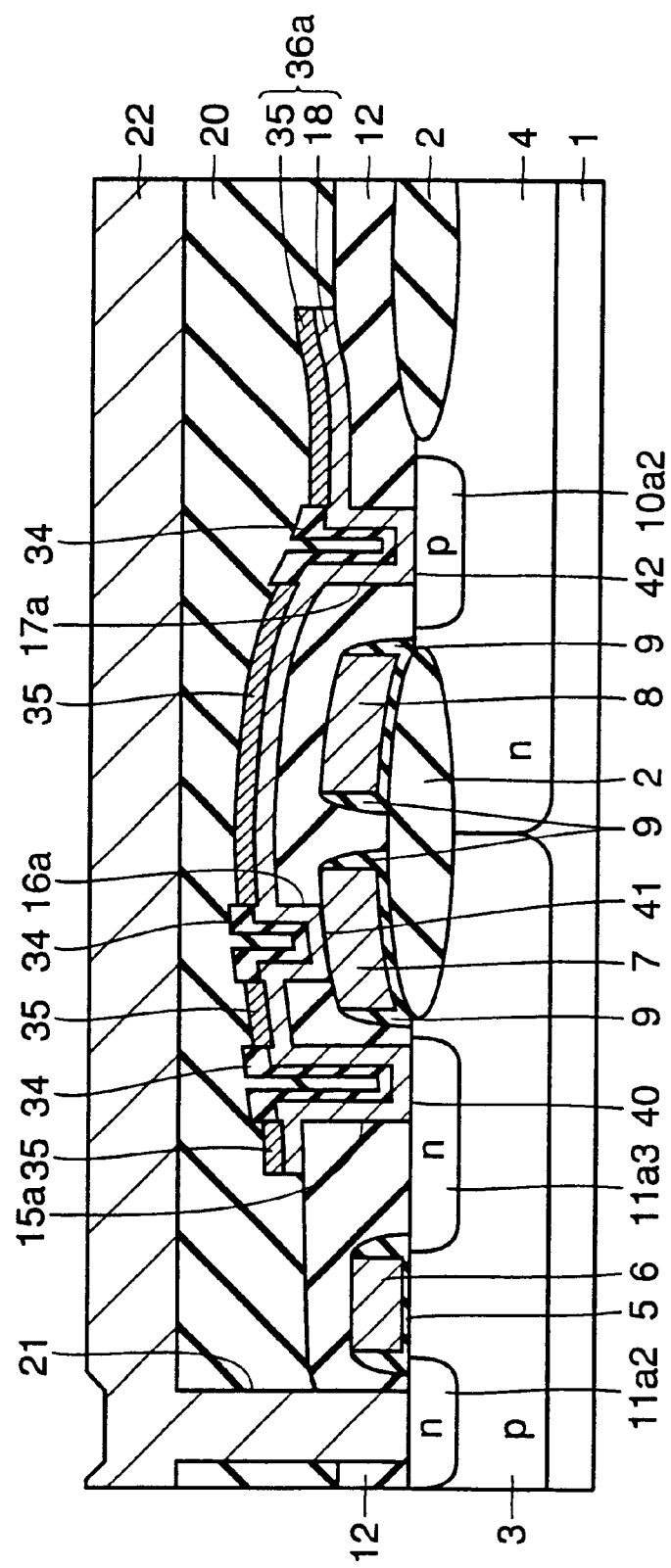
FIG. 33 is a cross section showing an SRAM according to the seventh embodiment of the invention.

The seventh embodiment of the invention is described using FIGS. 33–38. FIG. 33 is a cross section illustrating an SRAM according to the seventh embodiment of the invention.

Referring to FIG. 33, an insulating film 34 formed of a silicon oxide film, a silicon nitride film or the like is formed to cover the surface of polycrystal silicon film 18 located in contact holes 15a–17a according to the seventh embodiment. Insulating film 34 is formed to cover contact holes 15a–17a as in the case of the sixth embodiment. Preferably, insulating film 34 has a thickness of approximately 50–100 nm. A metal silicide film 35 is formed at the surface of polycrystal silicon film 18 at a portion which is not covered with insulating film 34. Metal silicide film 35 and polycrystal silicon film 18 form a local interconnection line 36a. Other structures are similar to those according to the first embodiment.

A method of manufacturing the SRAM according to the seventh embodiment is next described using FIGS. 34–38. FIGS. 34–38 are cross sections showing characteristic first to fifth steps of a manufacturing process of the SRAM according to the seventh embodiment of the invention.

Figure 34:
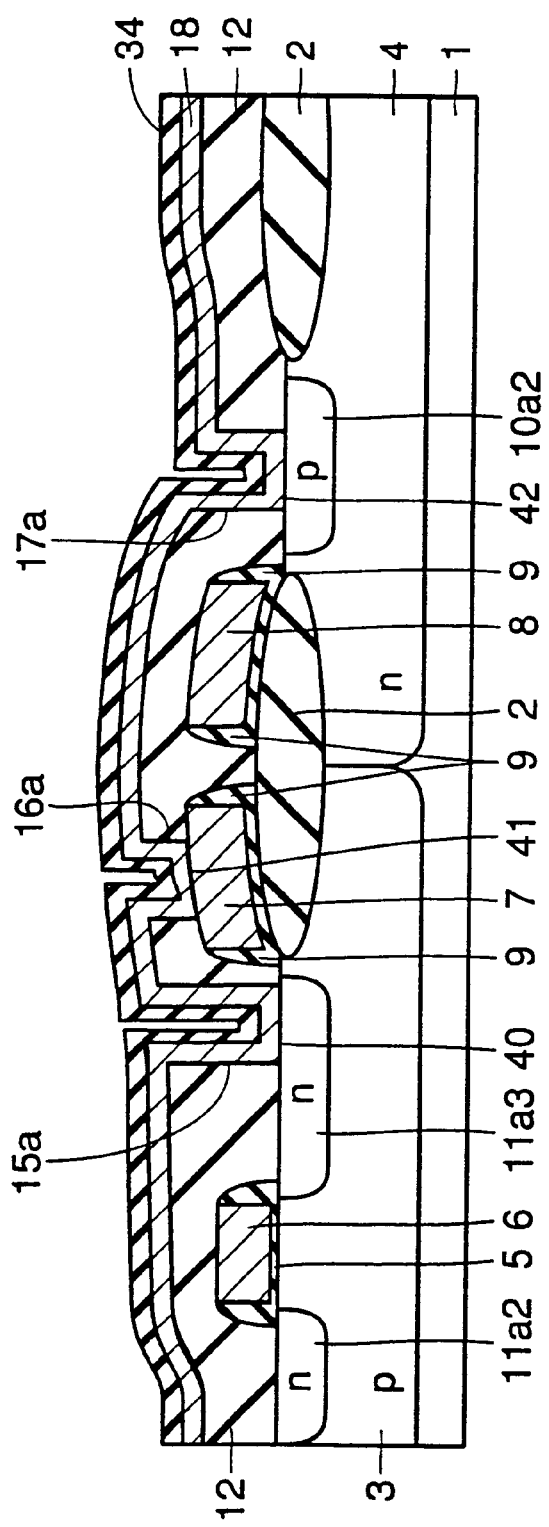
FIGS. 34–38 are cross sections respectively showing characteristic first to fifth steps of a manufacturing process of the SRAM shown in FIG. 33.

Referring to FIG. 34, polycrystal silicon film 18 and preceding elements are formed through processes similar to those according to the third embodiment. By oxidizing or nitriding the surface of polycrystal silicon film 18, insulating film 34 such as a silicon oxide film, a silicon nitride film or the like is formed at the surface of polycrystal silicon film 18 to have a thickness of approximately 50–100 nm.

Figure 35:
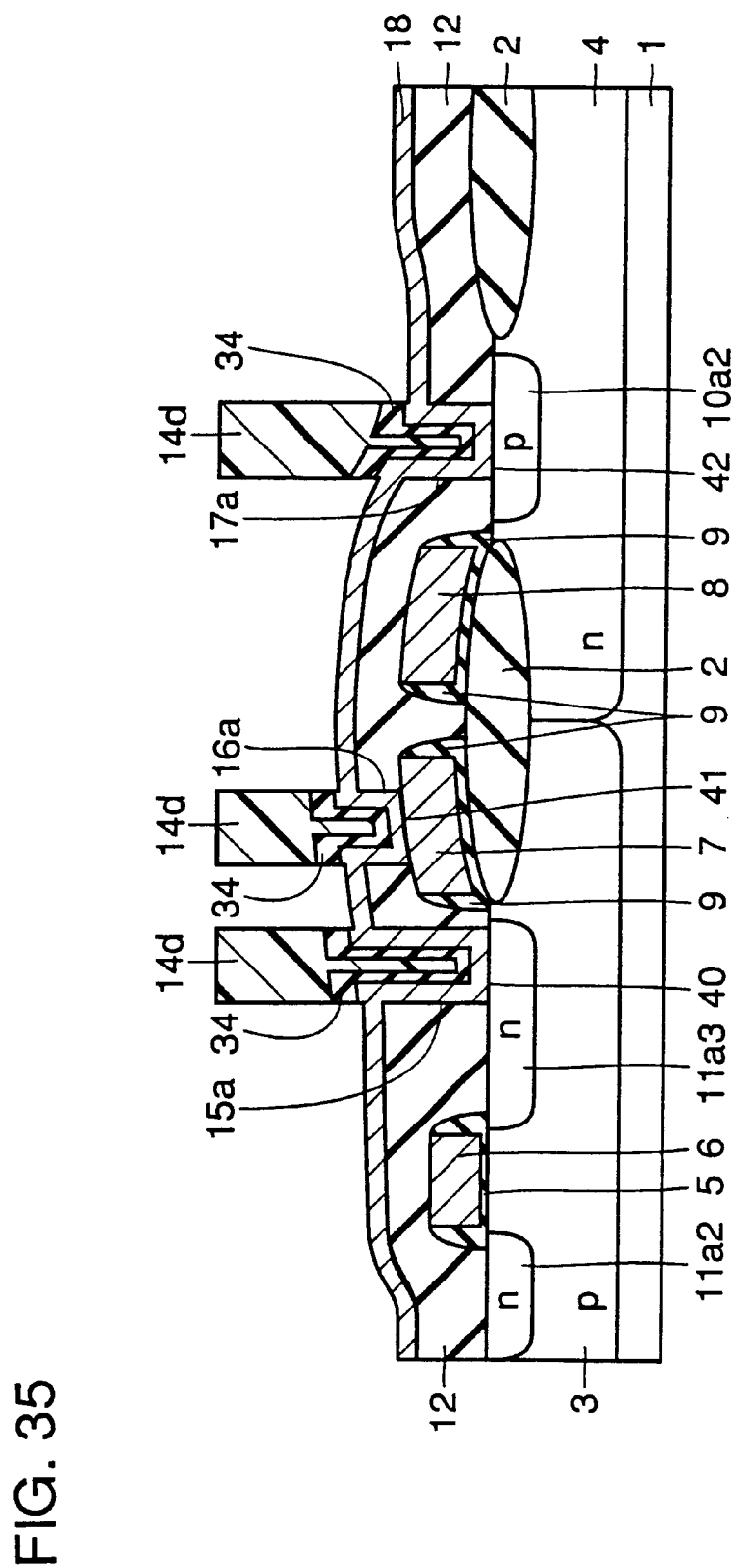

Referring to FIG. 35, a resist 14d patterned to cover contact holes 15a–17a is formed on insulating film 34. Using resist 14d as a mask, insulating film 34 is etched. Consequently, insulating film 34 that covers the surface of polycrystal silicon film 18 located in contact holes 15a–17a is completed.

Figure 36:
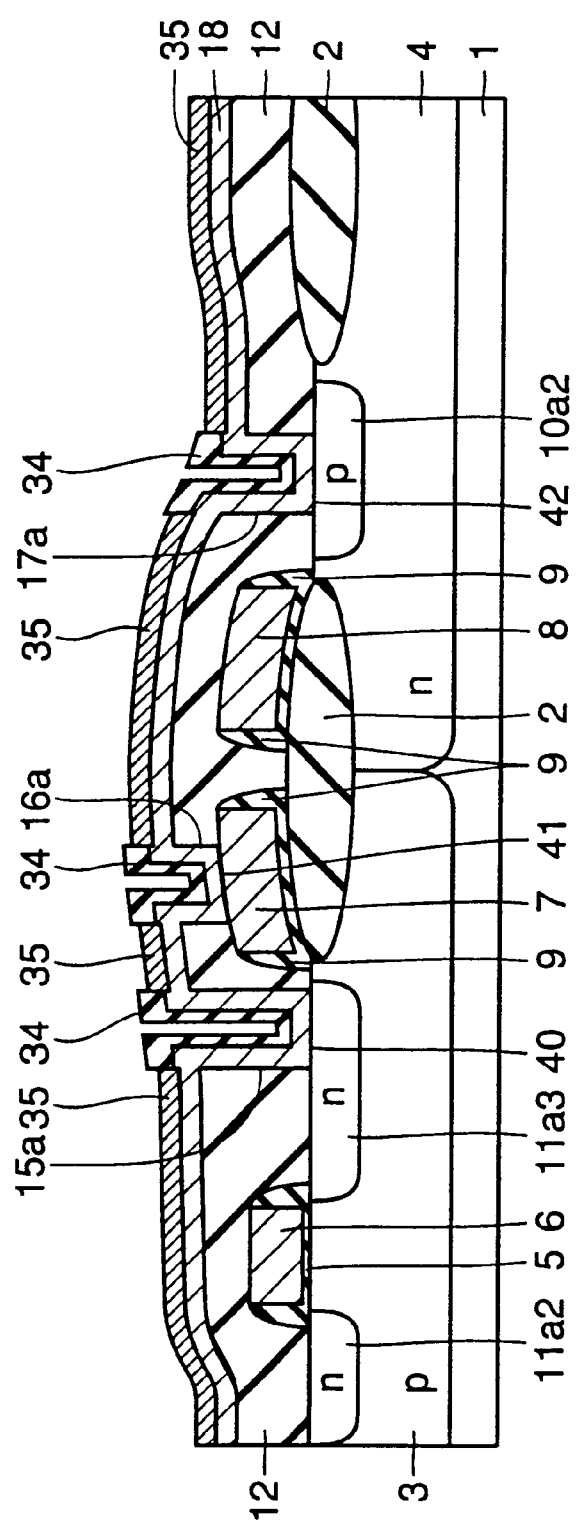

Referring to FIG. 36, the surface of polycrystal silicon film 18 not covered with insulating film 34 is silicided by a method similar to that according to the third embodiment. Metal silicide film 35 is selectively formed at the surface of polycrystal silicon film 18.

Figure 37:
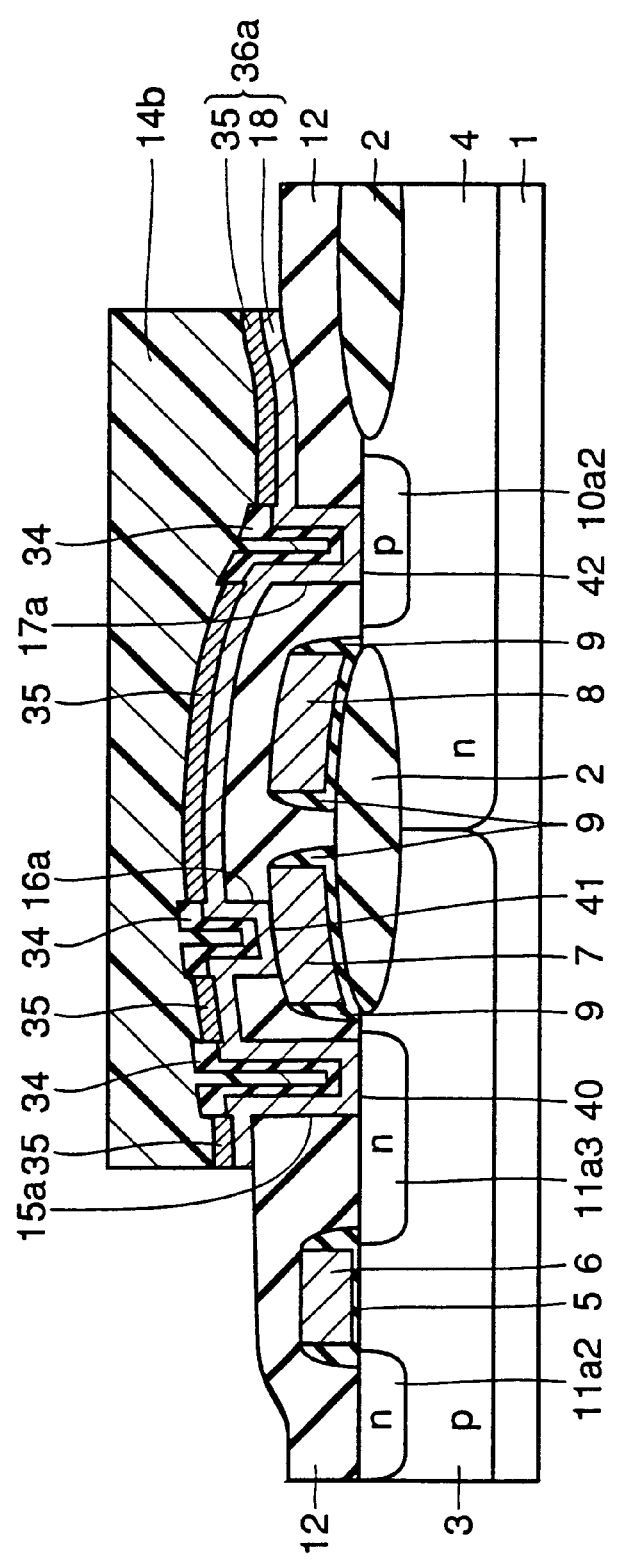

Referring to FIG. 37, resist 14b patterned into a prescribed shape is formed on metal silicide film 35. Metal silicide film 35 and polycrystal silicon film 18 are successively etched using resist 14b as a mask. Local interconnection line 36a is accordingly completed.

Figure 38:
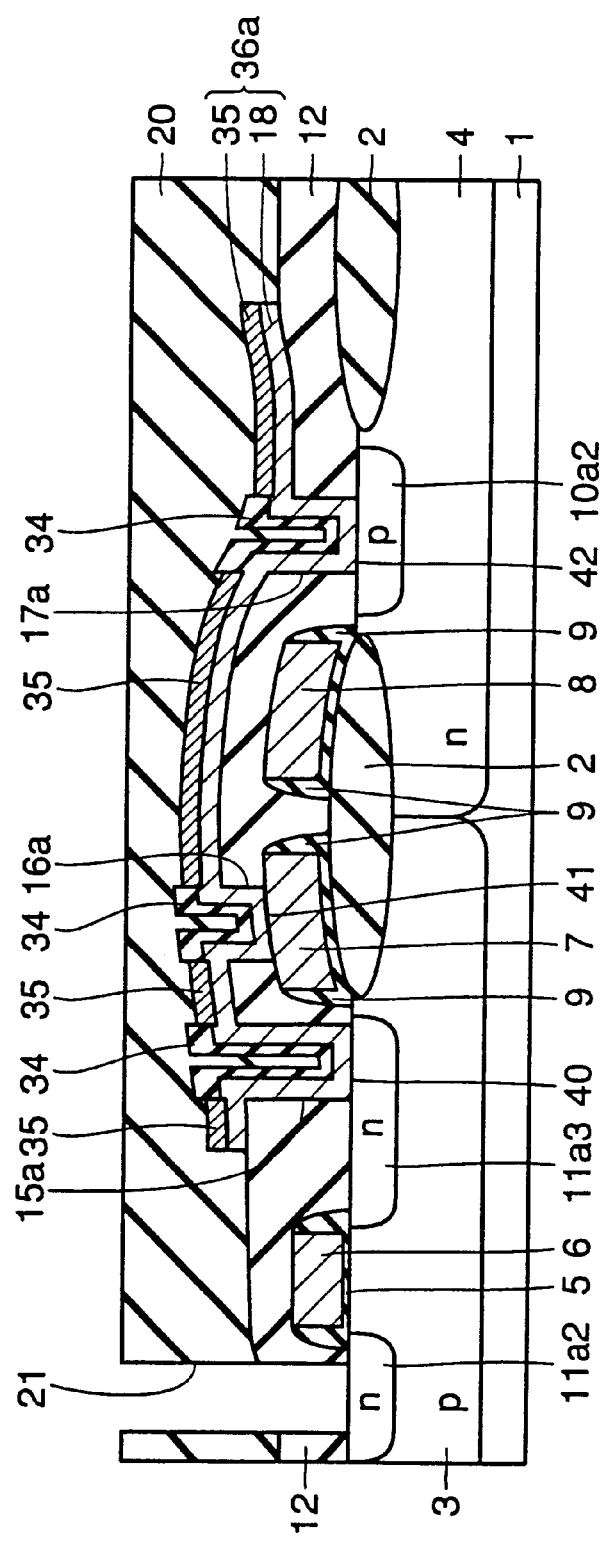

Referring to FIG. 38, interlayer insulating film 20 and contact hole 21 are formed by a method similar to that according to the first embodiment. The SRAM shown in FIG. 33 is thereafter completed through steps similar to those according to the first embodiment.

Eighth Embodiment

Figure 39:
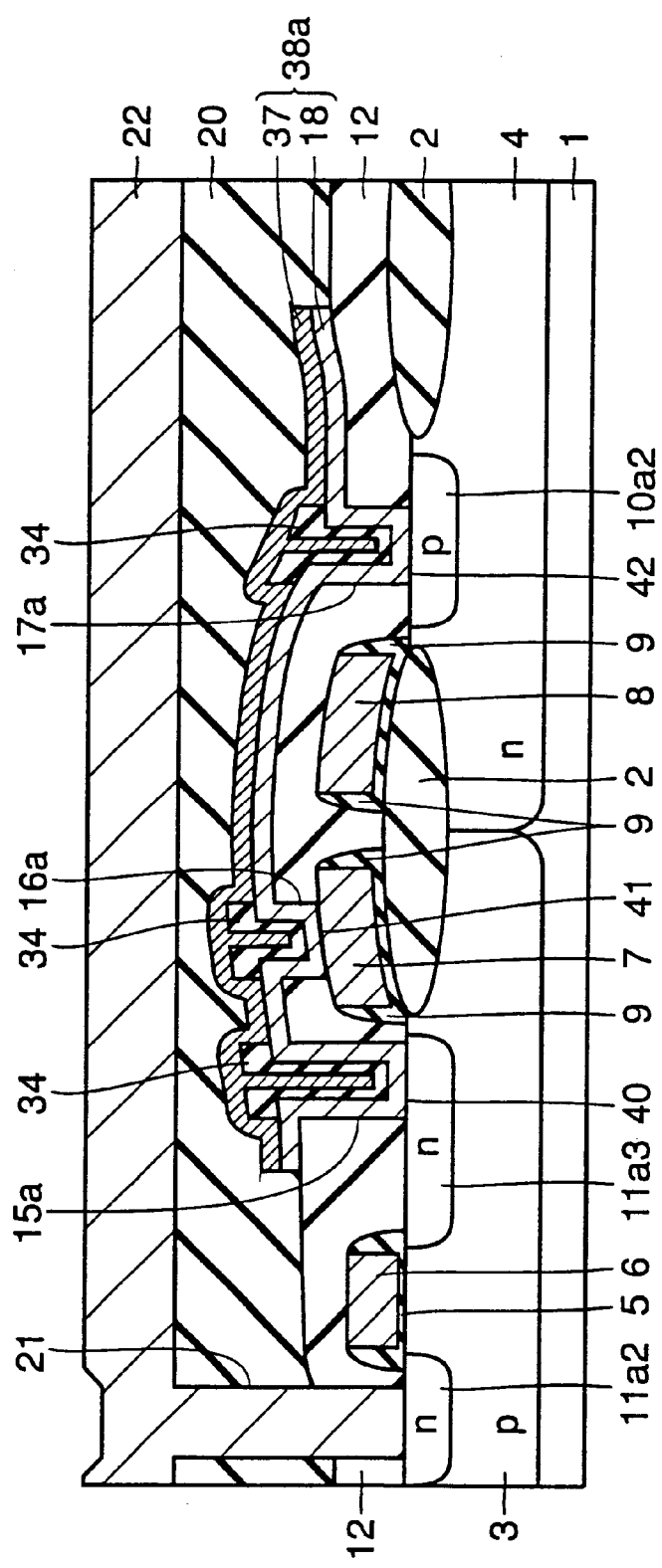
FIG. 39 is a cross section showing an SRAM according to the eighth embodiment of the invention.

The eighth embodiment of the present invention is hereinafter described using FIGS. 39–42. FIG. 39 is a cross section showing an SRAM according to the eighth embodiment of the invention.

Referring to FIG. 39, according to the eighth embodiment, a metal silicide film 37 extends onto insulating film 34. A local interconnection 38a is formed of metal silicide film 37 and polycrystal silicon film 18. Other structures are similar to those according to the seventh embodiment.

Metal silicide film 37 is formed to extend onto insulating film 34, so that a resistance value of local interconnection line 38a can be decreased as in the case of the fourth embodiment.

Figure 40:
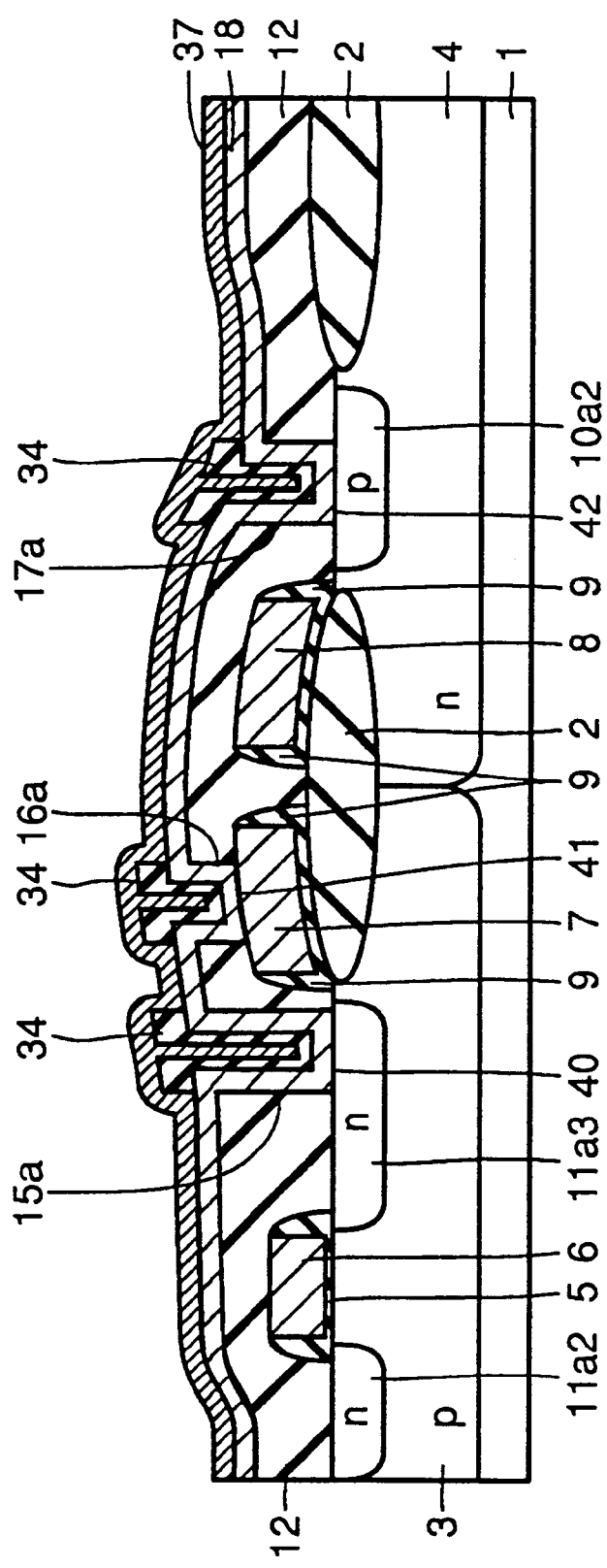
FIGS. 40–42 are characteristic first to third steps of a manufacturing process of the SRAM shown in FIG. 39.
Figure 41:
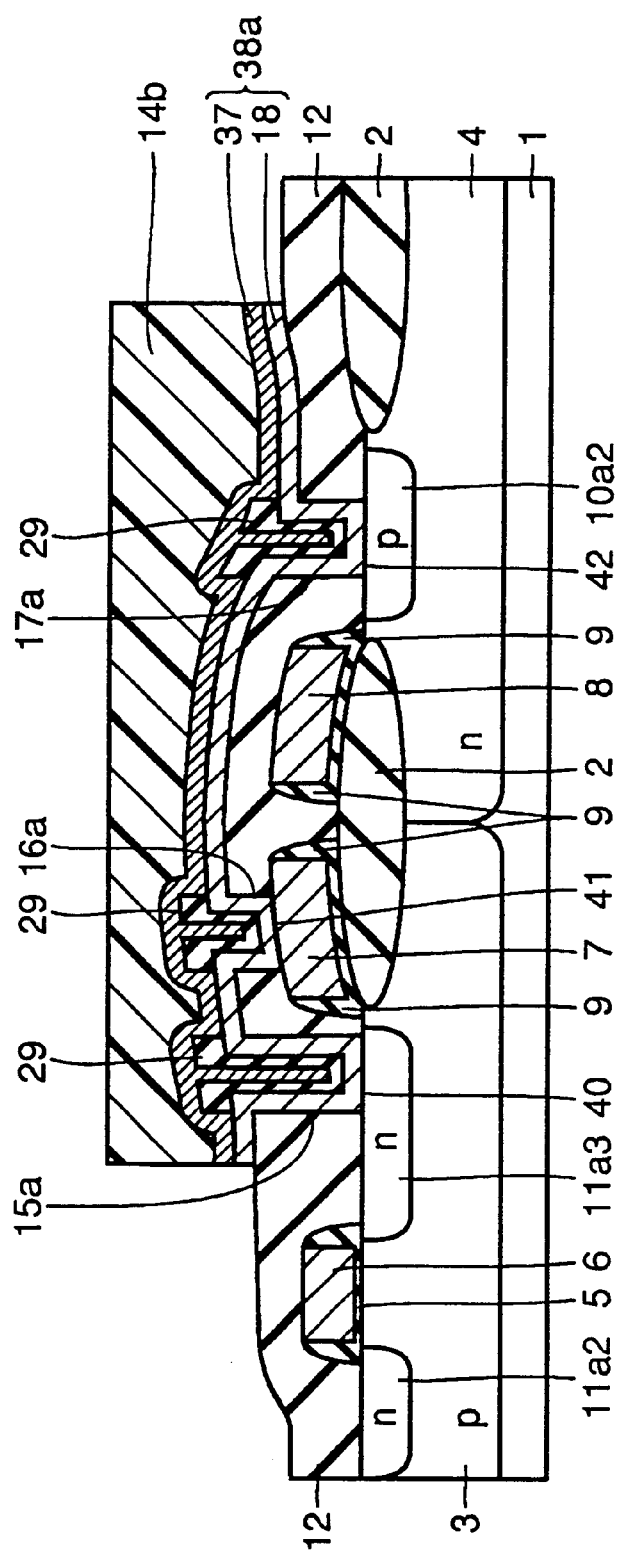
Figure 42:
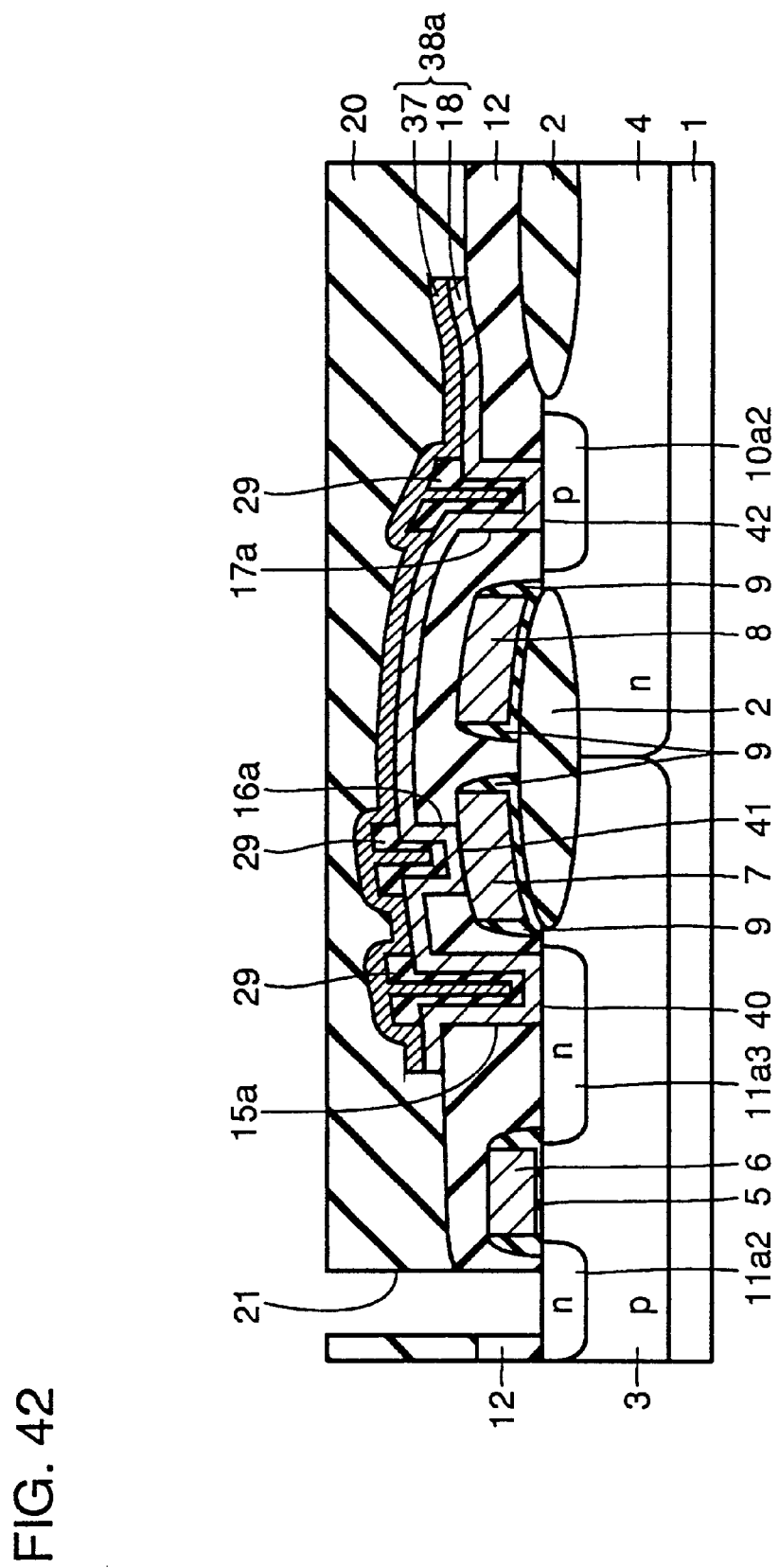

A method of manufacturing the SRAM according to the eighth embodiment is next described using FIGS. 40–42. FIGS. 40–42 are cross sections showing the first to the third steps that characterize a manufacturing process of the SRAM according to the eighth embodiment.

Referring to FIG. 40, insulating film 34 and preceding elements are formed through processes similar to those according to the seventh embodiment. Metal silicide film 37 is deposited on insulating film 34 by the CVD method, the sputtering method or the like.

Referring to FIG. 41, resist 14b patterned into a prescribed shape is formed on metal silicide film 37. Metal silicide film 37 and polycrystal silicon film 18 are successively etched using the patterned resist 14b as a mask. Local interconnection line 38a is thus completed.

Referring to FIG. 42, interlayer insulating film 20 and contact hole 21 are formed by a method similar to that according to the first embodiment. The SRAM shown in FIG. 39 is thereafter completed through steps similar to those according to the first embodiment.

Ninth Embodiment

Figure 43:
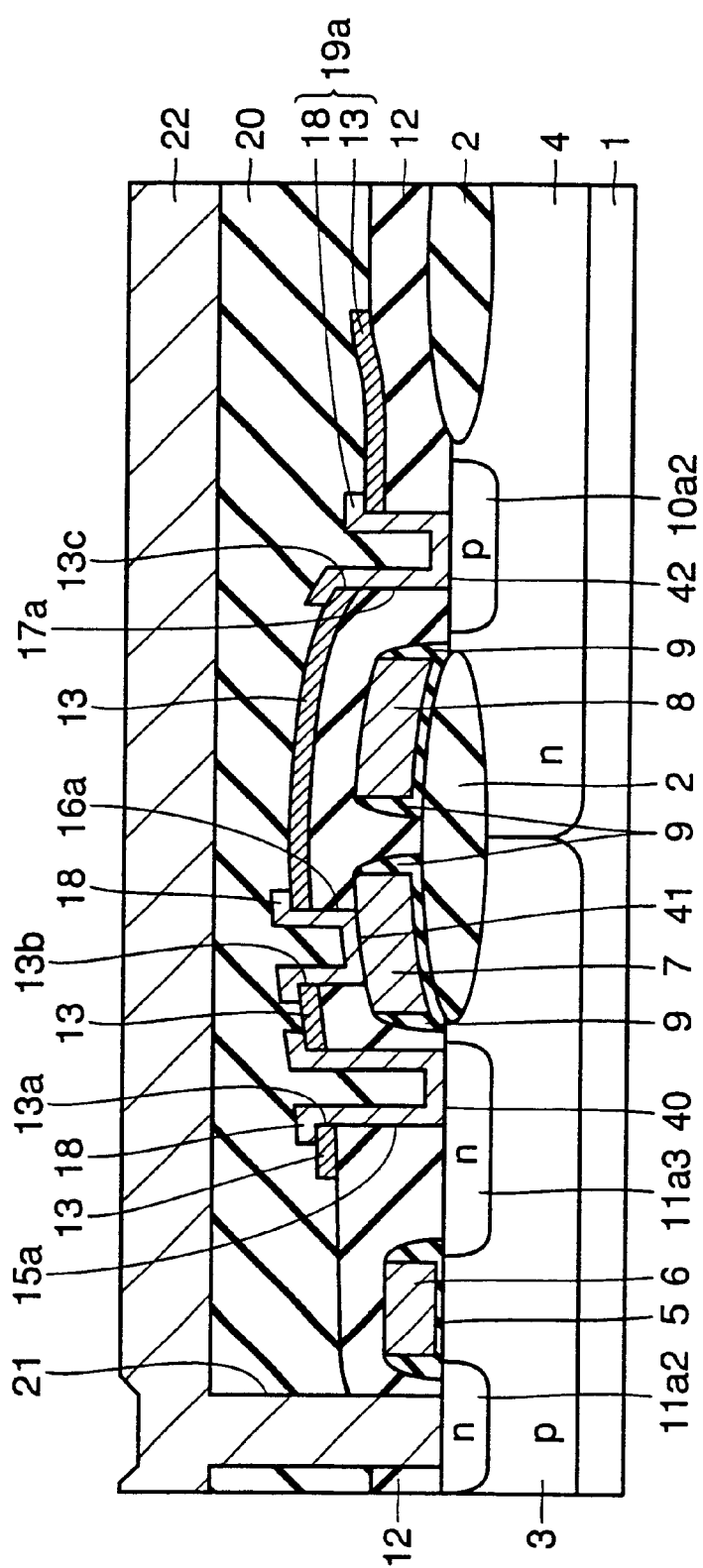
FIG. 43 is a cross section showing an SRAM according to the ninth embodiment of the invention.
Figure 44:
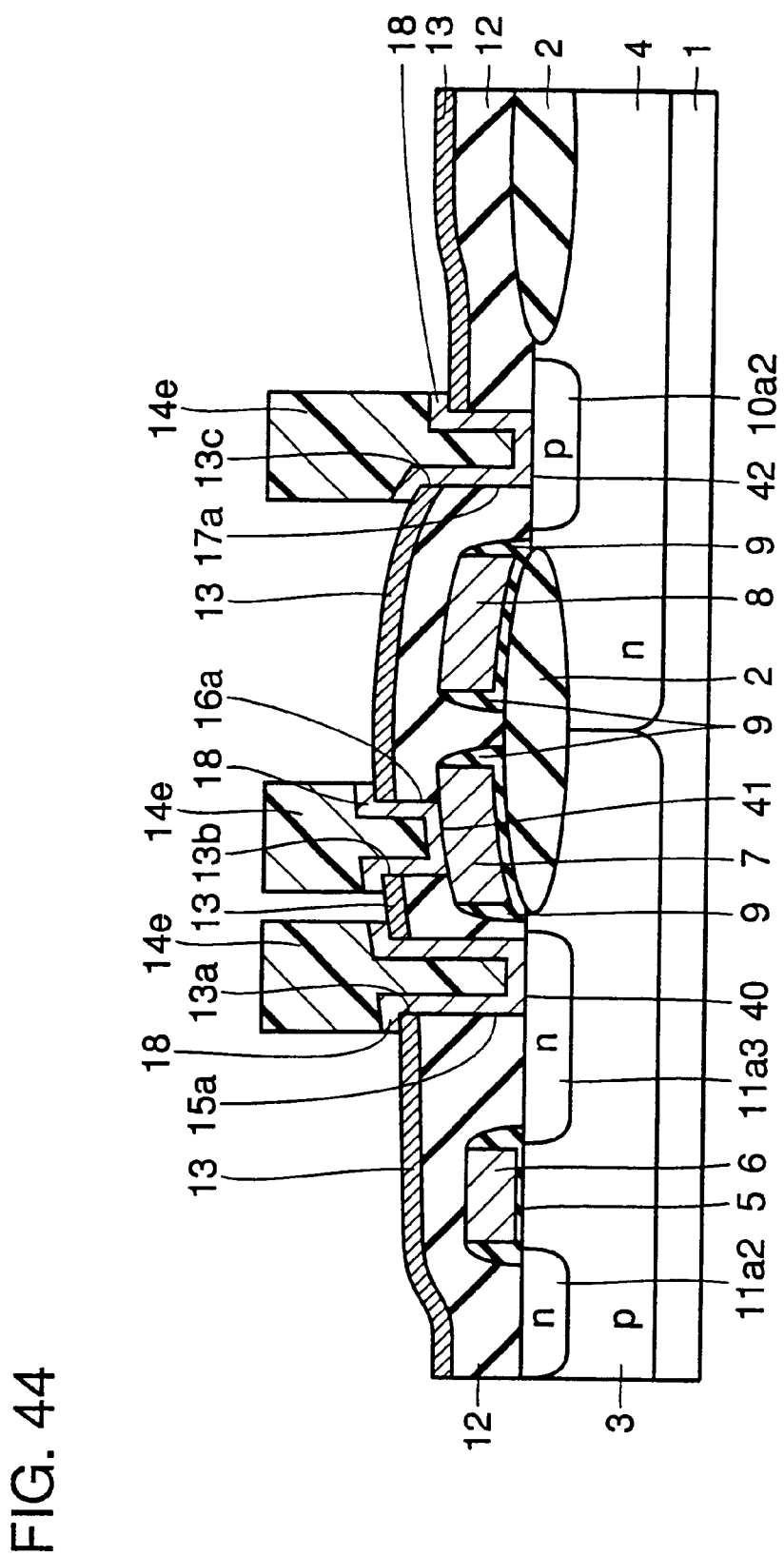
FIGS. 44 and 45 are cross sections showing characteristic first and second steps of a manufacturing process of the SRAM shown in FIG. 43.
Figure 45:
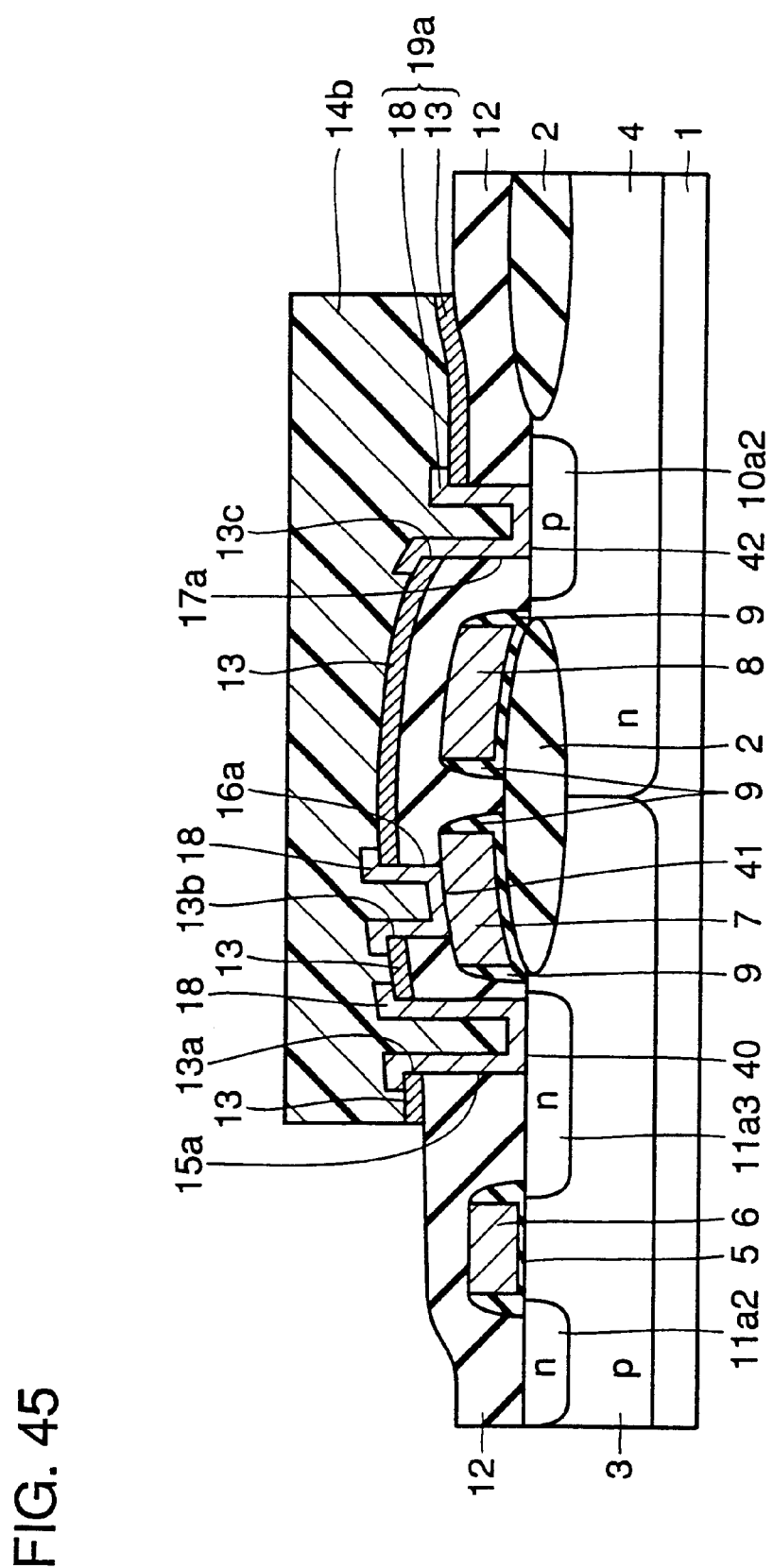

The ninth embodiment of the invention is described using FIGS. 43–45. FIG. 43 is a cross section showing an SRAM according to the ninth embodiment of the invention.

Referring to FIG. 43, according to the ninth embodiment, polycrystal silicon film 18 is divided into a p-type polycrystal silicon portion being in contact with $p^+$ impurity region 10a2, an n-type polycrystal silicon portion being in contact with gate electrode 7, and an n-type polycrystal silicon portion being in contact with $n^+$ impurity region 11a3. Those are electrically connected by metal silicide film 13. Other structures are similar to those according to the first embodiment.

Formation of a pn junction in polycrystal silicon film 18 can be prevented by dividing polycrystal silicon film 18 as above.

A method of manufacturing the SRAM according to the ninth embodiment is described using FIGS. 44 and 45. FIGS. 44 and 45 are cross sections showing the first and second steps which characterize a manufacturing process of the SRAM according to the ninth embodiment.

Referring to FIG. 44, polycrystal silicon film 18 and preceding elements are completed through processes similar to those according to the first embodiment. A resist 14e is applied onto polycrystal silicon film 18 and resist 14e is patterned into a prescribed shape. Using the patterned resist 14e as a mask, polycrystal silicon film 18 is etched. Polycrystal silicon film 18 is thus divided.

Referring to FIG. 45, resist 14b is formed by a method similar to that of the first embodiment, and metal silicide film 13 is patterned using resist 14b as a mask. Local interconnection line 19a is accordingly completed.

The SRAM shown in FIG. 43 is thereafter completed through steps similar to those according to the first embodiment.

Tenth Embodiment

Figure 46:
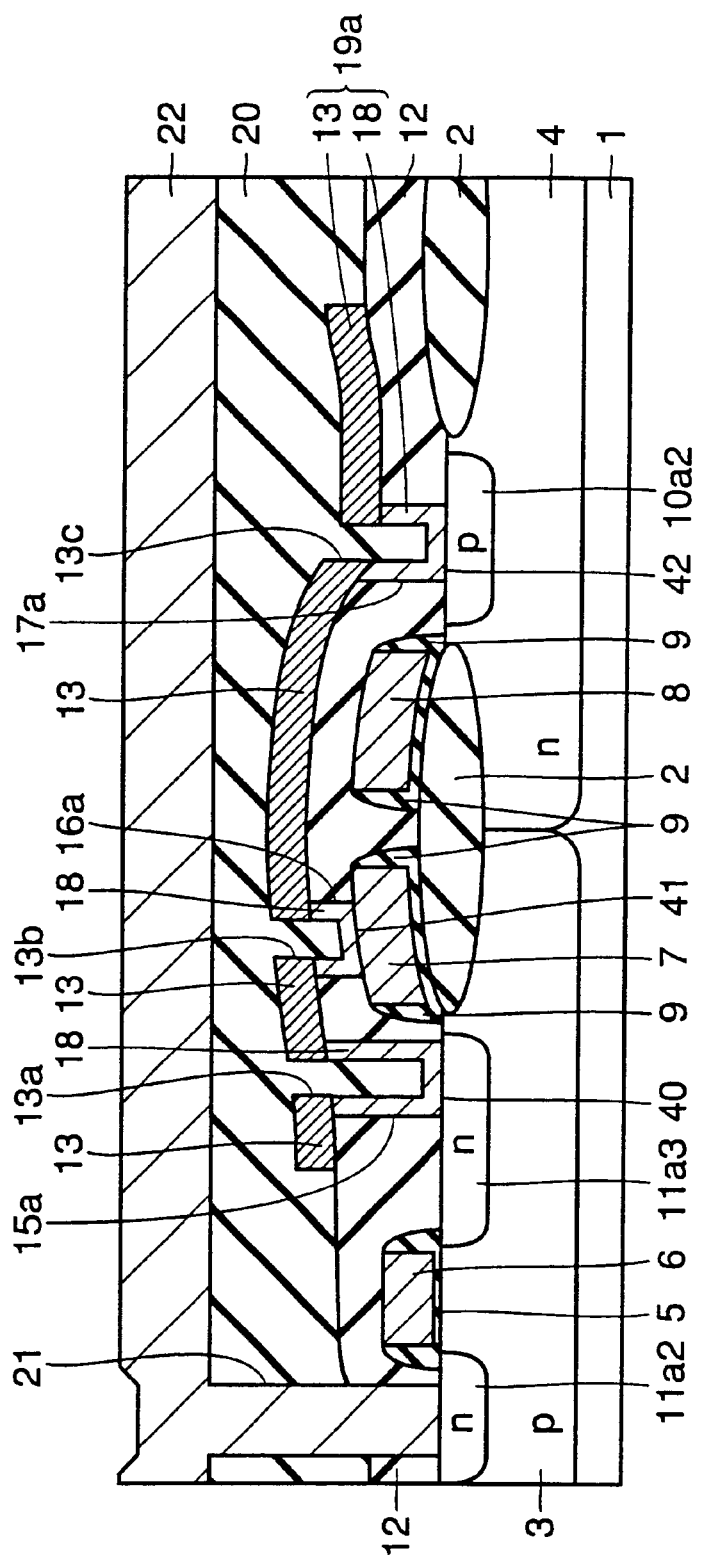
FIG. 46 is a cross section showing an SRAM according to the tenth embodiment of the invention.
Figure 47:
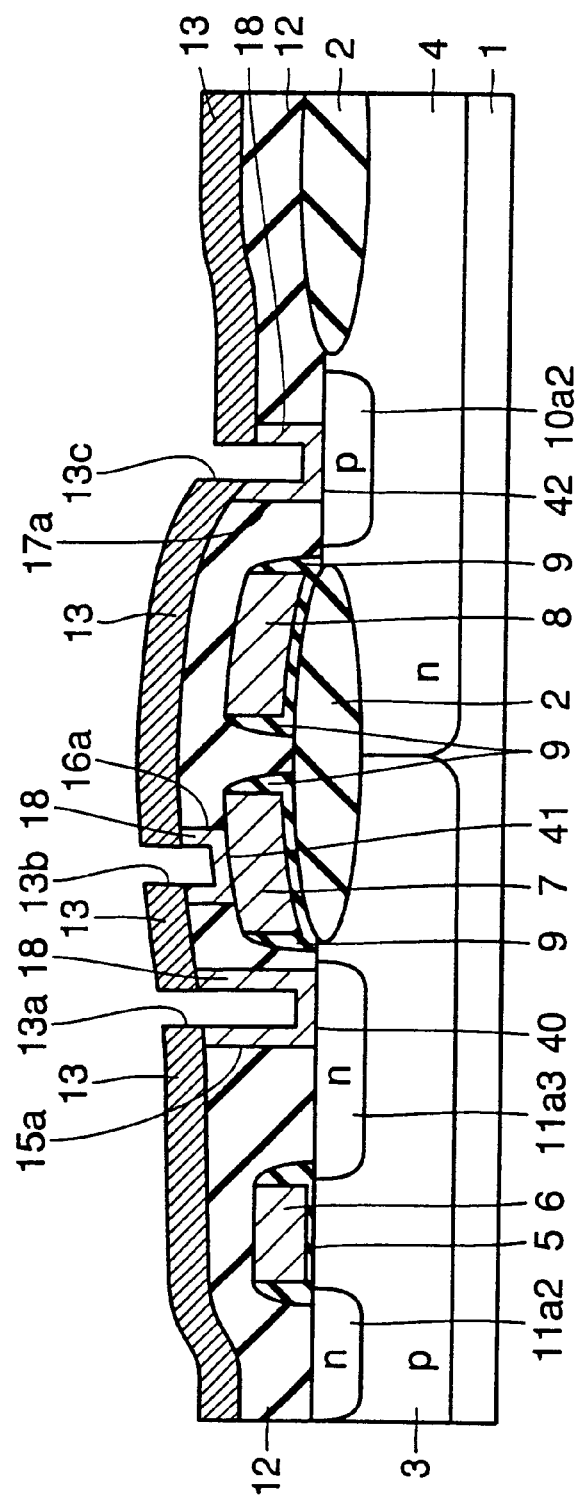
FIG. 47 is a cross section showing a characteristic manufacturing step of the SRAM shown in FIG. 46.

The tenth embodiment of the present invention is described using FIGS. 46 and 47. FIG. 46 shows a cross section of an SRAM according to the tenth embodiment of the invention.

Referring to FIG. 46, polycrystal silicon film 18 is formed only in contact holes 15a, 16a and 17a, and metal silicide film 13 is formed to extend from an upper end of polycrystal silicon film 18 onto interlayer insulating film 12. Other structures are similar to those according to the first embodiment.

Formation of a pn junction in polycrystal silicon film 18 can be avoided as in the case of the ninth embodiment by connecting polycrystal silicon film 18 using metal silicide film 13 as described above.

A method of manufacturing the SRAM according to the tenth embodiment is next described using FIG. 47. FIG. 47 shows a cross section illustrating a characteristic manufacturing step of the SRAM according to the tenth embodiment.

Referring to FIG. 47, polycrystal silicon film 18 and preceding elements are completed through steps similar to those according to the first embodiment. An annealing step such as the RTA is used for silicidation of polycrystal silicon film 18 located on interlayer insulating film 12. Consequently, polycrystal silicon film 18 can be left only in contact holes 15a–17a, and metal silicide film 13 electrically connecting those portions remaining in the holes can be formed on interlayer insulating film 12.

The RTA step described above may be carried out after a selective formation of a metal film on polycrystal silicon film 18 shown in FIG. 4. The RTA step may be carried out while metal silicide film 13 is in a metal-rich state.

After metal silicide film 13 is formed as described above, the SRAM shown in FIG. 46 is completed through steps similar to those according to the first embodiment.

Eleventh Embodiment

The eleventh embodiment of the invention is described next.

According to the eleventh embodiment, metal silicide film 13 is formed by silicidation of polycrystal silicon films 18 and 23 shown in FIG. 10. Therefore, metal silicide film 13 having a thickness larger than that according to the tenth embodiment is formed. The other structures are similar to those shown in FIG. 46. The increased thickness of metal silicide film 13 contributes to reduction of resistance of local interconnection line 24a and further makes it possible to eliminate a disadvantage caused by reduction of the thickness of metal silicide film 13.

A method of manufacturing the SRAM according to the eleventh embodiment is described.

Polycrystal silicon film 18 and preceding elements shown in FIG. 10 are formed through processes similar to those according to the second embodiment. Silicidation of polycrystal silicon films 18 and 23 located on interlayer insulating film 12 is carried out by a method similar to that according to the tenth embodiment. The SRAM is thereafter completed through steps similar to those according to the second embodiment.

Twelfth Embodiment

Figure 48:
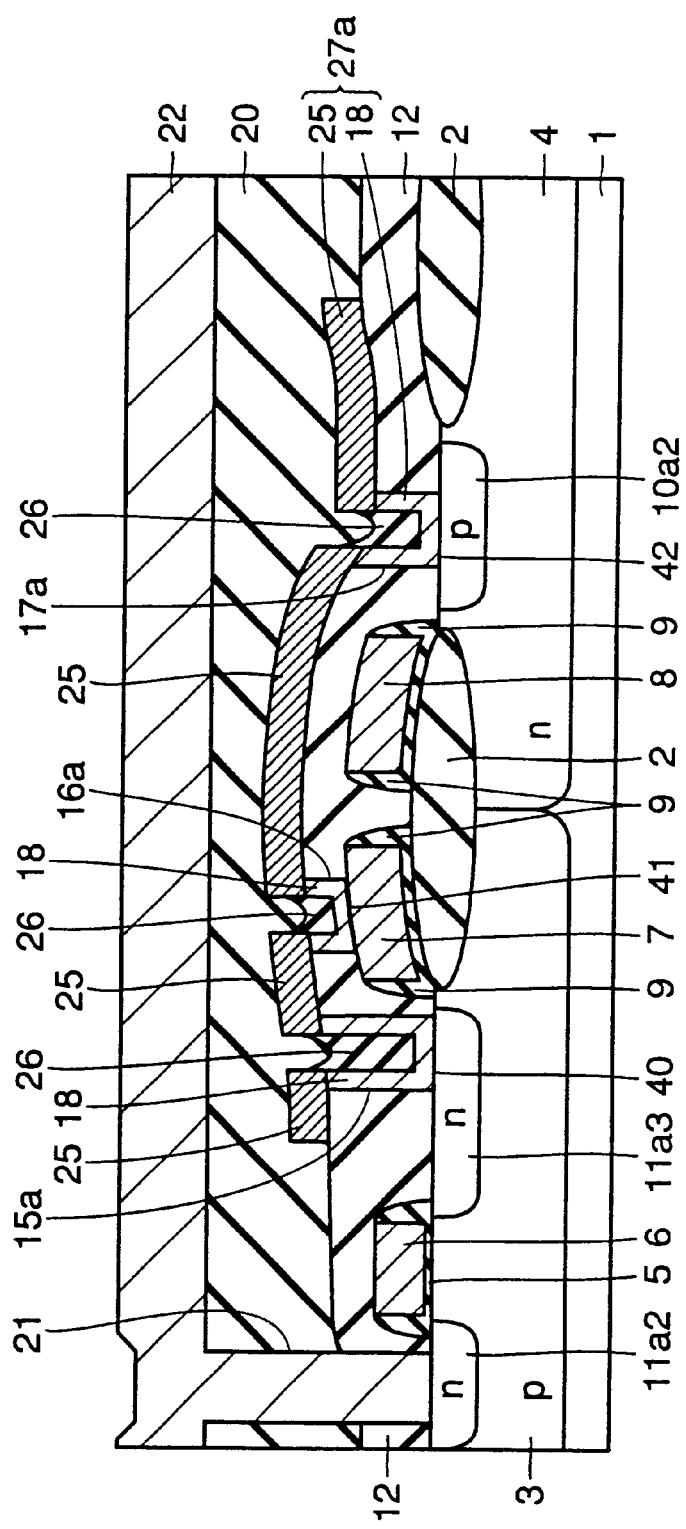
FIG. 48 is a cross section showing an SRAM according to the twelfth embodiment of the invention.
Figure 49:
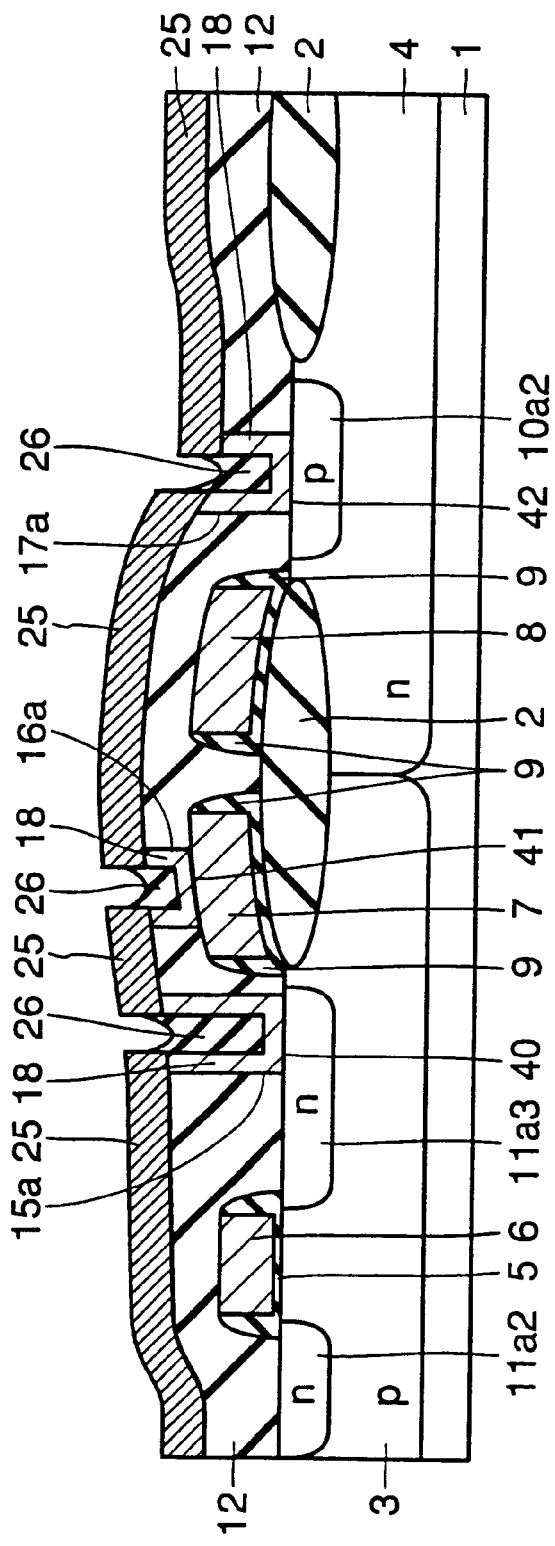
FIG. 49 is a cross section showing a characteristic manufacturing step of the SRAM shown in FIG. 48.

The twelfth embodiment of the invention is next described using FIGS. 48 and 49. FIG. 48 shows a cross section illustrating an SRAM according to the twelfth embodiment of the invention.

Referring to FIG. 48, polycrystal silicon film 18 located on interlayer insulating film 12 shown in FIG. 13 is totally changed to a metal silicide film 25. Other structures are similar to those according to the third embodiment shown in FIG. 13.

A method of manufacturing the SRAM according to the twelfth embodiment is next described using FIG. 49. FIG. 49 is a cross section showing a characteristic manufacturing step of the SRAM according to the twelfth embodiment.

Referring to FIG. 49, insulating film 26 and preceding components are completed through steps similar to those according to the third embodiment. A metal film (not shown) is formed on polycrystal silicon film 18 shown in FIG. 16, and an annealing step such as the RTA or the like is applied to the metal film. Polycrystal silicon film 18 located on interlayer insulating film 12 shown in FIG. 16 is totally silicided. Consequently, metal silicide film 25 is formed as shown in FIG. 49. The SRAM shown in FIG. 48 is thereafter completed through steps similar to those according to the third embodiment.

Thirteenth Embodiment

Figure 50:
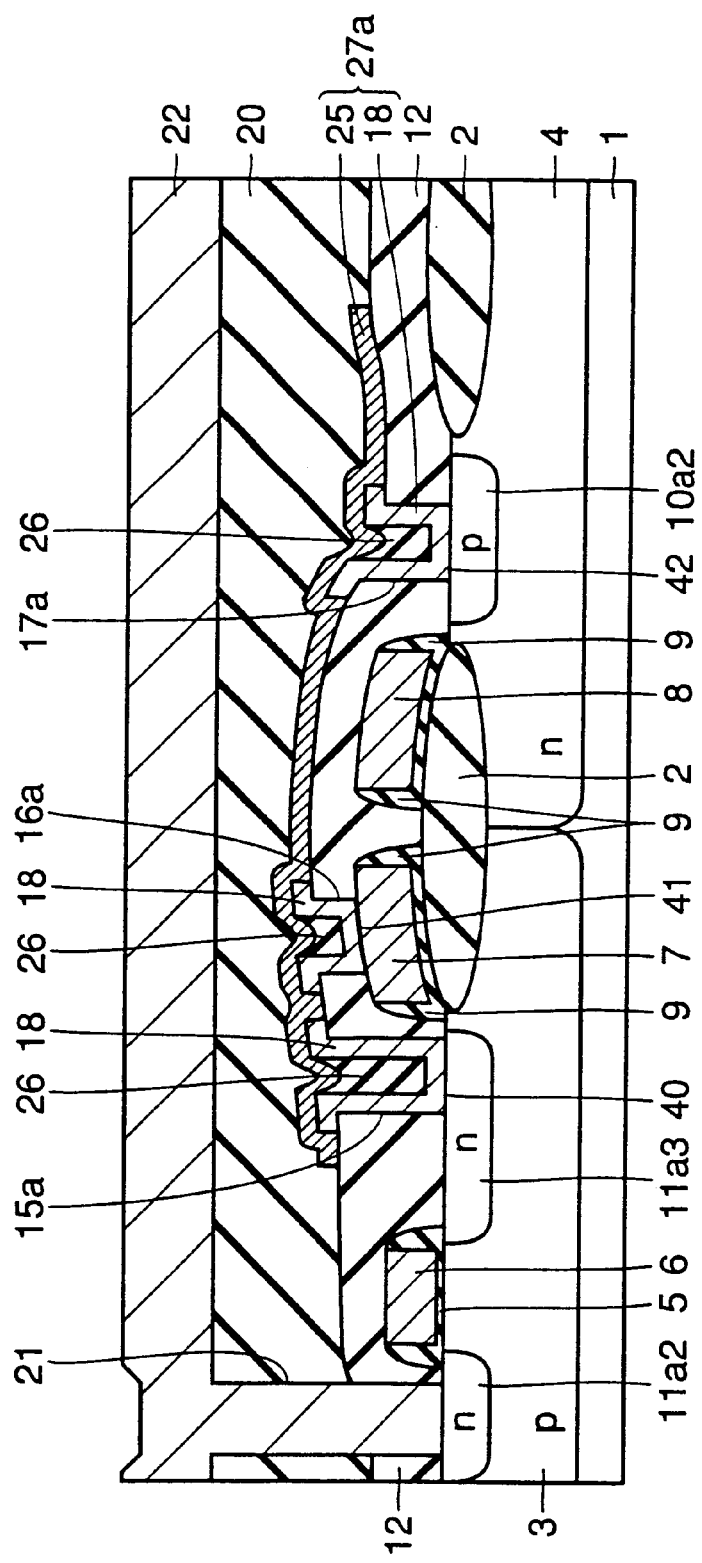
FIG. 50 is a cross section showing an SRAM according to the thirteenth embodiment of the invention.
Figure 51:
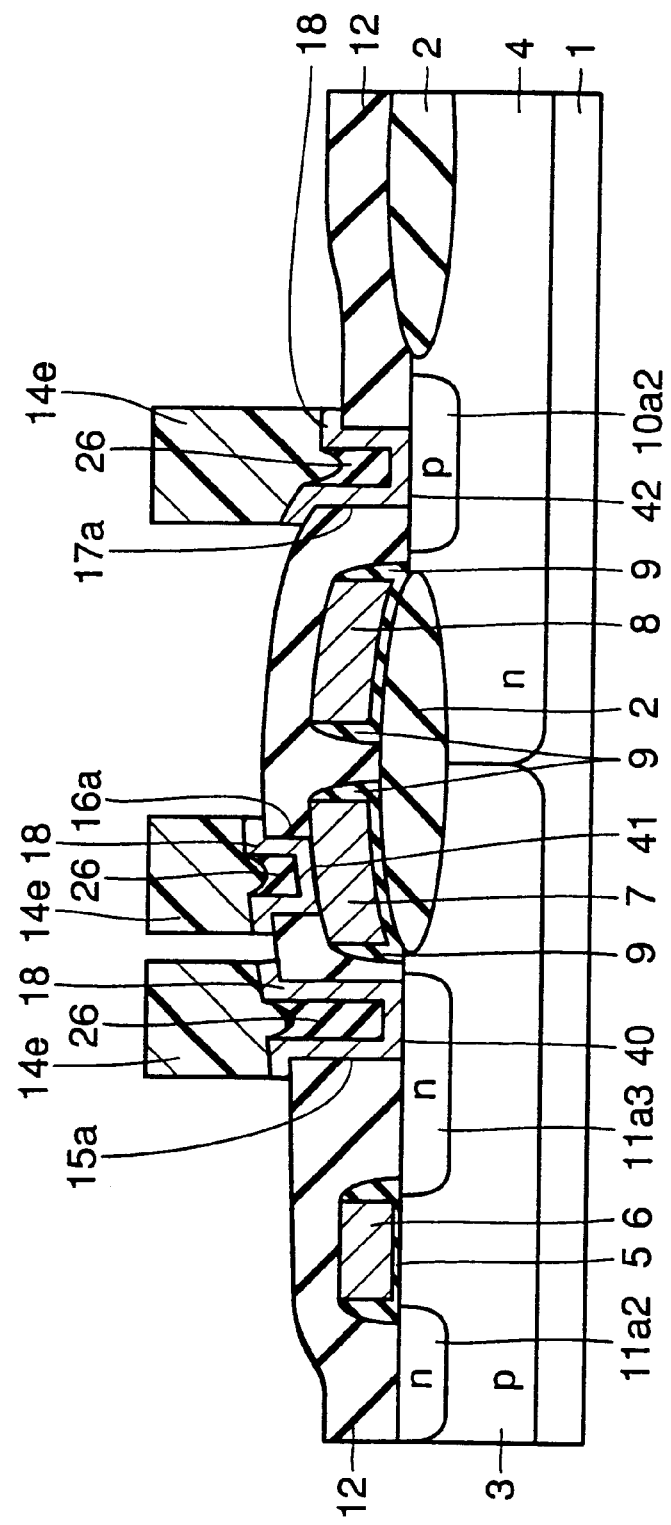
FIGS. 51 and 52 are cross sections showing characteristic first and second steps of a manufacturing process of the SRAM shown in FIG. 50.
Figure 52:
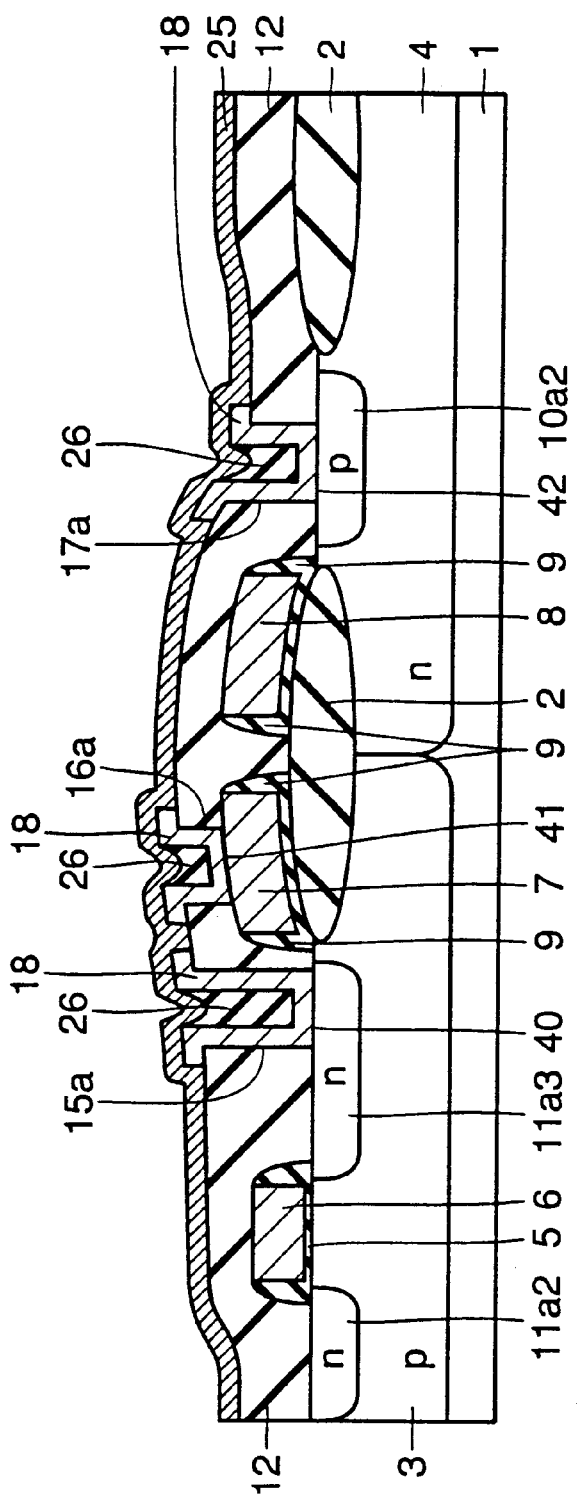

The thirteenth embodiment of the present invention is next described using FIGS. 50–52. FIG. 50 is a cross sectional view showing an SRAM according to the thirteenth embodiment of the invention.

Referring to FIG. 50, according to the thirteenth embodiment, polycrystal silicon film 18 is divided as done in the ninth embodiment, and insulating film 26 is formed on the divided polycrystal silicon films 18. Metal silicide film 25 is formed on insulating film 26 to extend onto interlayer insulating film 12. Other structures are similar to those according to the third embodiment.

A method of manufacturing the SRAM according to the thirteenth embodiment is described using FIGS. 51 and 52. FIGS. 51 and 52 show cross sections respectively showing the first and the second steps that characterize a manufacturing process of the SRAM according to the thirteenth embodiment.

Referring to FIG. 51, insulating film 26 and preceding components shown in FIG. 16 are formed through steps similar to those according to the fourth embodiment. Resist 14e is formed by a method similar to that of the ninth embodiment. Polycrystal silicon film 18 is patterned using resist 14e as a mask.

Metal silicide film 25 is deposited on the entire surface as shown in FIG. 52 using the sputtering method, the CVD method or the like. The SRAM shown in FIG. 50 is thereafter completed through steps similar to those according to the fourth embodiment.

Fourteenth Embodiment

Figure 53:
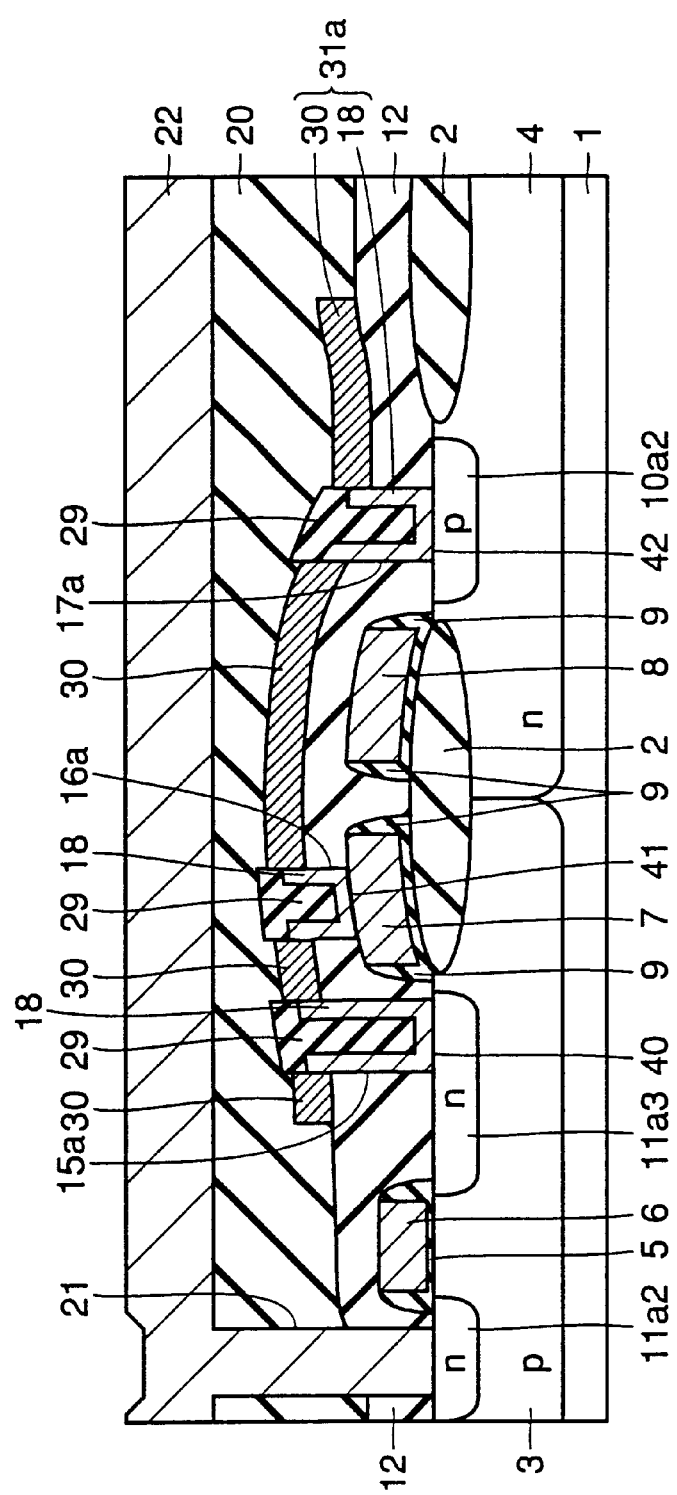
FIG. 53 is a cross section showing an SRAM according to the fourteenth embodiment of the invention.
Figure 54:
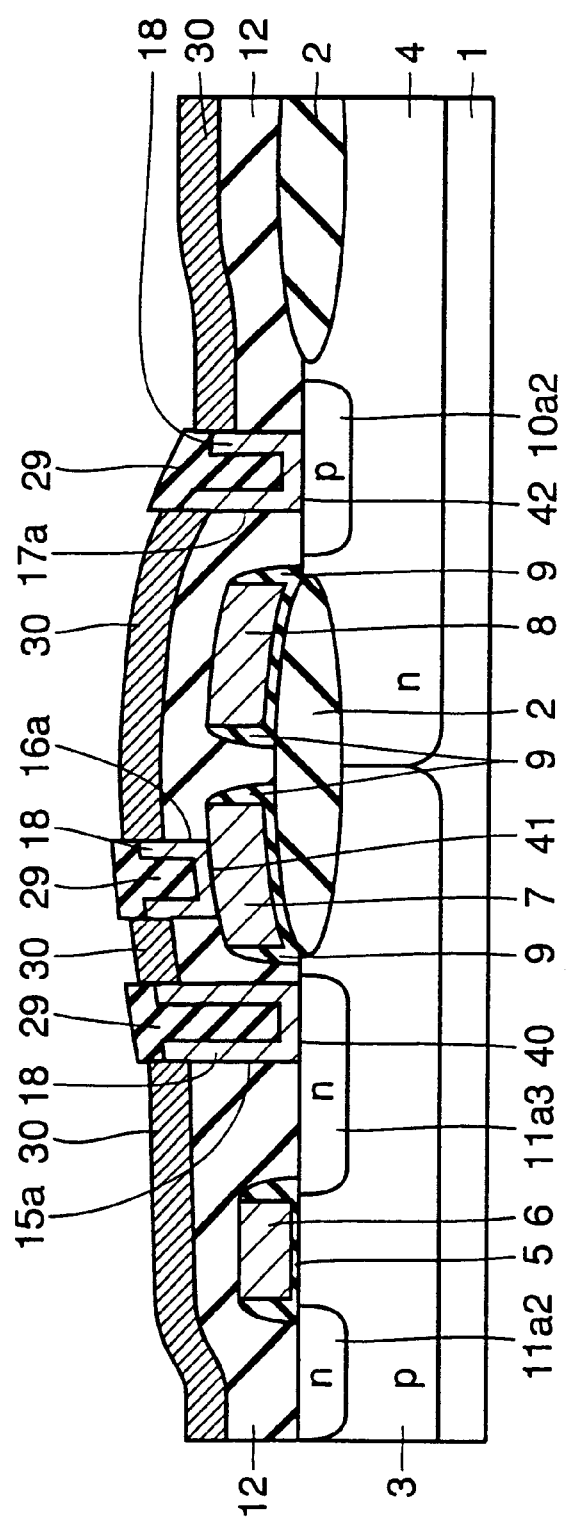
FIG. 54 is a cross section showing a characteristic manufacturing step of the SRAM shown in FIG. 53.

The fourteenth embodiment of the invention is next described using FIGS. 53 and 54. FIG. 53 is a cross section showing an SRAM according to the fourteenth embodiment of the invention.

Referring to FIG. 53, local interconnection line 31a located on interlayer insulating film 12 is entirely silicided according to the fourteenth embodiment. Other structures are similar to those according to the fifth embodiment shown in FIG. 24.

A method of fabricating the SRAM according to the fourteenth embodiment is described using FIG. 54. FIG. 54 is a cross section showing a characteristic manufacturing step of the SRAM according to the fourteenth embodiment.

Referring to FIG. 54, insulating film 29 and preceding elements are formed through steps similar to those according to the fifth embodiment. After a metal film (not shown) is deposited on the entire surface, the surface undergoes an annealing step such as the RTA. As a result, polycrystal silicon film 18 located on interlayer insulating film 12 is entirely silicided. Metal silicide film 30 shown in FIG. 54 is thus formed. The SRAM shown in FIG. 53 is thereafter completed after steps similar to those according to the fifth embodiment.

Fifteenth Embodiment

Figure 55:
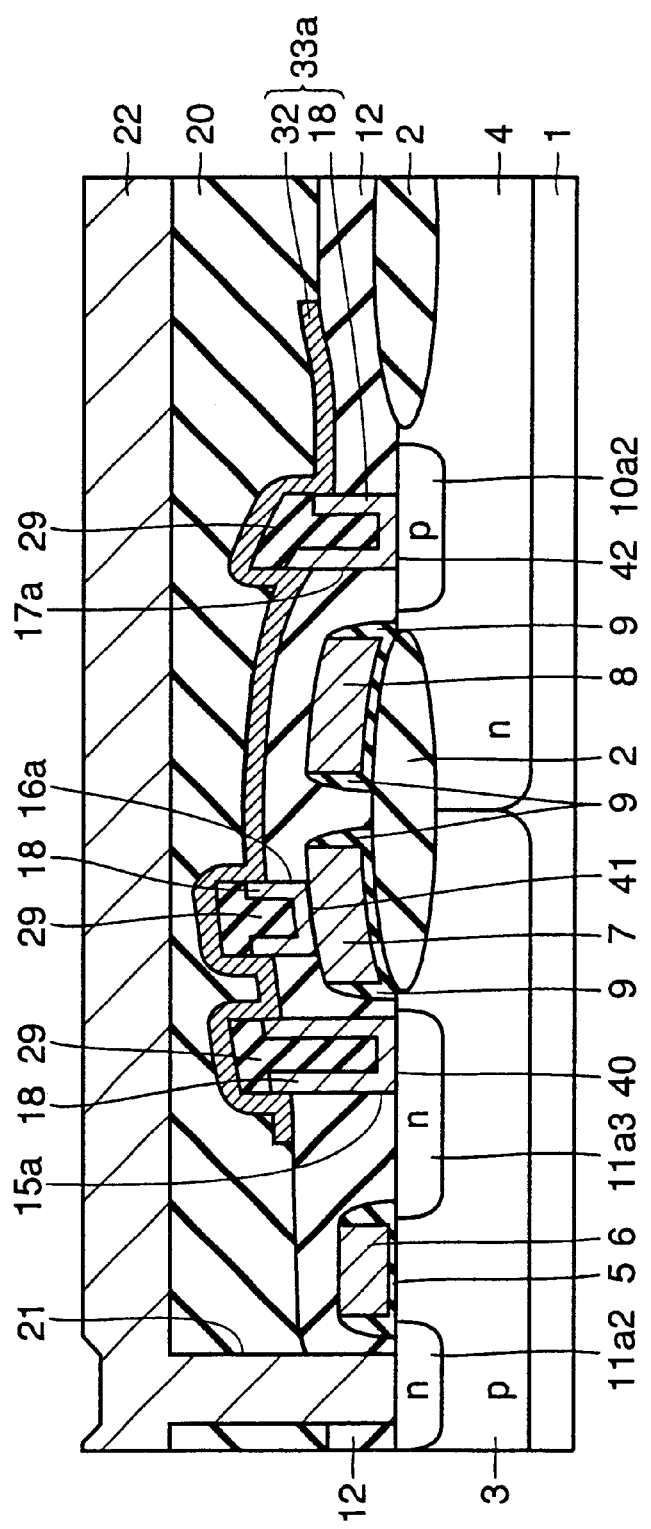
FIG. 55 is a cross section showing an SRAM according to the fifteenth embodiment of the invention.
Figure 56:
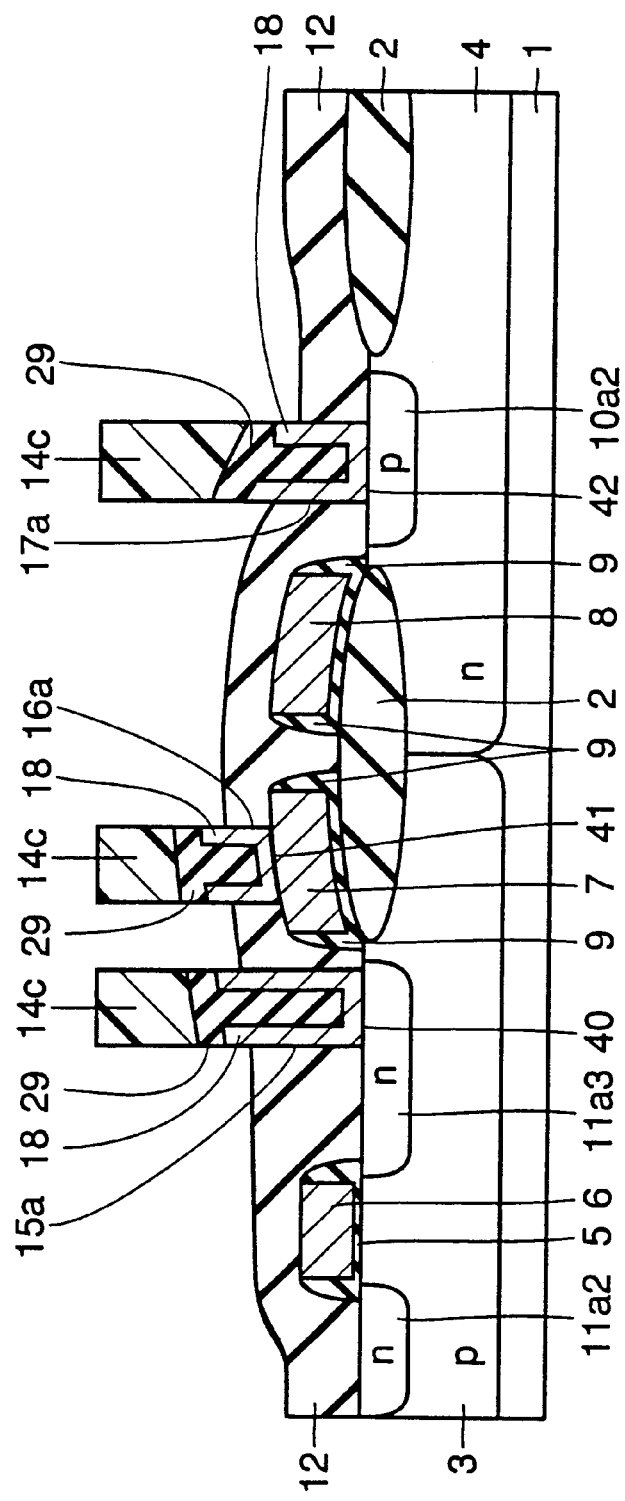
FIGS. 56 and 57 are cross sections showing characteristic first and second steps of a manufacturing process of the SRAM shown in FIG. 55.
Figure 57:
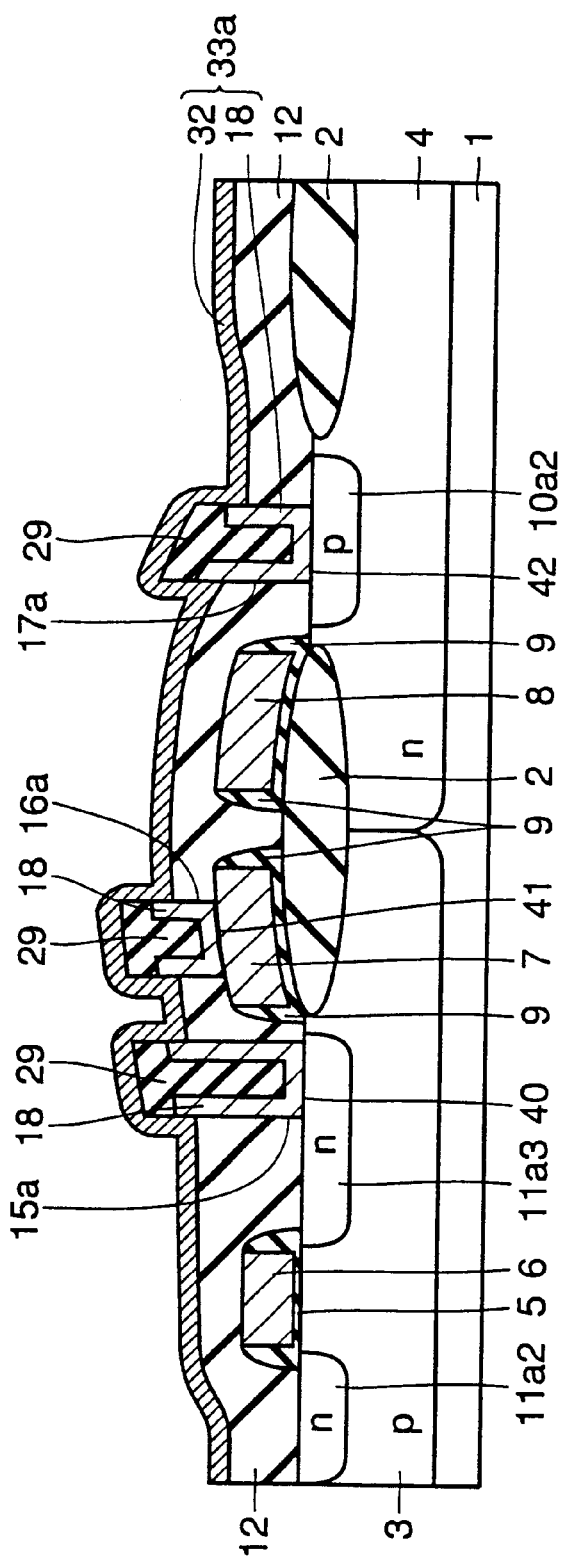

The fifteenth embodiment of the invention is described using FIGS. 55–57. FIG. 55 shows a cross section illustrating an SRAM according to the fifteenth embodiment of the invention.

Referring to FIG. 55, according to the fifteenth embodiment, polycrystal silicon film 18 is divided and only metal silicide film 32 extends on interlayer insulating film 12. Other structures are similar to those of the SRAM according to the sixth embodiment shown in FIG. 29.

A method of manufacturing the SRAM of the fifteenth embodiment is described using FIGS. 56 and 57. FIGS. 56 and 57 are cross sections respectively showing the first and the second steps that characterize a manufacturing process of the SRAM of the fifteenth embodiment.

Referring to FIG. 56, insulating film 29 and preceding elements are formed through steps similar to those of the sixth embodiment, and polycrystal silicon film 18 is thereafter etched. Polycrystal silicon film 18 located on interlayer insulating film 12 is accordingly removed.

Referring to FIG. 57, metal silicide film 32 is deposited on the entire surface by the CVD method, the sputtering method or the like. The SRAM shown in FIG. 55 is thereafter completed through steps similar to those according to the sixth embodiment.

Sixteenth Embodiment

Figure 58:
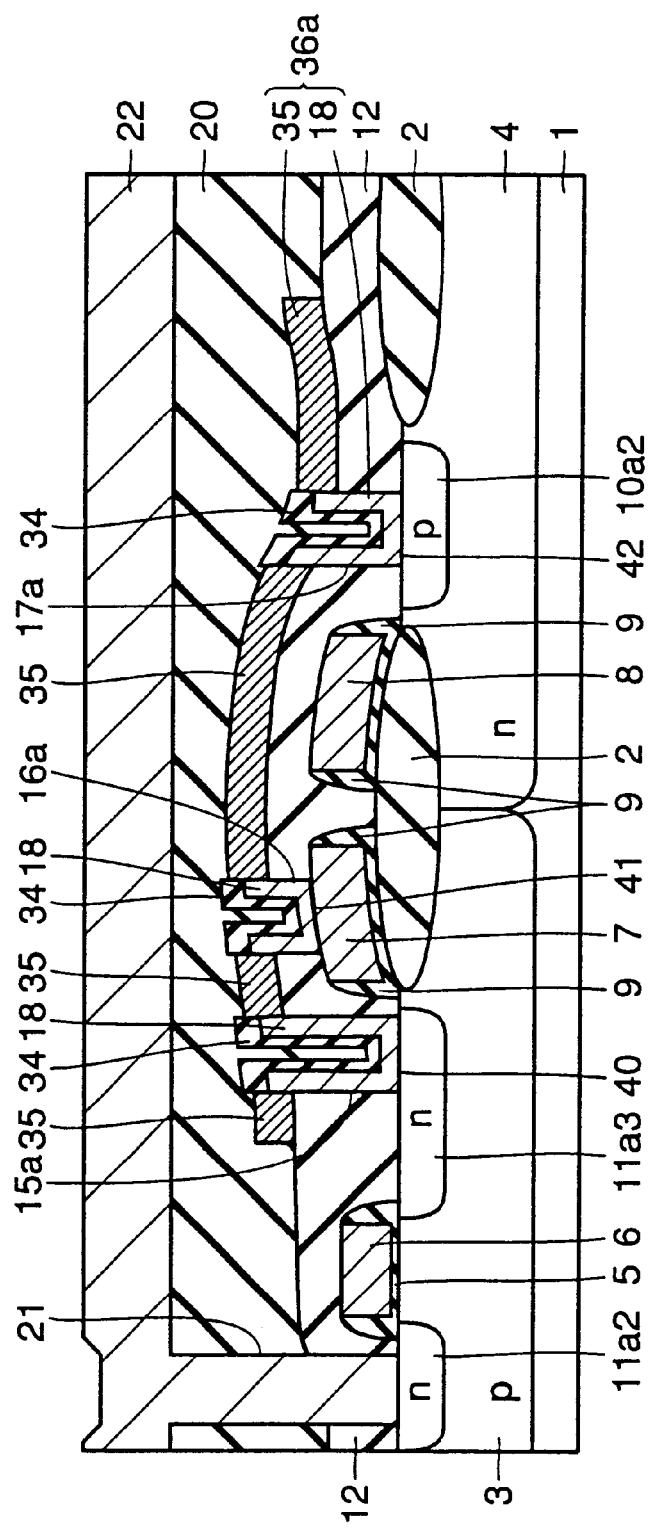
FIG. 58 is a cross sectional view showing an SRAM according to the sixteenth embodiment of the invention.
Figure 59:
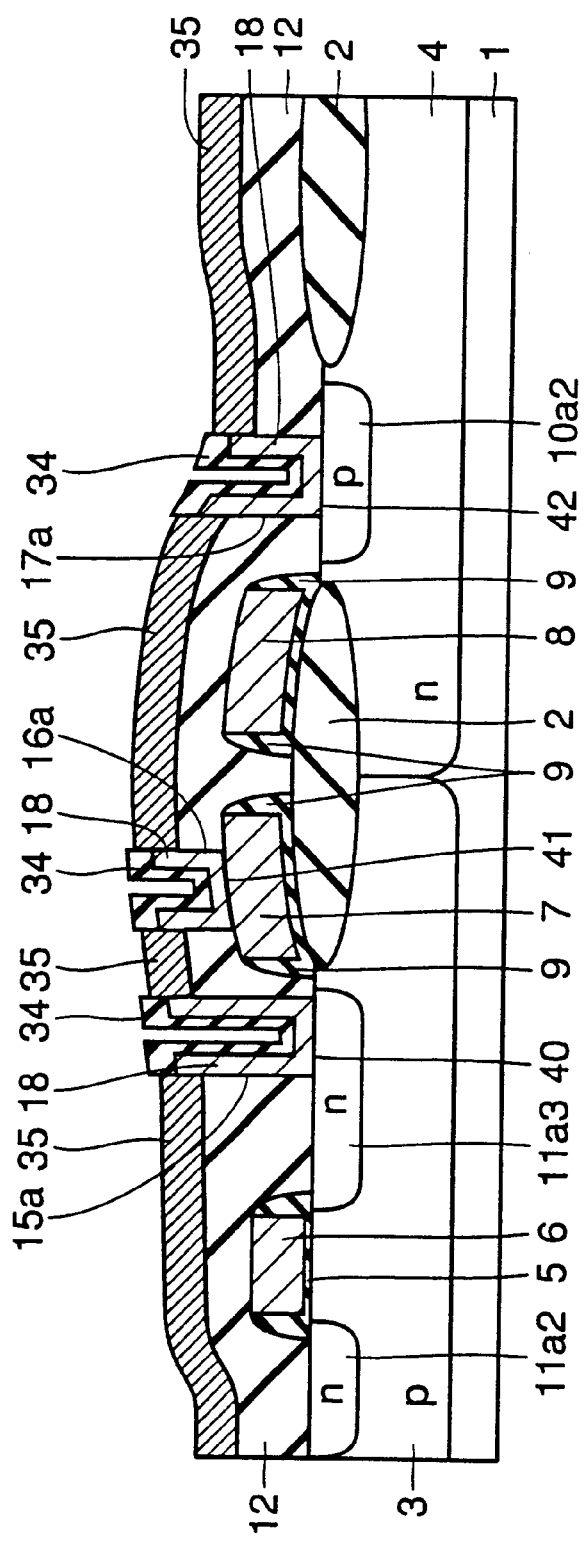
FIG. 59 is a cross sectional view showing a characteristic manufacturing step of the SRAM shown in FIG. 58.

The sixteenth embodiment of the present invention is described using FIGS. 58 and 59. FIG. 58 is a cross section showing an SRAM according to the sixteenth embodiment of the invention.

Referring to FIG. 58, polycrystal silicon film 18 is divided and only metal silicide film 35 extends on interlayer insulating film 12. Other structures are similar to those of the SRAM according to the seventh embodiment shown in FIG. 33.

A fabrication method of the SRAM according to the sixteenth embodiment is next described using FIG. 59. FIG. 59 is a cross section showing a manufacturing step which characterizes the SRAM according to the sixteenth embodiment.

Referring to FIG. 59, insulating film 34 and preceding elements are formed through steps similar to those according to the seventh embodiment. A metal film (not shown) is formed on polycrystal silicon film 18 shown in FIG. 35, and an annealing process such as the RTA is applied to the metal film. Polycrystal silicon film 18 located on interlayer insulating film 12 is entirely silicided. The SRAM shown in FIG. 58 is thereafter completed through steps similar to those according to the seventh embodiment.

Seventeenth Embodiment

Figure 60:
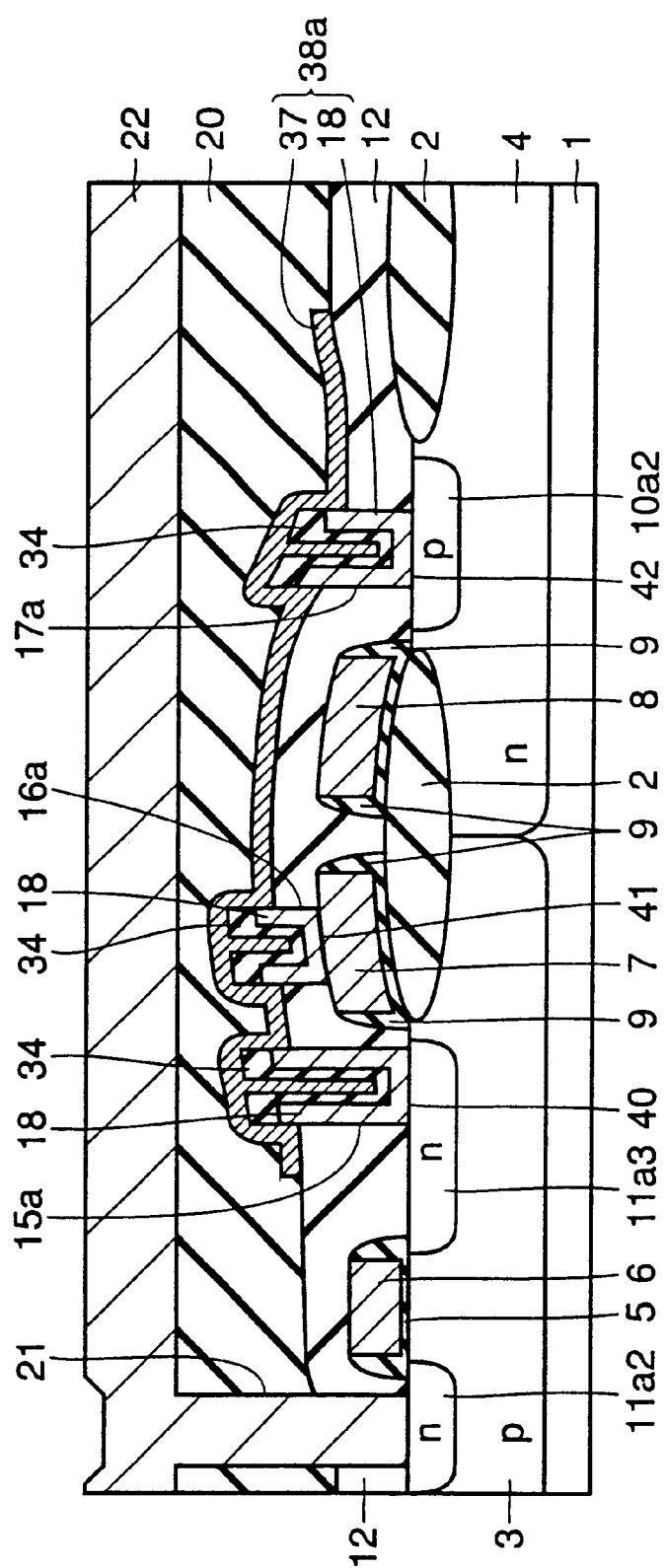
FIG. 60 is a cross section showing an SRAM according to the seventeenth embodiment of the invention.
Figure 61:
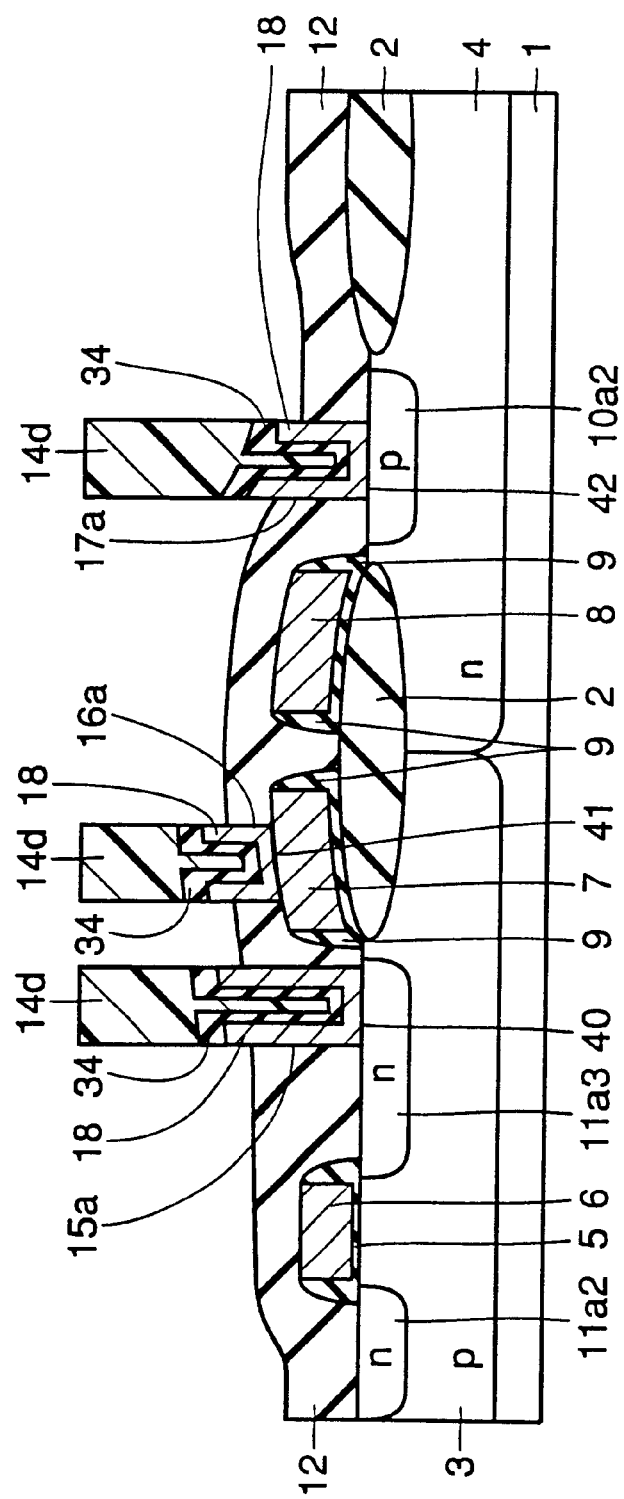
FIGS. 61 and 62 are cross sections showing characteristic first and second steps of a manufacturing process of the SRAM shown in FIG. 60.
Figure 62:
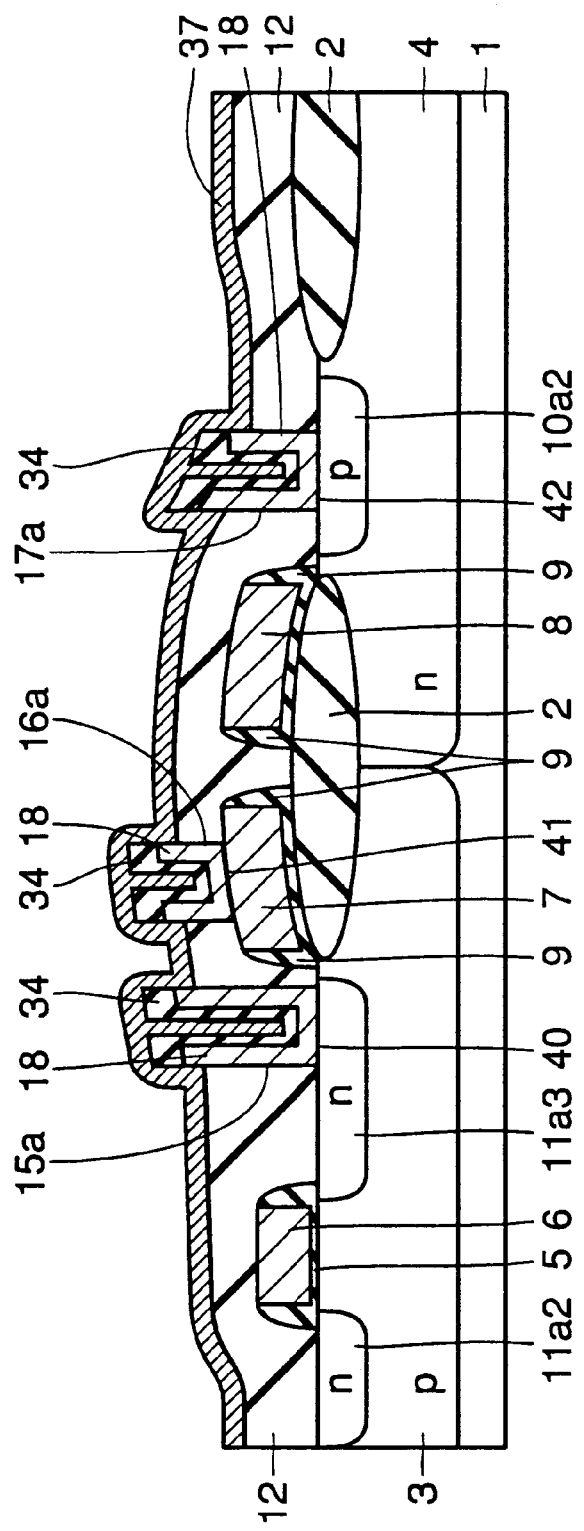

The seventeenth embodiment of the present invention is described using FIGS. 60–62. FIG. 60 is a cross section showing an SRAM according to the seventeenth embodiment of the invention.

Referring to FIG. 60, polycrystal silicon film 18 is divided and only metal silicide film 37 extends on interlayer insulating film 12 according to the seventeenth embodiment. Other structures are similar to those of the SRAM according to the eighth embodiment shown in FIG. 39.

A method of manufacturing the SRAM shown in FIG. 60 according to the seventeenth embodiment is described using FIGS. 61 and 62. FIGS. 61 and 62 are cross sections showing the first and the second steps respectively which characterize a manufacturing process of the SRAM of the seventeenth embodiment.

Referring to FIG. 61, insulating film 34 and preceding elements are formed through steps similar to those according to the seventh embodiment, and polycrystal silicon film 18 is thereafter patterned.

Resist 14d is removed and metal silicide film 37 is deposited on the entire surface using the CVD method, the sputtering method or the like. The SRAM shown in FIG. 60 is thereafter completed through steps similar to those of the eighth embodiment.

Eighteenth Embodiment

Figure 63:
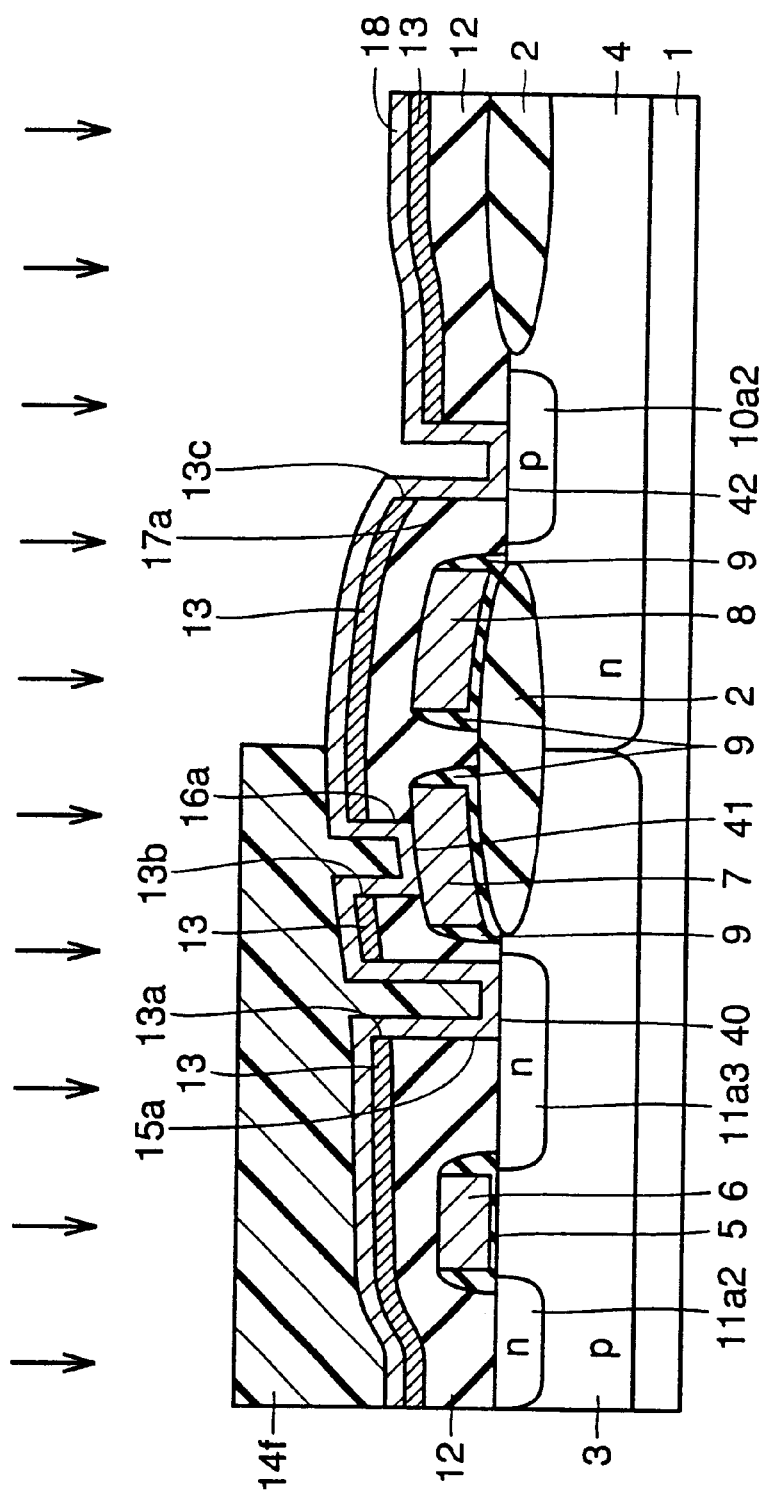
FIGS. 63 and 64 are cross sections showing characteristic first and second steps of a manufacturing process of an SRAM according to the eighteenth embodiment of the invention.
Figure 64:
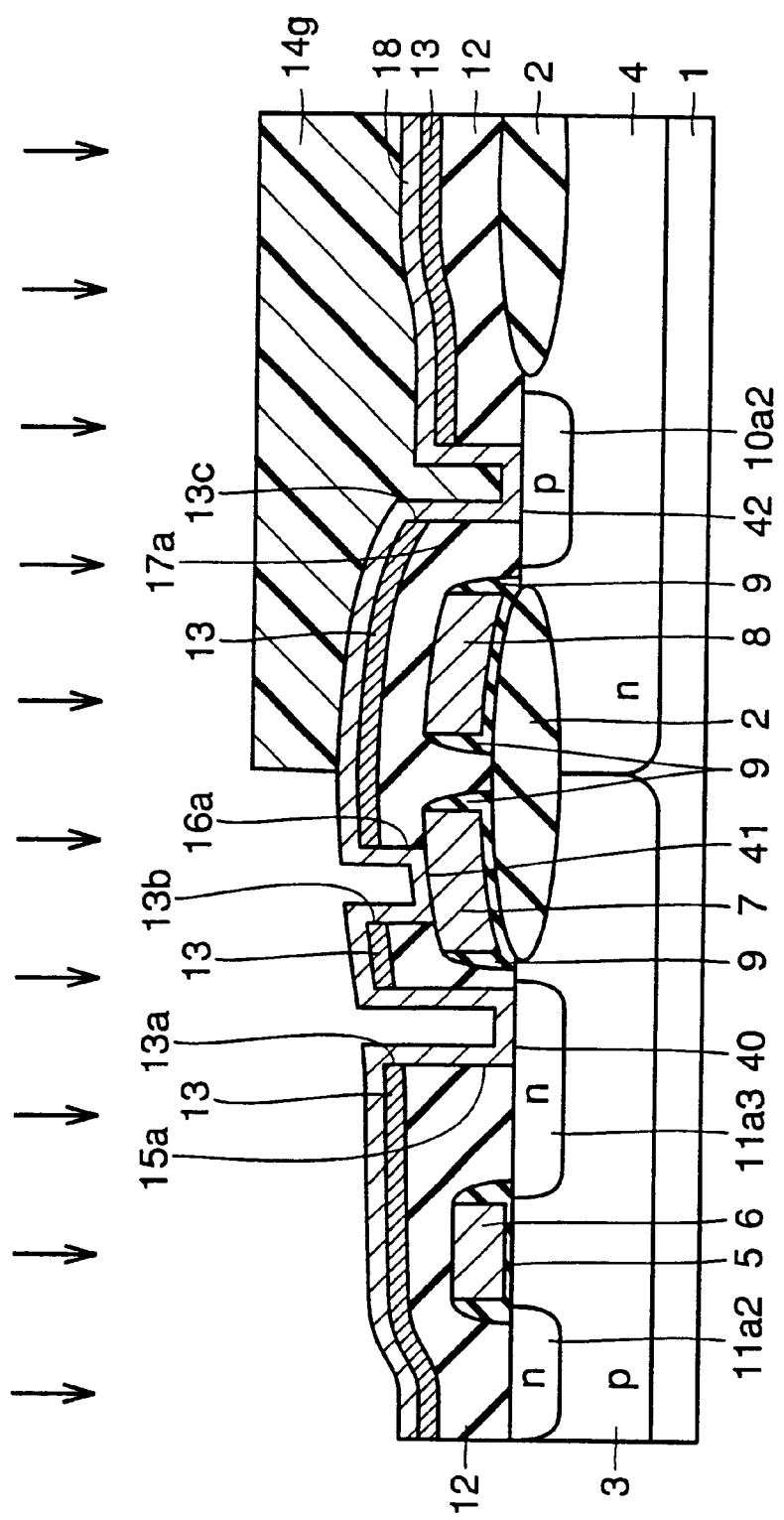

The eighteenth embodiment of the present invention is described using FIGS. 63 and 64. FIGS. 63 and 64 are cross sections respectively showing the first step and the second step that characterize a manufacturing process of an SRAM of the eighteenth embodiment.

According to each embodiment described above, non-doped polycrystal silicon film 18 is deposited, and the conductivity of polycrystal silicon film 18 is improved by diffusion of impurities from $p^+$ impurity region 10a2 or the like into polycrystal silicon film 18. On the other hand, according to the eighteenth embodiment as well as the nineteenth and the twentieth embodiment described later, p-type impurities are introduced into polycrystal silicon film 18 which is in contact with $p^+$ impurity region 10a2, and n-type impurities are injected into polycrystal silicon film 18 which is in contact with $n^+$ impurity region 11a3 as well as gate electrode 7. As a result, the density of a p-type polycrystal silicon portion and of an n-type polycrystal silicon portion can be increased compared with each embodiment described above, and the resistance of those portions can be reduced.

Referring to FIG. 63, polycrystal silicon film 18 and preceding elements are formed through steps similar to those according to the first, the ninth or the tenth embodiment. A resist 14f is applied onto polycrystal silicon film 18 and resist 14f is patterned. As a result, a resist 14f which covers contact holes 15a and 16a is formed. P-type impurities are injected into polycrystal silicon film 18 using resist 14f as a mask. Accordingly, the p-type polycrystal silicon portion is formed.

After resist 14f is removed, a resist 14g is formed to cover contact hole 17a. N-type impurities are injected into polycrystal silicon film 18 using resist 14g as a mask. The n-type polycrystal silicon portion is thus formed. The SRAM of the eighteenth embodiment is thereafter completed through steps similar to those according to the first, the ninth or the tenth embodiment.

Nineteenth Embodiment

Figure 65:
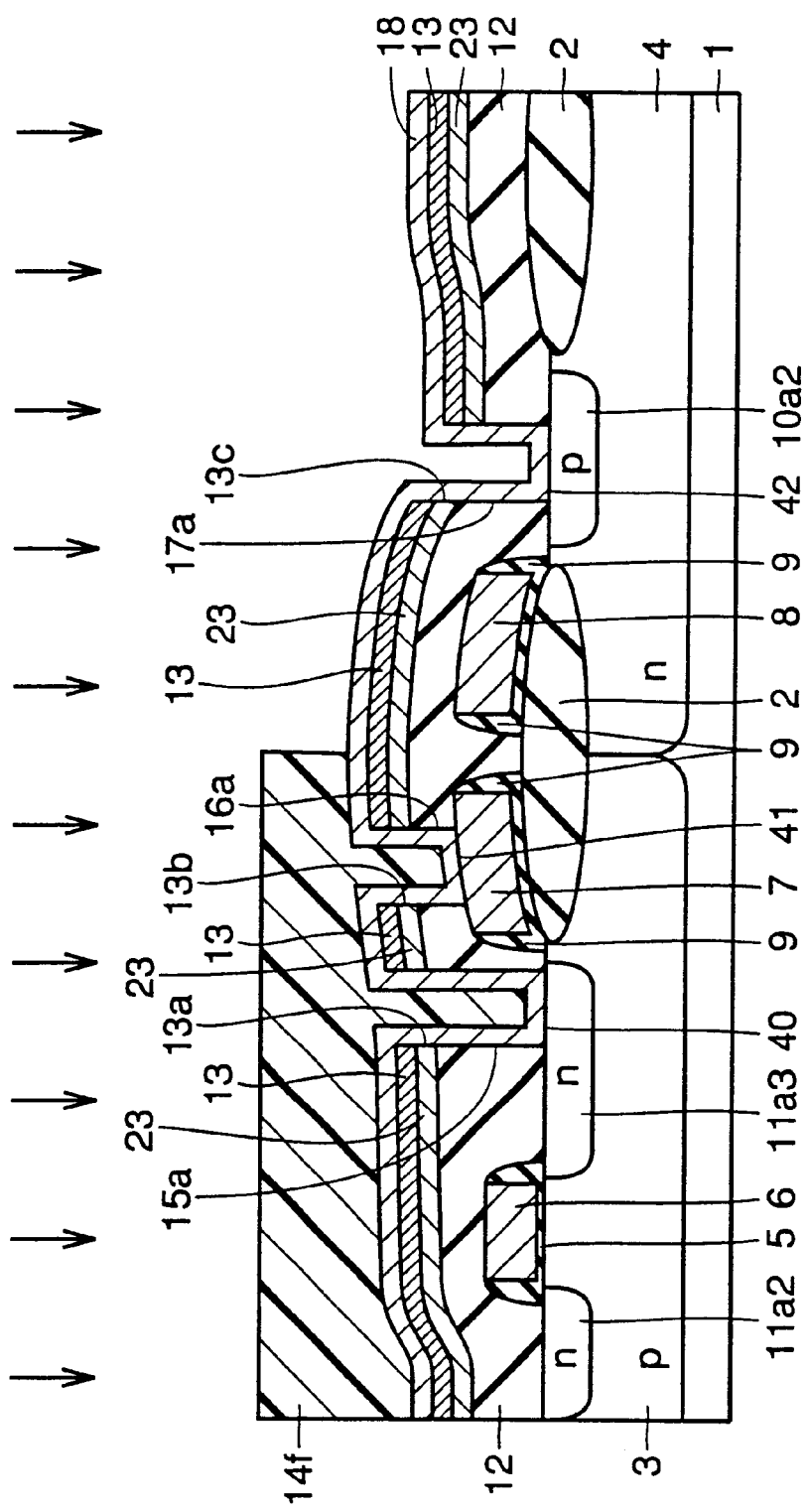
FIGS. 65 and 66 are cross sections showing characteristic first and second steps of a manufacturing process of an SRAM according to the nineteenth embodiment of the invention.
Figure 66:
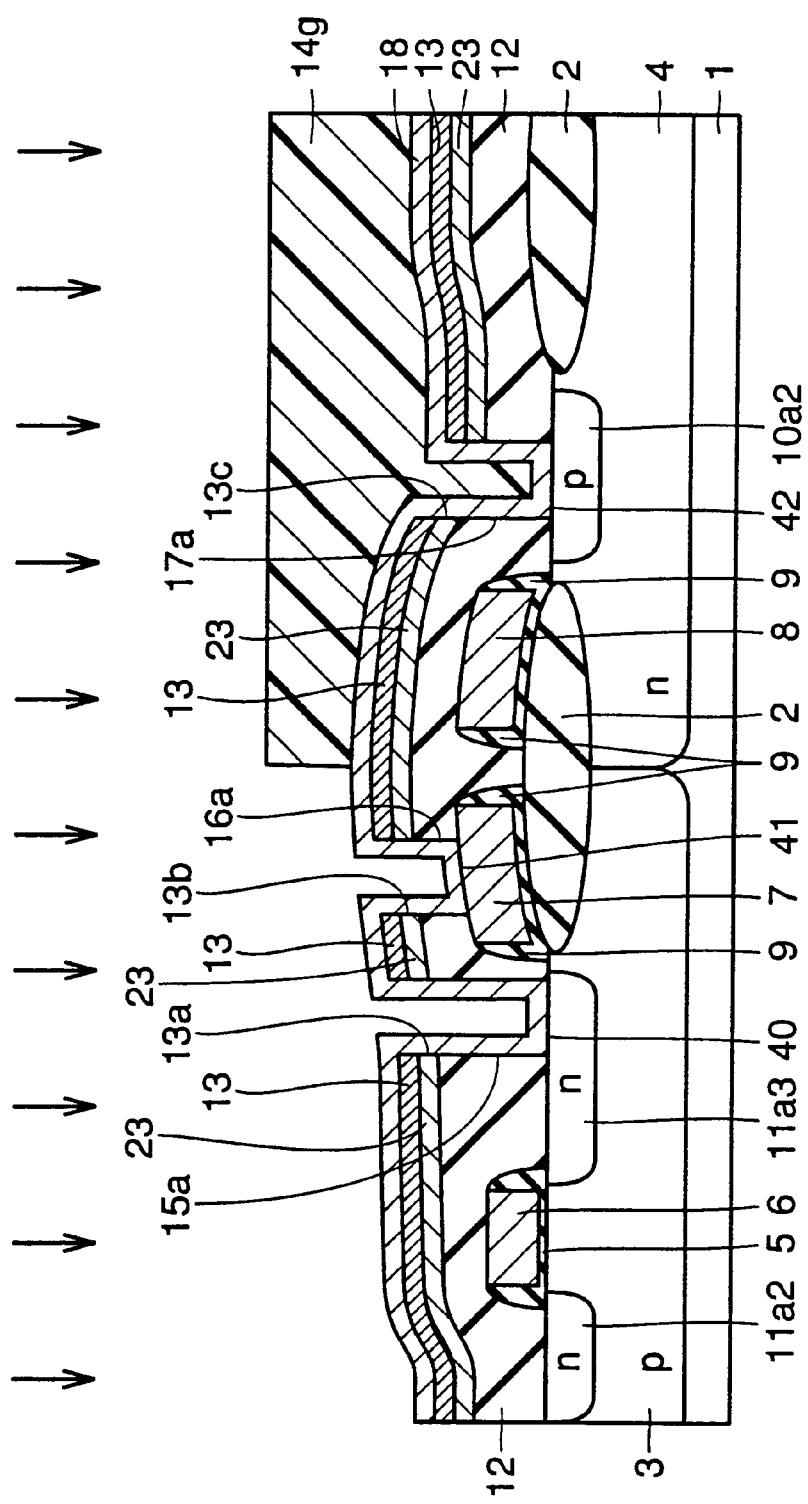

The nineteenth embodiment of the invention is described using FIGS. 65 and 66. FIGS. 65 and 66 are cross sections respectively showing the first and second steps which characterize a manufacturing process of an SRAM of the nineteenth embodiment.

The nineteenth embodiment is devised by applying the concept of the eighteenth embodiment to the SRAM according to the second and the eleventh embodiments described above. Referring to FIG. 65, after a polycrystal silicon film 18 and preceding elements are formed through steps similar to those of the second and the eleventh embodiments, resist 14f is formed by a method similar to that of the eighteenth embodiment. Using resist 14f as a mask, p-type impurities are injected into polycrystal silicon films 18 and 23.

Resist 14g is formed by a method similar to that of the eighteenth embodiment, and n-type impurities are injected into polycrystal silicon films 18 and 23 using resist 14g as a mask. The SRAM according to the nineteenth embodiment is thereafter completed through steps similar to those according to the second and the eleventh embodiments.

Twentieth Embodiment

Figure 67:
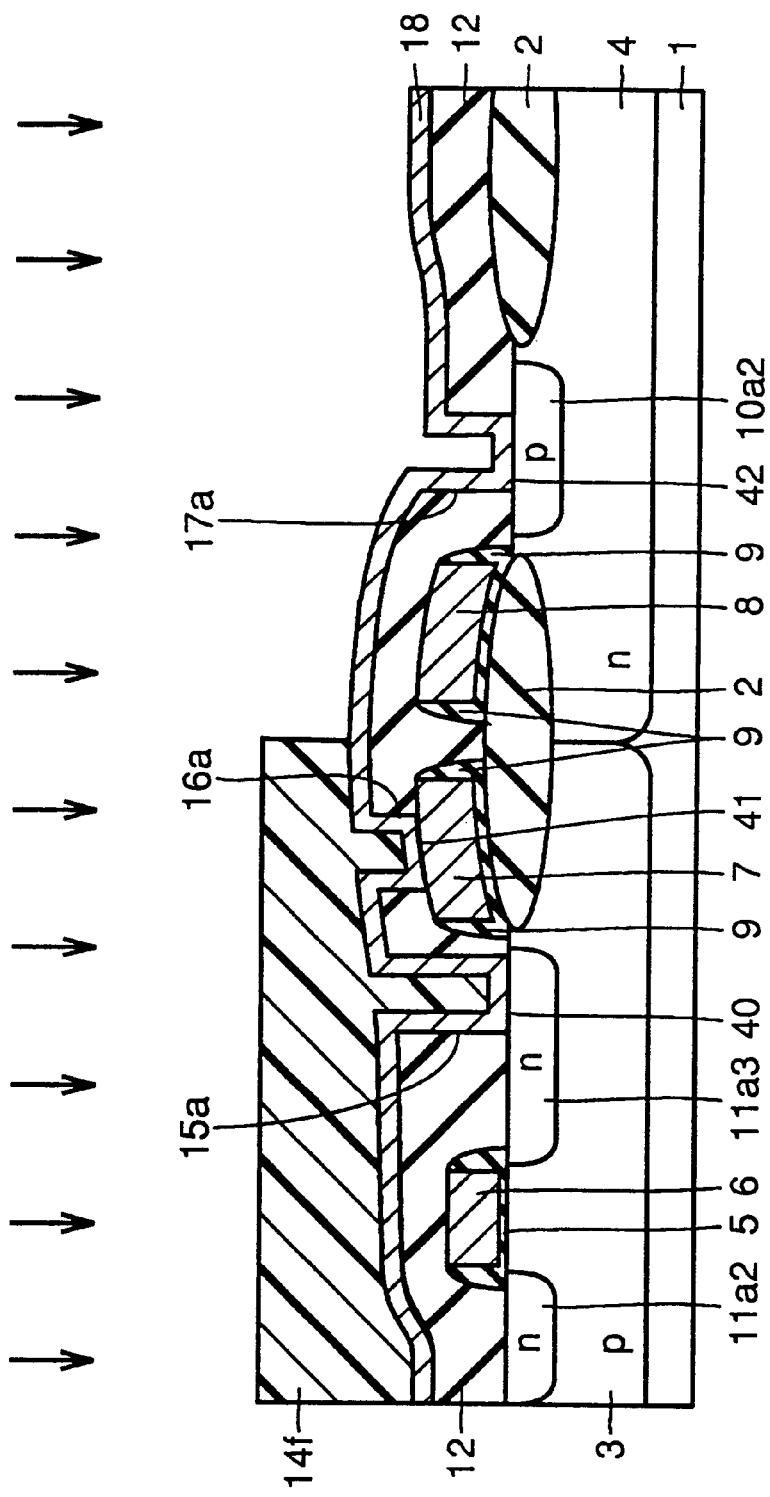
FIGS. 67 and 68 are cross sections showing characteristic first and second steps of a manufacturing process of an SRAM according to the twentieth embodiment of the invention.
Figure 68:
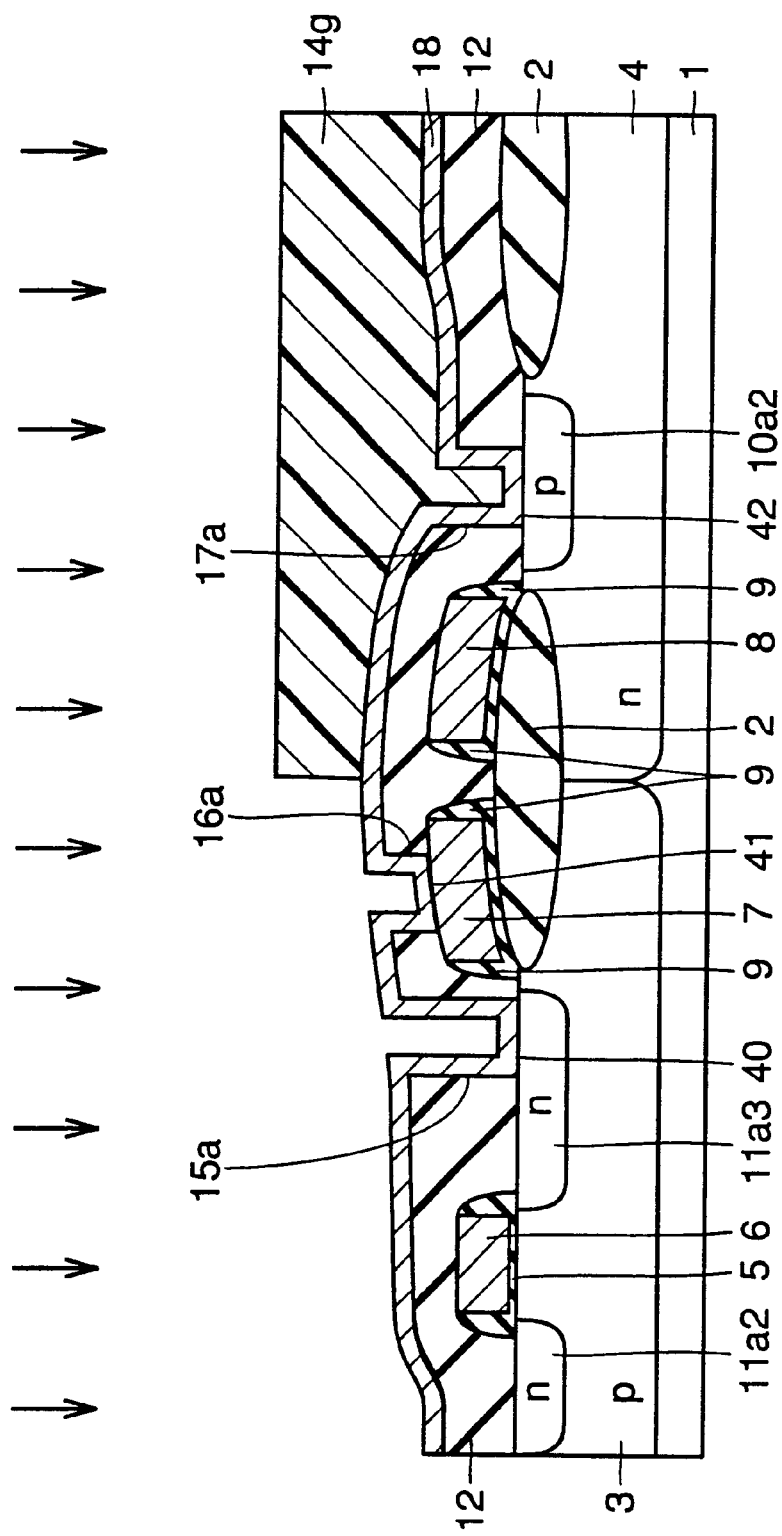
Figure 69:
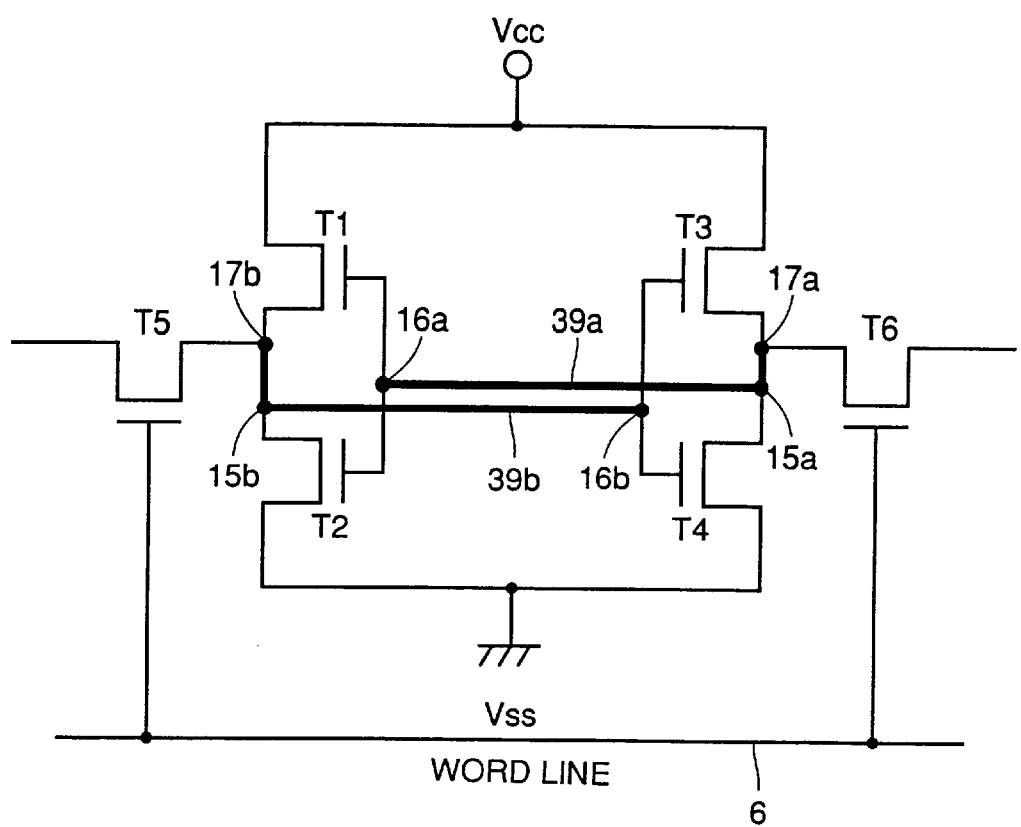
FIG. 69 is an equivalent circuit diagram of a conventional SRAM.
Figure 70:
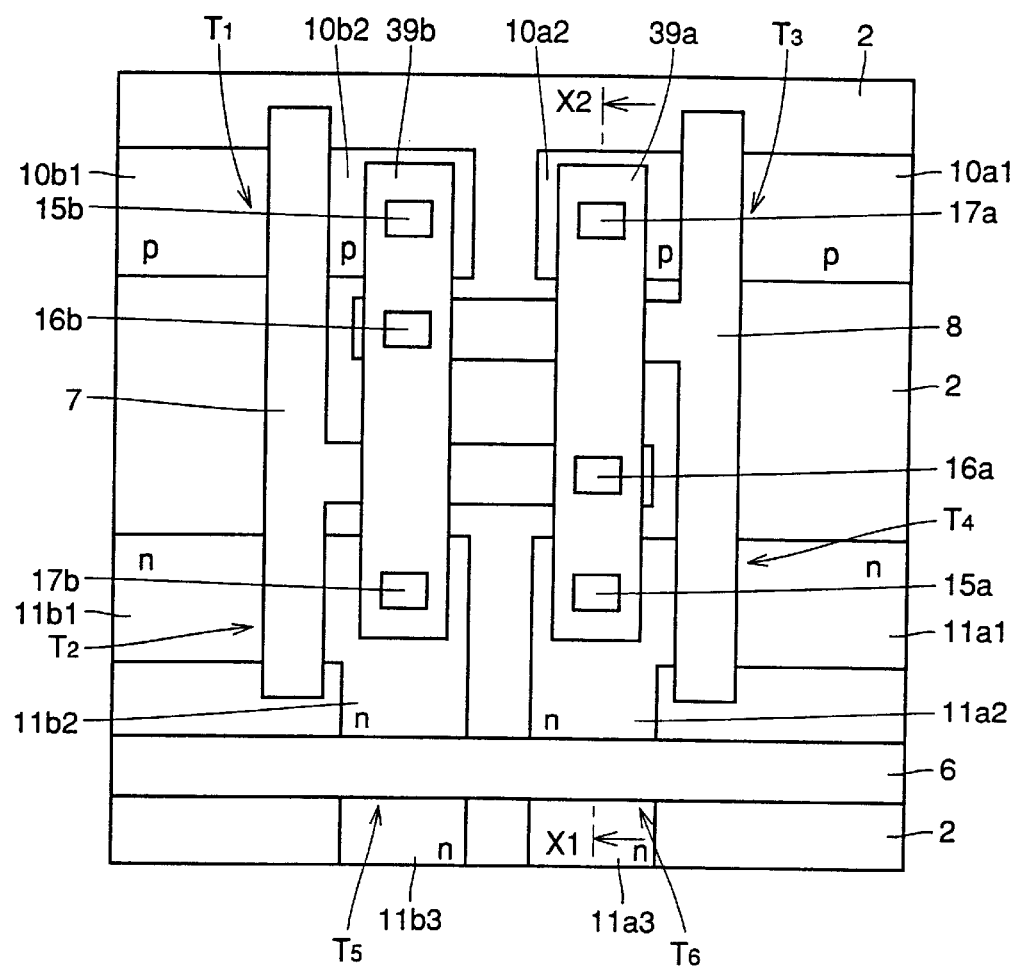
FIG. 70 is a plan view of the SRAM shown in FIG. 69.

The twentieth embodiment of the invention is described using FIGS. 67 and 68. FIGS. 67 and 68 are cross sections respectively showing the first and second steps that characterize a manufacturing process of an SRAM according to the twentieth embodiment.

The twentieth embodiment is devised by applying the concept of the eighteenth embodiment to the third to the eighth or the twelfth to the seventeenth embodiments.

Referring to FIG. 67, polycrystal silicon film 18 and preceding elements are formed through the steps similar to those according to the third to the eighth or the twelfth to the seventeenth embodiments. Resist 14f is formed by a method similar to that of the eighteenth embodiment, and p-type impurities are injected into polycrystal silicon film 18 using resist 14f as a mask.

Next referring to FIG. 68, resist 14g is formed by a method similar to that of the eighteenth embodiment, and n-type impurities are injected into polycrystal silicon film 18 using resist 14g as a mask. The SRAM of the twentieth embodiment is thereafter completed after steps similar to those according to the third to the eighth embodiments or the twelfth to the seventeenth embodiments.

While the present invention is applied to a CMOS type SRAM according each embodiment described above, the present invention is applicable to any semiconductor device having an interconnection line which connects impurity regions of different conductivity types.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
    a first impurity region of a first conductivity type formed at a major surface of a semiconductor substrate;
    a second impurity region of a second conductivity type formed at said major surface spaced from said first impurity region; and
    an interconnection line including
    first and second conductive portions formed of a conductive film containing no metal and being in contact with said first and second impurity regions respectively via first and second contact portions, said first and second conductive portions being separated from each other and each of said first and second conductive portions having at least one end portion;
    a third conductive portion formed of a conductive film containing metal and electrically connected to said first and second impurity regions via said first and second conductive portions without being in contact with partial surfaces of said first and second conductive portions located immediately above said first and second contact portions; and
    an interlayer insulating film having first and second contact holes that reach said first and second impurity regions respectively formed on said major surface, wherein
    said first and second conductive portions are formed respectively in said first and second contact holes and have first and second extending portions extending on sidewalls of said first and second contact holes respectively,
    at least one end portion of each of said first and second conductive portions extend over the interlayer insulating film,
    said third conductive portion is formed on the interlayer insulating film so that the third conductive portion and the respective ends of the first and second conductive portions overlap,
    said first and second conductive portions are connected only by the third conductive portion, and
    said third conductive portion has openings on said first and second contact holes, and is connected to said first and second extending portions.

2. The semiconductor device according to claim 1, wherein
    said semiconductor device includes a pair of driver MOS transistors, a pair of access MOS transistors and a pair of load MOS transistors,
    said driver MOS transistors or said access MOS transistors include said first impurity region, and
    said load MOS transistors include said second impurity region.

3. The semiconductor device according to claim 1, wherein
    said first and second conductive portions include a polycrystal silicon film into which impurities are introduced for improving conductivity, and
    said third conductive portion includes a metal silicide film.

4. A semiconductor device comprising:
    a first impurity region of a first conductivity type formed at a major surface of a semiconductor substrate;
    a second impurity region of a second conductivity type formed at said major surface spaced from said first impurity region; and
    an interconnection line including
    first and second conductive portions formed of a conductive film containing no metal and being in contact with said first and second impurity regions respectively via first and second contact portions, said first and second conductive portions being separated from each other and each of said first and second conductive portions having at least one end portion; and
    a third conductive portion formed of a conductive film containing metal and electrically connected to said first and second impurity regions via said first and second conductive portions without being in contact with partial surfaces of said first and second conductive portions located immediately above said first and second contact portions, wherein
    impurities are introduced into said first and second conductive portions for improving conductivity of said first and second conductive portions,
    said third conductive portion extends over the partial surfaces of said first and second conductive portions with an impurity diffusion prevention film interposed for preventing said impurities from being absorbed by said third conductive portion, and wherein
    an interlayer insulating film having first and second contact holes that reach said first and second impurity regions respectively is formed on said major surface,
    said first and second conductive portions are respectively formed in said first and second contact holes and have first and second extending portions respectively extending on sidewalls of said first and second contact holes,
    said impurity diffusion prevention film is formed in respective said first and second contact holes, and
    at least one end portion of each of said first and second conductive portions extend over the interlayer insulating film, said third conductive portion is formed on the interlayer insulating film so that the third conductive portion and the respective ends of the first and second conductive portions overlap, wherein said third conductive portion is connected to said first and second extended portions, and said first and second conductive portions are connected only by the third conductive portion.

5. The semiconductor device according to claim 4, wherein said semiconductor device includes a pair of driver MOS transistors, a pair of access MOS transistors and a pair of load MOS transistors,
    said driver MOS transistors or said access MOS transistors include said first impurity region, and
    said load MOS transistors include said second impurity region.

6. The semiconductor device according to claim 4, wherein
    said first and second conductive portions include a polycrystal silicon film into which impurities are introduced for improving conductivity, and
    said third conductive portion includes a metal silicide film.

* * * * *